United States Patent
Luby et al.

(10) Patent No.: US 9,628,536 B2
(45) Date of Patent: *Apr. 18, 2017

(54) ENHANCED BLOCK-REQUEST STREAMING USING COOPERATIVE PARALLEL HTTP AND FORWARD ERROR CORRECTION

(71) Applicant: QUALCOMM Incorporated, San Diego, CA (US)

(72) Inventors: Michael Luby, Berkeley, CA (US); Bin Wang, Freemont, CA (US); Mark Watson, San Francisco, CA (US); Lorenzo Vicisano, Berkeley, CA (US); Payam Pakzad, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/878,694

(22) Filed: Oct. 8, 2015

(65) Prior Publication Data

US 2016/0065640 A1    Mar. 3, 2016

Related U.S. Application Data

(63) Continuation of application No. 12/887,495, filed on Sep. 21, 2010, now Pat. No. 9,209,934.

(Continued)

(51) Int. Cl.
*H03M 13/00* (2006.01)
*H04L 29/06* (2006.01)
(Continued)

(52) U.S. Cl.
CPC .......... *H04L 65/607* (2013.01); *H03M 13/05* (2013.01); *H04L 1/004* (2013.01); *H04L 65/604* (2013.01);
(Continued)

(58) Field of Classification Search
CPC ......... H04N 21/23106; H04N 21/2353; H04N 21/234327; H04N 21/2393;
(Continued)

(56) References Cited

U.S. PATENT DOCUMENTS 4,901,319 A   2/1990  Ross
5,371,532 A   12/1994 Gelman et al.
(Continued)

FOREIGN PATENT DOCUMENTS

CN   1338839 A   3/2002
CN   1481643 A   3/2004
(Continued)

OTHER PUBLICATIONS

International Preliminary Report on Patentability—PCT/US2013/033852, The International Bureau of WIPO—Geneva, Switzerland, Oct. 9, 2014.
(Continued)

*Primary Examiner* — Guy Lamarre
(74) *Attorney, Agent, or Firm* — Campbell C. Chiang

(57) ABSTRACT

A block-request streaming system provides for improvements in the user experience and bandwidth efficiency of such systems, typically using an ingestion system that generates data in a form to be served by a conventional file server (HTTP, FTP, or the like), wherein the ingestion system intakes content and prepares it as files or data elements to be served by the file server, which might or might not include a cache. A client device can be adapted to take advantage of the ingestion process as well as including improvements that make for a better presentation independent of the ingestion process. In the block-request streaming system, the an ingestion system generates data according to erasure codes and the client device, through various selection and timing of requests for media data and redundant (Continued)

data, can efficiently decode media to provide for presentations.

20 Claims, 29 Drawing Sheets

Related U.S. Application Data

(60) Provisional application No. 61/244,767, filed on Sep. 22, 2009, provisional application No. 61/257,719, filed on Nov. 3, 2009, provisional application No. 61/258,088, filed on Nov. 4, 2009, provisional application No. 61/285,779, filed on Dec. 11, 2009, provisional application No. 61/296,725, filed on Jan. 20, 2010, provisional application No. 61/372,399, filed on Aug. 10, 2010.

(51) Int. Cl.
| | | |
|---|---|---|
| *H04N 21/231* | (2011.01) | |
| *H04N 21/234* | (2011.01) | |
| *H04N 21/2343* | (2011.01) | |
| *H04N 21/239* | (2011.01) | |
| *H04N 21/258* | (2011.01) | |
| *H04N 21/44* | (2011.01) | |
| *H04N 21/442* | (2011.01) | |
| *H04N 21/462* | (2011.01) | |
| *H04N 21/84* | (2011.01) | |
| *H04N 21/845* | (2011.01) | |
| *H03M 13/05* | (2006.01) | |
| *H04L 1/00* | (2006.01) | |
| *H04N 21/235* | (2011.01) | |

(52) U.S. Cl.
CPC ..... *H04N 21/2353* (2013.01); *H04N 21/2393* (2013.01); *H04N 21/23106* (2013.01); *H04N 21/23406* (2013.01); *H04N 21/234327* (2013.01); *H04N 21/25808* (2013.01); *H04N 21/44004* (2013.01); *H04N 21/44209* (2013.01); *H04N 21/4621* (2013.01); *H04N 21/84* (2013.01); *H04N 21/8455* (2013.01); *H04N 21/8456* (2013.01); *H04L 65/4084* (2013.01); *H04L 65/602* (2013.01); *H04L 65/80* (2013.01)

(58) Field of Classification Search
CPC ....... H04N 21/25808; H04N 21/44004; H04N 21/44209; H04N 21/4621; H04N 21/84; H04N 21/8455; H04N 21/8456; H04N 21/23406; H04L 65/4084; H04L 65/602; H04L 65/604; H04L 65/607; H04L 65/80; H04L 1/004; H03M 13/05
See application file for complete search history.

(56) References Cited

U.S. PATENT DOCUMENTS

| | | |
|---|---|---|
| 5,379,297 A | 1/1995 | Glover et al. |
| 5,421,031 A | 5/1995 | De bey |
| 5,566,208 A | 10/1996 | Balakrishnan |
| 5,617,541 A | 4/1997 | Albanese et al. |
| 5,659,614 A | 8/1997 | Bailey, III |
| 5,701,582 A | 12/1997 | DeBey |
| 5,751,336 A | 5/1998 | Aggarwal et al. |
| 5,757,415 A | 5/1998 | Asamizuya et al. |
| 5,802,394 A | 9/1998 | Baird et al. |
| 5,835,165 A | 11/1998 | Keate et al. |
| 5,844,636 A | 12/1998 | Joseph et al. |
| 5,903,775 A | 5/1999 | Murray |
| 5,926,205 A | 7/1999 | Krause et al. |
| 5,936,659 A | 8/1999 | Viswanathan et al. |
| 5,936,949 A | 8/1999 | Pasternak et al. |
| 6,011,590 A | 1/2000 | Saukkonen |
| 6,018,359 A | 1/2000 | Kermode et al. |
| 6,061,820 A | 5/2000 | Nakakita et al. |
| 6,073,250 A | 6/2000 | Luby et al. |
| 6,079,041 A | 6/2000 | Kunisa et al. |
| 6,081,909 A | 6/2000 | Luby et al. |
| 6,134,596 A | 10/2000 | Bolosky et al. |
| 6,141,053 A | 10/2000 | Saukkonen |
| 6,141,787 A | 10/2000 | Kunisa et al. |
| 6,163,870 A | 12/2000 | Luby et al. |
| 6,166,544 A | 12/2000 | Debbins et al. |
| 6,185,265 B1 | 2/2001 | Campanella |
| 6,195,777 B1 | 2/2001 | Luby et al. |
| 6,226,259 B1 | 5/2001 | Piret |
| 6,226,301 B1 | 5/2001 | Cheng et al. |
| 6,307,487 B1 | 10/2001 | Luby |
| 6,320,520 B1 | 11/2001 | Luby |
| 6,332,163 B1 | 12/2001 | Bowman-Amuah |
| 6,411,223 B1 | 6/2002 | Haken et al. |
| 6,415,326 B1 | 7/2002 | Gupta et al. |
| 6,459,811 B1 | 10/2002 | Hurst, Jr. |
| 6,486,803 B1 | 11/2002 | Luby et al. |
| 6,496,980 B1 | 12/2002 | Tillman et al. |
| 6,510,177 B1 | 1/2003 | De Bonet et al. |
| 6,631,172 B1 | 10/2003 | Shokrollahi et al. |
| 6,732,325 B1 | 5/2004 | Tash et al. |
| 6,798,791 B1 | 9/2004 | Riazi et al. |
| 6,804,202 B1 | 10/2004 | Hwang |
| 6,868,083 B2 | 3/2005 | Apostolopoulos et al. |
| 6,876,623 B1 | 4/2005 | Lou et al. |
| 6,882,618 B1 | 4/2005 | Sakoda et al. |
| 6,937,618 B1 | 8/2005 | Noda et al. |
| 6,985,459 B2 | 1/2006 | Dickson |
| 7,031,257 B1 | 4/2006 | Lu et al. |
| 7,068,681 B2 | 6/2006 | Chang et al. |
| 7,068,729 B2 | 6/2006 | Shokrollahi et al. |
| 7,073,191 B2 | 7/2006 | Srikantan et al. |
| 7,100,188 B2 | 8/2006 | Hejna et al. |
| 7,113,773 B2 | 9/2006 | Quick et al. |
| 7,143,433 B1 | 11/2006 | Duan et al. |
| 7,151,754 B1 | 12/2006 | Boyce et al. |
| 7,154,951 B2 | 12/2006 | Wang |
| 7,164,882 B2 | 1/2007 | Poltorak |
| 7,240,358 B2 | 7/2007 | Horn et al. |
| 7,257,764 B2 | 8/2007 | Suzuki et al. |
| 7,289,506 B1 | 10/2007 | Hannuksela |
| 7,295,573 B2 | 11/2007 | Yi et al. |
| 7,304,990 B2 | 12/2007 | Rajwan |
| 7,318,180 B2 | 1/2008 | Starr |
| 7,363,048 B2 | 4/2008 | Cheng et al. |
| 7,391,717 B2 | 6/2008 | Klemets et al. |
| 7,406,010 B2 | 7/2008 | Hyen |
| 7,409,626 B1 | 8/2008 | Schelstraete |
| 7,447,791 B2 | 11/2008 | Leaning et al. |
| 7,483,447 B2 | 1/2009 | Chang et al. |
| 7,483,489 B2 | 1/2009 | Gentric et al. |
| 7,492,828 B2 | 2/2009 | Keerthi |
| 7,529,806 B1 | 5/2009 | Shteyn |
| 7,555,006 B2 | 6/2009 | Wolfe et al. |
| 7,574,706 B2 | 8/2009 | Meulemans et al. |
| 7,650,036 B2 | 1/2010 | Lei et al. |
| 7,668,198 B2 | 2/2010 | Yi et al. |
| 7,720,096 B2 | 5/2010 | Klemets |
| 7,805,456 B2 | 9/2010 | Meijer et al. |
| 7,813,822 B1 | 10/2010 | Hoffberg |
| 7,895,629 B1 | 2/2011 | Shen et al. |
| 7,924,913 B2 | 4/2011 | Sullivan et al. |
| 7,961,700 B2 | 6/2011 | Malladi et al. |
| 7,979,769 B2 | 7/2011 | Lee et al. |
| 8,027,328 B2 | 9/2011 | Yang et al. |
| 8,028,322 B2 | 9/2011 | Riedl et al. |
| 8,081,716 B2 | 12/2011 | Kang et al. |
| 8,135,073 B2 | 3/2012 | Shen |
| 8,185,794 B2 | 5/2012 | Lohmar et al. |
| 8,185,809 B2 | 5/2012 | Luby et al. |
| RE43,741 E | 10/2012 | Shokrollahi et al. |

(56) References Cited

U.S. PATENT DOCUMENTS

| | | | |
|---|---|---|---|
| 8,301,725 B2 | 10/2012 | Biderman et al. |
| 8,327,403 B1 | 12/2012 | Chilvers et al. |
| 8,331,445 B2 | 12/2012 | Garudadri et al. |
| 8,340,133 B2 | 12/2012 | Kim et al. |
| 8,422,474 B2 | 4/2013 | Park et al. |
| 8,462,643 B2 | 6/2013 | Walton et al. |
| 8,544,043 B2 | 9/2013 | Parekh et al. |
| 8,572,646 B2 | 10/2013 | Haberman et al. |
| 8,615,023 B2 | 12/2013 | Oh et al. |
| 8,638,796 B2 | 1/2014 | Dan et al. |
| 8,713,624 B1 | 4/2014 | Harvey et al. |
| 8,737,421 B2 | 5/2014 | Zhang et al. |
| 8,775,174 B2 | 7/2014 | Conejero et al. |
| 8,806,050 B2 | 8/2014 | Chen et al. |
| 8,812,735 B2 | 8/2014 | Igarashi |
| 8,874,436 B2 | 10/2014 | Goldhor |
| 8,887,020 B2 | 11/2014 | Shokrollahi |
| 8,918,533 B2 | 12/2014 | Chen et al. |
| 8,958,375 B2 | 2/2015 | Watson et al. |
| 9,209,934 B2 * | 12/2015 | Luby ............ H04N 21/23106 |
| 2001/0015944 A1 | 8/2001 | Takahashi et al. |
| 2001/0033586 A1 | 10/2001 | Takashimizu et al. |
| 2002/0009137 A1 | 1/2002 | Nelson et al. |
| 2002/0023246 A1 | 2/2002 | Jin |
| 2002/0083345 A1 | 6/2002 | Halliday et al. |
| 2002/0085013 A1 | 7/2002 | Lippincott |
| 2002/0133247 A1 | 9/2002 | Smith et al. |
| 2002/0141433 A1 | 10/2002 | Kwon et al. |
| 2002/0143953 A1 | 10/2002 | Aiken |
| 2002/0191116 A1 | 12/2002 | Kessler et al. |
| 2003/0005386 A1 | 1/2003 | Bhatt et al. |
| 2003/0009579 A1 | 1/2003 | Kawai et al. |
| 2003/0023331 A1 | 1/2003 | Komura et al. |
| 2003/0138043 A1 | 7/2003 | Hannuksela |
| 2003/0194211 A1 | 10/2003 | Abecassis |
| 2003/0207696 A1 | 11/2003 | Willenegger et al. |
| 2003/0224773 A1 | 12/2003 | Deeds |
| 2004/0015768 A1 | 1/2004 | Bordes et al. |
| 2004/0031054 A1 | 2/2004 | Dankworth et al. |
| 2004/0049793 A1 | 3/2004 | Chou |
| 2004/0081106 A1 | 4/2004 | Bruhn |
| 2004/0083015 A1 | 4/2004 | Patwari |
| 2004/0096110 A1 | 5/2004 | Yogeshwar et al. |
| 2004/0117716 A1 | 6/2004 | Shen |
| 2004/0162071 A1 | 8/2004 | Grilli et al. |
| 2004/0240382 A1 | 12/2004 | Ido et al. |
| 2004/0255328 A1 | 12/2004 | Baldwin et al. |
| 2005/0004997 A1 | 1/2005 | Balcisoy et al. |
| 2005/0071491 A1 | 3/2005 | Seo |
| 2005/0084006 A1 | 4/2005 | Lei et al. |
| 2005/0091697 A1 | 4/2005 | Tanaka et al. |
| 2005/0097213 A1 | 5/2005 | Barrett et al. |
| 2005/0105371 A1 | 5/2005 | Johnson et al. |
| 2005/0123058 A1 | 6/2005 | Greenbaum et al. |
| 2005/0160272 A1 | 7/2005 | Teppler |
| 2005/0160347 A1 | 7/2005 | Kim et al. |
| 2005/0163468 A1 | 7/2005 | Takahashi et al. |
| 2005/0180415 A1 | 8/2005 | Cheung et al. |
| 2005/0193309 A1 | 9/2005 | Grilli et al. |
| 2005/0195752 A1 | 9/2005 | Amin et al. |
| 2005/0206537 A1 | 9/2005 | Shokrollahi et al. |
| 2005/0207392 A1 | 9/2005 | Sivalingham et al. |
| 2005/0216472 A1 | 9/2005 | Leon et al. |
| 2005/0216951 A1 | 9/2005 | Macinnis |
| 2005/0254526 A1 | 11/2005 | Wang et al. |
| 2005/0254575 A1 | 11/2005 | Hannuksela et al. |
| 2006/0015568 A1 | 1/2006 | Walsh et al. |
| 2006/0031738 A1 | 2/2006 | Fay et al. |
| 2006/0034308 A1 | 2/2006 | Kanaya et al. |
| 2006/0037057 A1 | 2/2006 | Xu |
| 2006/0045180 A1 | 3/2006 | Ghanbari et al. |
| 2006/0080588 A1 | 4/2006 | Starr et al. |
| 2006/0087456 A1 | 4/2006 | Luby |
| 2006/0107174 A1 | 5/2006 | Heise |
| 2006/0120464 A1 | 6/2006 | Hannuksela |
| 2006/0212444 A1 | 9/2006 | Handman et al. |
| 2006/0229075 A1 | 10/2006 | Kim et al. |
| 2006/0244824 A1 | 11/2006 | Debey |
| 2006/0244865 A1 | 11/2006 | Simon |
| 2006/0248195 A1 | 11/2006 | Toumura et al. |
| 2006/0256851 A1 | 11/2006 | Wang et al. |
| 2006/0279437 A1 | 12/2006 | Luby et al. |
| 2007/0002953 A1 | 1/2007 | Kusunoki |
| 2007/0006274 A1 | 1/2007 | Paila et al. |
| 2007/0016594 A1 | 1/2007 | Visharam et al. |
| 2007/0022215 A1 | 1/2007 | Singer et al. |
| 2007/0078876 A1 | 4/2007 | Hayashi et al. |
| 2007/0134005 A1 | 6/2007 | Myong et al. |
| 2007/0140369 A1 | 6/2007 | Limberg |
| 2007/0162568 A1 | 7/2007 | Gupta et al. |
| 2007/0162611 A1 | 7/2007 | Yu et al. |
| 2007/0177811 A1 | 8/2007 | Yang et al. |
| 2007/0185973 A1 | 8/2007 | Wayda et al. |
| 2007/0200949 A1 | 8/2007 | Walker et al. |
| 2007/0201549 A1 | 8/2007 | Hannuksela et al. |
| 2007/0204196 A1 | 8/2007 | Watson et al. |
| 2007/0230568 A1 | 10/2007 | Eleftheriadis et al. |
| 2007/0233784 A1 | 10/2007 | Orourke et al. |
| 2007/0255844 A1 | 11/2007 | Shen et al. |
| 2007/0277209 A1 | 11/2007 | Yousef |
| 2008/0010153 A1 | 1/2008 | Pugh-O'Connor et al. |
| 2008/0059532 A1 | 3/2008 | Kazmi et al. |
| 2008/0066136 A1 | 3/2008 | Dorai et al. |
| 2008/0075172 A1 | 3/2008 | Koto |
| 2008/0086751 A1 | 4/2008 | Horn et al. |
| 2008/0101478 A1 | 5/2008 | Kusunoki |
| 2008/0134005 A1 | 6/2008 | Izzat et al. |
| 2008/0170564 A1 | 7/2008 | Shi et al. |
| 2008/0170806 A1 | 7/2008 | Kim |
| 2008/0172430 A1 | 7/2008 | Thorstensen |
| 2008/0172712 A1 | 7/2008 | Munetsugu |
| 2008/0181296 A1 | 7/2008 | Tian et al. |
| 2008/0189419 A1 | 8/2008 | Girle et al. |
| 2008/0192818 A1 | 8/2008 | Dipietro et al. |
| 2008/0215317 A1 | 9/2008 | Fejzo |
| 2008/0222302 A1 | 9/2008 | Nguyen et al. |
| 2008/0243918 A1 | 10/2008 | Holtman |
| 2008/0256418 A1 | 10/2008 | Luby et al. |
| 2008/0281943 A1 | 11/2008 | Shapiro |
| 2008/0285556 A1 | 11/2008 | Park et al. |
| 2008/0303893 A1 | 12/2008 | Kim et al. |
| 2008/0313191 A1 | 12/2008 | Bouazizi |
| 2009/0003439 A1 | 1/2009 | Wang et al. |
| 2009/0019229 A1 | 1/2009 | Morrow et al. |
| 2009/0043906 A1 | 2/2009 | Hurst et al. |
| 2009/0055705 A1 | 2/2009 | Gao |
| 2009/0083806 A1 | 3/2009 | Barrett et al. |
| 2009/0089445 A1 | 4/2009 | Deshpande |
| 2009/0092138 A1 | 4/2009 | Joo et al. |
| 2009/0100496 A1 | 4/2009 | Bechtolsheim et al. |
| 2009/0103523 A1 | 4/2009 | Katis et al. |
| 2009/0106356 A1 | 4/2009 | Brase et al. |
| 2009/0125636 A1 | 5/2009 | Li et al. |
| 2009/0150557 A1 | 6/2009 | Wormley et al. |
| 2009/0164653 A1 | 6/2009 | Mandyam et al. |
| 2009/0201990 A1 | 8/2009 | Leprovost et al. |
| 2009/0222873 A1 | 9/2009 | Einarsson |
| 2009/0248697 A1 | 10/2009 | Richardson et al. |
| 2009/0257508 A1 | 10/2009 | Aggarwal et al. |
| 2009/0287841 A1 | 11/2009 | Chapweske et al. |
| 2009/0297123 A1 | 12/2009 | Virdi et al. |
| 2009/0300203 A1 | 12/2009 | Virdi et al. |
| 2009/0300204 A1 | 12/2009 | Zhang et al. |
| 2009/0319563 A1 | 12/2009 | Schnell |
| 2009/0328228 A1 | 12/2009 | Schnell |
| 2010/0011061 A1 | 1/2010 | Hudson et al. |
| 2010/0011117 A1 | 1/2010 | Hristodorescu et al. |
| 2010/0020871 A1 | 1/2010 | Hannuksela et al. |
| 2010/0023525 A1 | 1/2010 | Westerlund et al. |
| 2010/0049865 A1 | 2/2010 | Hannuksela et al. |
| 2010/0061444 A1 | 3/2010 | Wilkins et al. |
| 2010/0067495 A1 | 3/2010 | Lee et al. |
| 2010/0080290 A1 | 4/2010 | Mehrotra |
| 2010/0131671 A1 | 5/2010 | Kohli et al. |

(56) References Cited

U.S. PATENT DOCUMENTS

| | | |
|---|---|---|
| 2010/0153578 A1 | 6/2010 | Van Gassel et al. |
| 2010/0174823 A1 | 7/2010 | Huang |
| 2010/0189131 A1 | 7/2010 | Branam et al. |
| 2010/0198982 A1 | 8/2010 | Fernandez |
| 2010/0211690 A1 | 8/2010 | Pakzad et al. |
| 2010/0235472 A1 | 9/2010 | Sood et al. |
| 2010/0235528 A1 | 9/2010 | Bocharov et al. |
| 2010/0257051 A1 | 10/2010 | Fernandez |
| 2010/0318632 A1 | 12/2010 | Yoo et al. |
| 2011/0055881 A1 | 3/2011 | Yu et al. |
| 2011/0083144 A1 | 4/2011 | Bocharov et al. |
| 2011/0096828 A1 | 4/2011 | Chen et al. |
| 2011/0119394 A1 | 5/2011 | Wang et al. |
| 2011/0119396 A1 | 5/2011 | Kwon et al. |
| 2011/0231519 A1 | 9/2011 | Luby et al. |
| 2011/0231569 A1 | 9/2011 | Luby et al. |
| 2011/0238789 A1 | 9/2011 | Luby et al. |
| 2011/0268178 A1 | 11/2011 | Park et al. |
| 2011/0307545 A1 | 12/2011 | Bouazizi |
| 2011/0307581 A1 | 12/2011 | Furbeck et al. |
| 2012/0013746 A1 | 1/2012 | Chen et al. |
| 2012/0016965 A1 | 1/2012 | Chen et al. |
| 2012/0020413 A1 | 1/2012 | Chen et al. |
| 2012/0023249 A1 | 1/2012 | Chen et al. |
| 2012/0023254 A1 | 1/2012 | Park et al. |
| 2012/0033730 A1 | 2/2012 | Lee |
| 2012/0042050 A1 | 2/2012 | Chen et al. |
| 2012/0042089 A1 | 2/2012 | Chen et al. |
| 2012/0042090 A1 | 2/2012 | Chen et al. |
| 2012/0047280 A1 | 2/2012 | Park et al. |
| 2012/0099593 A1 | 4/2012 | Luby |
| 2012/0151302 A1 | 6/2012 | Luby et al. |
| 2012/0166499 A1 | 6/2012 | Anderson et al. |
| 2012/0185530 A1 | 7/2012 | Reza |
| 2012/0202535 A1 | 8/2012 | Chaddha et al. |
| 2012/0297410 A1 | 11/2012 | Lohmar et al. |
| 2012/0317305 A1 | 12/2012 | Einarsson et al. |
| 2013/0002483 A1 | 1/2013 | Rowitch et al. |
| 2013/0007223 A1 | 1/2013 | Luby et al. |
| 2013/0067295 A1 | 3/2013 | Luby et al. |
| 2013/0091251 A1 | 4/2013 | Walker et al. |
| 2013/0246643 A1 | 9/2013 | Luby et al. |
| 2013/0254634 A1 | 9/2013 | Luby et al. |
| 2013/0287023 A1 | 10/2013 | Bims |
| 2014/0009578 A1 | 1/2014 | Chen et al. |
| 2014/0380113 A1 | 12/2014 | Luby |
| 2015/0039782 A1 | 2/2015 | Major et al. |
| 2016/0323342 A1 | 11/2016 | Luby |

FOREIGN PATENT DOCUMENTS

| | | | |
|---|---|---|---|
| CN | 1708934 A | 12/2005 | |
| CN | 1714577 A | 12/2005 | |
| CN | 1806392 A | 7/2006 | |
| CN | 1819661 A | 8/2006 | |
| CN | 1868157 A | 11/2006 | |
| CN | 1902865 A | 1/2007 | |
| CN | 101390399 A | 3/2009 | |
| CN | 101409630 A | 4/2009 | |
| CN | 101729857 A | 6/2010 | |
| EP | 0669587 A2 | 8/1995 | |
| EP | 0701371 A1 | 3/1996 | |
| EP | 0784401 A2 | 7/1997 | |
| EP | 0853433 A1 | 7/1998 | |
| EP | 0986908 A1 | 3/2000 | |
| EP | 1051027 A1 | 11/2000 | |
| EP | 1124344 A1 | 8/2001 | |
| EP | 1241795 A2 | 9/2002 | |
| EP | 1298931 A2 | 4/2003 | |
| EP | 1406452 A2 | 4/2004 | |
| EP | 1455504 A2 | 9/2004 | |
| EP | 1670256 A2 | 6/2006 | |
| EP | 2071827 A2 | 6/2009 | |
| EP | 1700410 B1 | 4/2010 | |
| EP | 1665539 | 4/2013 | |
| JP | H07183873 | 7/1995 | |
| JP | 08186570 | 7/1996 | |
| JP | 8289255 A | 11/1996 | |
| JP | 9252253 A | 9/1997 | |
| JP | 11041211 A | 2/1999 | |
| JP | 11164270 A | 6/1999 | |
| JP | 2000151426 A | 5/2000 | |
| JP | 2000513164 A | 10/2000 | |
| JP | 2000353969 A | 12/2000 | |
| JP | 2001094625 | 4/2001 | |
| JP | 2001189665 A | 7/2001 | |
| JP | 2001223655 A | 8/2001 | |
| JP | 2001274776 A | 10/2001 | |
| JP | 2002073625 A | 3/2002 | |
| JP | 2002543705 A | 12/2002 | |
| JP | 2003092564 A | 3/2003 | |
| JP | 2003510734 A | 3/2003 | |
| JP | 2003174489 | 6/2003 | |
| JP | 2003256321 A | 9/2003 | |
| JP | 2003318975 A | 11/2003 | |
| JP | 2003319012 | 11/2003 | |
| JP | 2003333577 A | 11/2003 | |
| JP | 2004070712 A | 3/2004 | |
| JP | 2004135013 A | 4/2004 | |
| JP | 2004172830 A | 6/2004 | |
| JP | 2004516717 A | 6/2004 | |
| JP | 2004192140 A | 7/2004 | |
| JP | 2004193992 A | 7/2004 | |
| JP | 2004529533 A | 9/2004 | |
| JP | 2004328613 A | 11/2004 | |
| JP | 2004343701 A | 12/2004 | |
| JP | 2004348824 A | 12/2004 | |
| JP | 2004362099 A | 12/2004 | |
| JP | 2005094140 A | 4/2005 | |
| JP | 2005136546 A | 5/2005 | |
| JP | 2005277950 A | 10/2005 | |
| JP | 2006503463 A | 1/2006 | |
| JP | 2006033763 A | 2/2006 | |
| JP | 2006506926 A | 2/2006 | |
| JP | 2006074335 A | 3/2006 | |
| JP | 2006115104 A | 4/2006 | |
| JP | 2006512790 A | 4/2006 | |
| JP | 2006174045 A | 6/2006 | |
| JP | 2006186419 A | 7/2006 | |
| JP | 2006519517 A | 8/2006 | |
| JP | 2006287422 A | 10/2006 | |
| JP | 2006319743 A | 11/2006 | |
| JP | 2007013675 A | 1/2007 | |
| JP | 2007036666 A | 2/2007 | |
| JP | 2007089137 A | 4/2007 | |
| JP | 2007158592 A | 6/2007 | |
| JP | 2007174170 A | 7/2007 | |
| JP | 2007228205 A | 9/2007 | |
| JP | 2007535881 A | 12/2007 | |
| JP | 2008011404 A | 1/2008 | |
| JP | 2008016907 A | 1/2008 | |
| JP | 2008508761 A | 3/2008 | |
| JP | 2008283232 A | 11/2008 | |
| JP | 2008283571 A | 11/2008 | |
| JP | 2008546361 A | 12/2008 | |
| JP | 2009027598 A | 2/2009 | |
| JP | 2009522921 A | 6/2009 | |
| JP | 2009522922 A | 6/2009 | |
| JP | 2009171558 A | 7/2009 | |
| JP | 2009527151 A | 7/2009 | |
| JP | 2009527949 A | 7/2009 | |
| JP | 2009528002 | 7/2009 | |
| JP | 2009277182 A | 11/2009 | |
| JP | 2009544991 A | 12/2009 | |
| JP | 2010539816 A | 12/2010 | |
| JP | 2010539832 A | 12/2010 | |
| JP | 2008502212 A | 1/2011 | |
| JP | 2011087103 A | 4/2011 | |
| JP | 4773356 B2 | 7/2011 | |
| JP | 4971144 B2 | 4/2012 | |
| JP | 2013505685 | 2/2013 | |
| JP | 5231218 | 3/2013 | |
| JP | 2013510453 A | 3/2013 | |
| JP | 2013538508 A | 10/2013 | |

(56) References Cited

FOREIGN PATENT DOCUMENTS

| | | |
|---|---|---|
| JP | 5602858 B2 | 10/2014 |
| KR | 1019980702296 | 7/1998 |
| KR | 1020030071815 | 9/2003 |
| KR | 1020030074386 A | 9/2003 |
| KR | 20040074997 A | 8/2004 |
| KR | 20040107152 A | 12/2004 |
| KR | 20040107401 A | 12/2004 |
| KR | 20050009376 A | 1/2005 |
| KR | 20070038161 A | 4/2007 |
| KR | 20080013954 A | 2/2008 |
| KR | 100809086 B1 | 3/2008 |
| KR | 20080083299 A | 9/2008 |
| KR | 20090098919 A | 9/2009 |
| KR | 20100039221 A | 4/2010 |
| RU | 99117925 A | 7/2001 |
| RU | 2189629 C2 | 9/2002 |
| RU | 2265960 C2 | 12/2005 |
| RU | 2290768 C1 | 12/2006 |
| RU | 2297663 C2 | 4/2007 |
| RU | 2312390 C2 | 12/2007 |
| RU | 2357279 C2 | 5/2009 |
| TW | I246841 B | 1/2006 |
| TW | I280748 B | 5/2007 |
| TW | I354908 | 12/2011 |
| TW | I355168 | 12/2011 |
| WO | WO-9750183 A1 | 12/1997 |
| WO | WO-9804973 A1 | 2/1998 |
| WO | WO-9832231 | 7/1998 |
| WO | WO-9832256 A1 | 7/1998 |
| WO | WO-0018017 | 3/2000 |
| WO | WO-0120786 | 3/2001 |
| WO | WO-0157667 A1 | 8/2001 |
| WO | WO-0158130 A2 | 8/2001 |
| WO | WO-0158131 A2 | 8/2001 |
| WO | WO-0227988 A2 | 4/2002 |
| WO | WO-0247391 | 6/2002 |
| WO | WO-0249343 A1 | 6/2002 |
| WO | WO-02063461 A1 | 8/2002 |
| WO | WO-03046742 A1 | 6/2003 |
| WO | WO-03056703 A1 | 7/2003 |
| WO | 03103212 A2 | 12/2003 |
| WO | WO-03105350 | 12/2003 |
| WO | WO-03105484 A1 | 12/2003 |
| WO | WO-2004015948 A1 | 2/2004 |
| WO | WO-2004034589 A2 | 4/2004 |
| WO | WO-2004036824 A1 | 4/2004 |
| WO | WO-2004047019 A2 | 6/2004 |
| WO | WO-2004047455 A1 | 6/2004 |
| WO | WO-2004088988 A1 | 10/2004 |
| WO | 2004105300 | 12/2004 |
| WO | WO-2004109538 A1 | 12/2004 |
| WO | WO-2005022812 | 3/2005 |
| WO | WO-2005036753 A2 | 4/2005 |
| WO | 2005109224 A2 | 11/2005 |
| WO | WO-2005107123 | 11/2005 |
| WO | WO-2005112250 A2 | 11/2005 |
| WO | WO-2005120079 A2 | 12/2005 |
| WO | WO-2006013459 A1 | 2/2006 |
| WO | WO-2006020826 A2 | 2/2006 |
| WO | WO-2006036276 | 4/2006 |
| WO | WO-2006057938 A2 | 6/2006 |
| WO | WO-2006060036 A1 | 6/2006 |
| WO | WO-2006084503 A1 | 8/2006 |
| WO | WO-2006116102 A2 | 11/2006 |
| WO | WO-2006135877 A2 | 12/2006 |
| WO | WO-2006135878 A2 | 12/2006 |
| WO | WO-2007078252 A2 | 7/2007 |
| WO | WO-2007078253 A2 | 7/2007 |
| WO | WO-2007095550 A2 | 8/2007 |
| WO | WO-2007098397 A2 | 8/2007 |
| WO | WO-2007098480 A1 | 8/2007 |
| WO | WO-2008011549 A2 | 1/2008 |
| WO | WO-2008023328 A3 | 4/2008 |
| WO | WO-2008054100 A1 | 5/2008 |
| WO | WO-2008085013 A1 | 7/2008 |
| WO | WO-2008086313 A1 | 7/2008 |
| WO | WO-2008131023 A1 | 10/2008 |
| WO | WO-2008144004 A1 | 11/2008 |
| WO | WO-2009036378 | 3/2009 |
| WO | WO-2009065526 A1 | 5/2009 |
| WO | WO-2009137705 A2 | 11/2009 |
| WO | WO-2009143741 A1 | 12/2009 |
| WO | WO-2010027397 A2 | 3/2010 |
| WO | WO-2010078281 A2 | 7/2010 |
| WO | WO-2010085361 A2 | 7/2010 |
| WO | WO-2011022555 | 2/2011 |
| WO | WO-2011038013 | 3/2011 |
| WO | WO-2011038034 A1 | 3/2011 |
| WO | WO-2011059286 A2 | 5/2011 |
| WO | WO-2011070552 A1 | 6/2011 |
| WO | WO-2011102792 A1 | 8/2011 |
| WO | WO-2012021540 | 2/2012 |
| WO | WO-2012021543 | 2/2012 |
| WO | WO-2012109614 A1 | 8/2012 |

OTHER PUBLICATIONS

3GPP: "3rd Generation Partnership Project; Technical Specification Group Services and system Aspects; Multimedia Broadcast/Multicast Service (MBMS); Protocols and codecs (Release 6)", Sophia Antipolis, France, Jun. 1, 2005 (Jun. 1, 2005), XP002695256, Retrieved from the Internet: URL:http://www.etsi.org/deliver/etsi_ts/126300_126399/126346/06.01.00_60/ts_126346v060100p.pdf.

3GPP TS 26.234 V9.1.0 ,"3rd Generation Partnership Project; Technical Specification Group Services and System Aspects; Transparent end-to-end Packet-switched Streaming Service (PSS); Protocols and codecs (Release 9)", Dec. 2009, 179 pages.

3GPP TS 26.244 V9.1.0, 3rd Generation Partnership Project; Technical Specification Group Services and System Aspects; Transparent end-to-end packet switched streaming service (PSS); 3GPP file format (3GP), (Release 9), Mar. 2010, 55 pp.

3GPP TS 26.247, v1.5.0, 3rd Generation Partnership Project; Technical Specification Group Services and System Aspects Transparent end-to-end Packet-switched Streaming Service (PSS); Progressive Download and Dynamic Adaptive Streaming over HTTP (3GP-DASH) (Release 10), 2010, 91 pages.

3GPP TSG-SA4 #57 S4-100015, IMS based PSS and MBMS User Service extensions, Jan. 19, 2010, URL : http://www.3gpp.org/ftp/tsg_sa/WG4_CODEC/TSGS4_57/docs/S4-100015.zip.

3rd Generation Partnership Project, Technical Specification Group Services and System Aspects Transparent end-to-end packet switched streaming service (PSS), 3GPP file format (3GP) (Release 9) , 3GPP Standard, 3GPP TS 26.244, 3rd Generation Partnership Project (3GPP), Mobile Competence Centre , 650, Route Des Lucioles , F-06921 Sophia-Antipolis Cedex , France, No. V8.1.0, Jun. 1, 2009 (Jun. 1, 2009), pp. 1-52, XP050370199.

3rd Generation Partnership Project; Technical Specification Group Services and System Aspects; Transparent end-to-end packet switched streaming service (PSS); 3GPP file format (3GP) (Release 9), 3GPP Standard; 3GPP TS 26.244, 3rd Generation Partnership Project (3GPP), Mobile Competence Centre; 650, Route Des Lucioles; F-06921 Sophia-Antipolis Cedex; France, No. V9.2.0, Jun. 9, 2010 (Jun. 9, 2010), pp. 1-55, XP050441544, [retrieved on Jun. 9, 2010].

3rd Generation Partnership Project; Technical Specification Group Services and System Aspects; Transparent end-to-end Packet-switched Streaming Service (PSS); Progressive Download and Dynamic Adaptive Streaming over HTTP (3GP-DASH) (Release 10), 3GPP Standard; 3GPP TS 26.247, 3rd Generation Partnership Project (3GPP), Mobile Competence Centre ; 650, Route Des Lucioles ; F-06921 Sophia-Antipolis Cedex ; France, vol. SA WG4, No. V10.0.0, Jun. 17, 2011 (Jun. 17, 2011), pp. 1-94, XP050553206, [retrieved on Jun. 17, 2011].

3rd Generation Partnership Project; Technical Specification Group Services and System Aspects; Transparent end-to-end Packet-switched Streaming Service (PSS);Protocols and codecs(Release 9)

(56) References Cited

OTHER PUBLICATIONS

3GPP TS 26.234 V9.3.0, Jun. 23, 2010 P.85-102,URL,http://www.3gpp.org/ftp/TSG_SA/WG4_CODEC/TSGS4_59/Docs/S4-100511.zip, 26234-930.zip.
Aggarwal, C. et al.: "A Permutation-Based Pyramid Broadcasting Scheme for Video-on-Demand Systems," Proc. IEEE Int'l Conf. on Multimedia Systems, Hiroshima, Japan (Jun. 1996).
Aggarwal, C. et al.: "On Optimal Batching Policies for Video-on-Demand Storage Servers," Multimedia Systems, vol. 4, No. 4, pp. 253-258 (1996).
Albanese, A., et al., "Priority Encoding Transmission", IEEE Transactions on Information Theory, vol. 42, No. 6, pp. 1-22, (Nov. 1996).
Alex Zambelli,"IIS Smooth Streaming Technical Overview", Microsoft Mar. 25, 2009 (Mar. 25, 2009), XP002620446, Retrieved from the Internet: URL:http://www.microsoft.com/downloads/en/details.aspxFamilyID=03d22583-3ed6-44da-8464-blb4b5ca7520, [retrieved on Jan. 21, 2011].
Almeroth, et al., "The use of multicast delivery to provide a scalable and interactive video-on-demand service", IEEE Journal on Selected Areas in Communication, 14(6): 1110-1122, (1996).
Amon P et al., "File Format for Scalable Video Coding", IEEE Transactions on Circuits and Systems for Video Technology, IEEE Service Center, Piscataway, NJ, US, vol. 17, No. 9, Sep. 1, 2007 (Sep. 1, 2007), pp. 1174-1185, XP011193013, ISSN: 1051-8215, DOI:10.1109/TCSVT.2007.905521.
Anonymous: [Gruneberg, K., Narasimhan, S. and Chen, Y., editors] "Text of ISO/IEC 13818-1:2007/PDAM 6 MVC operation point descriptor", 90 MPEG Meeting; Oct. 26, 2009-Oct. 30, 2009; XIAN; (Motion Picture Expertgroup or ISO/IEC JTC1/SC29/WG11), No. N10942, Nov. 19, 2009 (Nov. 19, 2009), XP030017441.
Anonymous: "Technologies under Consideration", 100. MPEG Meeting;Apr. 30, 2012-May 5, 2012; Geneva; (Motion Picture Expert Group or ISO/IEC JTC1 /SC29/WG11),, No. N12682, Jun. 7, 2012 (Jun. 7, 2012), XP030019156.
Anonymous: "Technologies under Consideration", 98. MPEG Meeting; Nov. 28, 2011-Dec. 2, 2011; Geneva; (Motion Picture Expert Group or ISO/IEC JTC1/SC29/WG11),, No. N12330, Dec. 3, 2011 (Dec. 3, 2011), XP030018825.
Anonymous: "Text of ISO/IEC 14496-12 3rd Edition", 83 MPEG Meeting; Jan. 14, 2008-Jan. 18, 2008; Antalya; (Motion Pictureexpert Group or ISO/IEC JTC1/SC29/WG11), No. N9678, Apr. 22, 2008 (Apr. 22, 2008), XP030016172.
Anonymous: "Text of ISO/IEC 14496-15 2nd edition", 91 MPEG Meeting; Jan. 18, 2010-Jan. 22, 2010; Kyoto; (Motion Picture Expertgroup or ISO/IEC JTC1/SC29/WG11),, No. N11139, Jan. 22, 2010 (Jan. 22, 2010), XP030017636, ISSN: 0000-0030 the whole document.
Anonymous: "Text of ISO/IEC IS 23009-1 Media Presentation Description and Segment Formats", 98. MPEG Meeting; Nov. 28, 2011-Dec. 2, 2012; Geneva; (Motion Picture Expert Group or ISO/IEC JTC1/SC29/WG11) No. N12329, Jan. 6, 2012 (Jan. 6, 2012), XP030018824.
ATIS: "PTV Content on Demand Service", IIF-WT-063R44, Nov. 11, 2010, pp. 1-124, XP055045168, Retrieved from the Internet: URL:ftp://vqeg.its.bldrdoc.gov/Documents/VQEG_Atlanta_Nov10/MeetingFiles/Liaison/IIF-WT-063R44_Content_on_Demand.pdf [retrieved on Nov. 22, 2012].
Bar-Noy, et al., "Competitive on-line stream merging algorithms for media-on-demand", Draft (Jul. 2000), pp. 1-34.
Bar-Noy et al. "Efficient algorithms for optimal stream merging for media-on-demand," Draft (Aug. 2000), pp. 1-43.
Blomer, et al., "An XOR-Based Erasure-Resilient Coding Scheme," ICSI Technical Report No. TR-95-048 (1995) [avail. at ftp://ftp.icsi.berkeley.edu/pub/techreports/1995/tr-95-048.pdf].
Bouazizi I., et al., "Proposals for ALC/FLUTE server file format (14496-12Amd.2)", 77. MPEG Meeting; Jul. 17, 2006-Jul. 21, 2006; Klagenfurt; (Motion Pictureexpert Group or ISO/IEC JTC1/SC29/WG11), No. M13675, Jul. 12, 2006 (Jul. 12, 2006), XP030042344, ISSN: 0000-0236.
Bross, B., et al., "High efficiency video coding (HEVC) text specification draft 7," Joint Collaborative Team on Video Coding (JCT-VC) of ITU-T SG16 WP3 and ISO/IEC JTC1/SC29/WG11 9th Meeting: Geneva, CH, Apr. 27, 2012-May 7, 2012, JCTVC-I1003_d2, XP030112373, (May 10, 2012), pp. 1-290.
Bross, B., et al., "High efficiency video coding (HEVC) text specification draft 8," Joint Collaborative Team on Video Coding (JCT-VC) of ITU-T SG16 WP3 and ISO/IEC JTC1/SC29/WG11 10th Meeting: Stockholm, SE, Jul. 11-20, 2012, JCTVC-J1003_d7, pp. 261.
Bross, et al., "High efficiency video coding (HEVC) text specification draft 6," JCTVC-H1003, Joint Collaborative Team on Video Coding (JCT-VC) of ITU-T SG16 WP3 and ISO/IEC JTC1/SC29/WG11, 8th Meeting: San José, CA, USA, Feb. 1-10, 2012, 259 pp.
Bross, et al., "High efficiency video coding (HEVC) text specification draft 6," Joint Collaborative Team on Video Coding (JCT-VC) of ITU-T SG16 WP3 and ISO/IEC JTC1/SC29/WG11 JCTVC-H1003, 7th Meeting: Geneva, CH, Nov. 21-30, 2011, pp. 259.
Bross, et al., "WD4: Working Draft 4 of High-Efficiency Video Coding," JCTVC-F803_d2, (JCT-VC) of ITU-T SG16 WP3 and ISO/IEC JTC1/SC29/WG11 Joint Collaborative Team on Video Coding, 6th Meeting, Torino, IT, Jul. 14-22, 2011, 226 pages.
Bross, et al., "WD5: Working Draft 5 of High-Efficiency Video Coding," JCTVC-G1103_d2, (JCT-VC) of ITU-T SG16 WP3 and ISO/IEC JTC1/SC29/WG11 Joint Collaborative Team on Video Coding, 7th Meeting, Geneva, Switzerland (Nov. 2011), 214 pages.
Chen et al., "Response to the CfP on HTTP Streaming: Adaptive Video Streaming based on AVC", 93. MPEG Meeting; Jul. 26, 2010-Jul. 30, 2010; Geneva; (Motion Picture Expert Group or ISO/IEC JTC1/SC29/WG11), No. M17909, Jul. 26, 2010, XP030046499.
Chikara S., et al., "Add-on Download Scheme for Multicast Content Distribution Using LT Codes", IEICE. B, Communications, Aug. 1, 2006, J89-B (8), pp. 1379-1389.
Dan, A. et al.: "Scheduling Policies for an On-Demand Video Server with Batching," Proc. ACM Multimedia, pp. 15-23 (Oct. 1998).
"Digital Video Broadcasting (DVB); Framing structure, channel coding and modulation for digital terrestrial television; ETSI EN 300 744" ETSI Standards, LIS, Sophia Antipolis Cedex, France, V1.6.1, pp. 9, Jan. 10, 2009 (Jan. 2009).
Eager, et al. "Minimizing bandwidth requirements for on-demand data delivery," Proceedings of the International Workshop on Advances in Multimedia Information Systems, p. 80-87 (Indian Wells, CA Oct. 1999).
Eager, et al., "Optimal and efficient merging schedules for video-on-demand servers", Proc. ACM Multimedia, vol. 7, pp. 199-202 (1999).
European Search Report—EP07756943—Search Authority—Munich—May 2, 2013.
European Search Report—EP10013232—Search Authority—The Hague—Feb. 28, 2013.
European Search Report—EP10013235—Search Authority—The Hague—Aug. 20, 2012.
European Search Report—EP10013236—Search Authority—The Hague—Jul. 12, 2012.
Fernando, et al., "httpstreaming of MPEG Media—Response to CfP", 93 MPEG Meeting; Jul. 26, 2010-Jul. 30, 2010; Geneva; (Motion Picture Expert Group or ISO/IEC JTC1/SCE29/WG11), No. M17756, Jul. 22, 2010 (Jul. 22, 2010), XP030046346.
Fielding et al., "RFC 2616: Hypertext Transfer Protocol HTTP/1.1", Internet Citation, Jun. 1999 (Jun. 1999), pp. 165, XP002196143, Retrieved from the Internet: URL:http://www.rfc-editor-org/ [retrieved on Apr. 15, 2002].
Frojdh P., et al., "Study on 14496-12:2005/PDAM2 ALU/ Flute Server File Format", 78.MPEG Meeting; Oct. 23, 2006-Oct. 27, 2006; Hangzhou: (Motion Picturexpert Group or ISO/ IEC JTC1/SC29/WG11),, No. M13855, Oct. 13, 2006 (Oct. 13, 2006), XP030042523, ISSN: 0000-0233.
Gao, L. et al.: "Efficient Schemes for Broadcasting Popular Videos," Proc. Inter. Workshop on Network and Operating System Support for Digital Audio and Video, pp. 1-13 (1998).

(56) References Cited

OTHER PUBLICATIONS

Gerard F., et al., "HTTP Streaming MPEG media—Response to CFP", 93. MPEG Meeting, Geneva Jul. 26, 2010 to Jul. 30, 2010.
Gil A., et al., "Personalized Multimedia Touristic Services for Hybrid Broadcast/Broadband Mobile Receivers," IEEE Transactions on Consumer Electronics, 2010, vol. 56 (1), pp. 211-219.
Hannuksela M.M., et al., "DASH: Indication of Subsegments Starting with SAP", 97. MPEG Meeting; Jul. 18, 2011-Jul. 22, 2011; Torino; (Motion Picture Expert Group or ISO/IEC JTC1/SC29/WG11) No. m21096, Jul. 21, 2011 (Jul. 21, 2011), XP030049659.
Hannuksela M.M., et al., "ISOBMFF: SAP definitions and 'sidx' box", 97. MPEG Meeting; Jul. 18, 2011-Jul. 22, 2011; Torino; (Motion Picture Expert Group or ISO/IEC JTC1/SC29/WG11) No. m21435, Jul. 22, 2011 (Jul. 22, 2011), XP030049998.
Hasan M A., et al., "Architecture for a Low Complexity Rate-Adaptive Reed-Solomon Encoder", IEEE Transactions on Computers, IEEE Service Center, Los Alamitos, CA, US, vol. 44, No. 7, Jul. 1, 1995 (Jul. 1, 1995), pp. 938-942, XP000525729, ISSN: 0018-9340, DOI: 10.1109/12.392853.
Hua, et al., "Skyscraper broadcasting: A new broadcsting system for metropolitan video-on-demand systems", Proc. ACM SIGCOMM, pp. 89-100 (Cannes, France, 1997).
Huawei et al., "Implict mapping between CCE and PUCCH for ACK/NACK TDD", 3GPP Draft; R1-082359, 3rd Generation Partnership Project (3GPP), Mobile Competence Centre; 650, Route Des Lucioles ; F-06921 Sophia-Antipolis Cedex ; France, vol. RAN WG1, No. Warsaw, Poland, Jun. 24, 2008, XP050110650, [retrieved on Jun. 24, 2008].
International Preliminary Examination Report, PCT/US2001/048114—International Preliminary Examining Authority—US, Oct. 17, 2003.
International Preliminary Report on Patentability—PCT/US2008/060510, International Search Authority—European Patent Office—Oct. 29, 2009.
International Preliminary Report on Patentability—PCT/US2011/044284, The International Bureau of WIPO—Geneva, Switzerland, Oct. 8, 2012.
International Preliminary Report on Patentability—PCT/US2011/047121—The International Bureau of WIPO Geneva, Switzerland, Nov. 21, 2012.
International Preliminary Report on Patentability—PCT/US2011/047125—The International Bureau of WIPO Geneva, Switzerland, Nov. 21, 2012.
International Preliminary Report on Patentability—PCT/US2011/047128—The International Bureau of WIPO Geneva, Switzerland, Nov. 21, 2012.
International Preliminary Report on Patentability—PCT/US2011/063995, The International Bureau of WIPO—Geneva, Switzerland, Mar. 18, 2013).
International Preliminary Report on Patentability—PCT/US2012/053394, The International Bureau of WIPO—Geneva, Switzerland, Mar. 13, 2014.
International Preliminary Report on Patentability—PCT/US2012/058922, The International Bureau of WIPO—Geneva, Switzerland, Apr. 1, 2014.
International Search Report and Written Opinion—PCT/US2010/049842, ISA/EPO—Jun. 28, 2011.
International Search Report and Written Opinion—PCT/US2010/049852, International Search Authority—European Patent Office—Feb. 17, 2011.
International Search Report and Written Opinion—PCT/US2010/049862, ISA/EPO—Jun. 27, 2011.
International Search Report and Written Opinion—PCT/US2010/049874, International Search Authority—European Patent Office—Feb. 16, 2011.
International Search Report and Written Opinion—PCT/US2011/043885—ISA/EPO—Dec. 9, 2011.
International Search Report and Written Opinion—PCT/US2011/044284, ISA/EPO—Oct. 21, 2011.
International Search Report and Written Opinion—PCT/US2011/047121—ISA/EPO—Oct. 26, 2011.
International Search Report and Written Opinion—PCT/US2011/047125—ISA/EPO—Oct. 26, 2011.
International Search Report and Written Opinion—PCT/US2011/047128—ISA/EPO—Oct. 26, 2011.
International Search Report and Written Opinion—PCT/US2011/057382—ISAEPO—May 3, 2012.
International Search Report and Written Opinion—PCT/US2011/063995—ISAEPO—May 27, 2012.
International Search Report and Written Opinion—PCT/US2012/053394—ISA/EPO—Feb. 6, 2013.
International Search Report and Written Opinion—PCT/US2012/058922—ISA/EPO—Dec. 7, 2012.
International Search Report and Written Opinion—PCT/US2013/033852—ISA/EPO—Jun. 11, 2013.
International Search Report and Written Opinion—PCT/US2013/038247—ISA/EPO—Jul. 19, 2013.
International Search Report and Written Opinion—PCT/U S2010/024207, International Search Authority—European Patent Office—Jul. 21, 2010.
International Search Report and Written Opinion—PCT/US2010/049869—ISAEPO—Aug. 4, 2011.
International Search Report, PCT/US2001/048114—International Search Authority—US, May 9, 2002.
International Search Report, PCT/US2008/060510—International Search Authority—Aug. 1, 2008.
International Standard ISO/IEC 14496-12, Information Technology—Coding of audio-visual objects—Part 12: ISO base media file format, Third Edition, Oct. 15, 2008, 120 pp.
ISO/IEC 14996-12 International Standard, "Information technology-Coding of audio-visual objects Part 12: ISO base media file format," Oct. 1, 2005, 94 pp.
ISO/IEC JTC 1/SC 29, ISO/IEC FCD 23001-6, Information technology—MPEG systems technologies—Part 6: Dynamic adaptive streaming over HTTP (DASH), Jan. 28, 2011.
ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.
Jiang J., "File Format for Scalable Video Coding", PowerPoint Presentation for CMPT 820, Summer 2008.
Juhn, L. et al.: "Adaptive Fast Data Broadcasting Scheme for Video-on-Demand Service," IEEE Transactions on Broadcasting, vol. 44, No. 2, pp. 182-185 (Jun. 1998).
Juhn, L. et al.: "Harmonic Broadcasting for Video-on-Demand Service," IEEE Transactions on Broadcasting, vol. 43, No. 3, pp. 268-271 (Sep. 1997).
Kim J., et al., "Enhanced Adaptive Modulation and Coding Schemes Based on Multiple Channel Reportings for Wireless Multicast Systems", 62nd IEEE Vehicular Technology Conference, VTC-2005-Fall, Sep. 25-28, 2005, vol. 2, pp. 725-729, XP010878578, DOI: 1 0.11 09/VETECF.2005.1558019, ISBN: 978-0-7803-9152-9.
Kozamernik F: "Media streaming over the Internet", Internet Citation, Oct. 2002 (Oct. 2002), XP002266291, Retrieved from the Internet: URL: http://www.ebu.ch/trev_292-kozamerni k. pdf [retrieved on Jan. 8, 2004] section "Video codecs for scalable streaming".
Lee, J.Y., "Description of Evaluation Experiments on ISO/IEC 23001-6, Dynamic Adaptive Streaming over HTTP", ISO/IEC JTC1/SC29/WG11MPEG2010/N11450, Jul. 31, 2010, 16 pp.
Li, M., et al., "Playout Buffer and Rate Optimization for Streaming over IEEE 802.11 Wireless Networks", Aug. 2009, Worcester Polytechnic Institute, USA.
Luby, et al., "FLUTE—File Delivery over Unidirectional Transport", IETF RFC 3926, Oct. 2004, pp. 1-35.
Luby et, al. "Layered Coding Transport (LCT) Building Block", IETF RFC 5651, pp. 1-42, (Oct. 2009).
Luby et al., RaptorQ Forward Error Correction Scheme for Object Delivery draft-ietf-rmt-bb-fec-raptorq-00, Qualcomm, Inc. Jan. 28, 2010.

(56) References Cited

OTHER PUBLICATIONS

Luby, M., et. al. "Forward Error Correction (FEC) Building Block", IETF RFC 5052, pp. 1-31, (Aug. 2007).
Luby, M., et al., "Raptor Forward Error Correction Scheme for Object Delivery", IETF RFC5053, pp. 1-46 (Sep. 2007).
Luby M. et al., "RaptorQ Forward Error Correction Scheme for Object Delivery", IETF draft ietf-rmt-bb-fec-raptorq-04, Reliable Multicast Transport, Internet Engineering Task Force (IETF), Standard Workingdraft, Internet Society (ISOC), Aug. 24, 2010, pp. 1-68, XP015070705, [retrieved on Aug. 24, 2010].
Luby, M., et al., "Request for Comments: 3453: The Use of Forward Error Correction (FEC) in Reliable Multicast," Internet Article, [Online] Dec. 2002, pp. 1-19.
Luby M., "Simple Forward Error Correction (FEC) Schemes," draft-luby-rmt-bb-fec-supp-simple-00.txt, pp. 1-14, Jun. 2004.
Luby M., "LT Codes", Foundations of Computer Science, 2002, Proceedings, The 43rd Annual IEEE Symposium on, 2002.
Luby Qualcomm Incorporated, "Universal Object Delivery using RaptorQ; draft-luby-uod-raptorq-OO.txt", Internet Engineering Task Force (IETF), Standardworkingdraft, Internet Society (ISOC), Mar. 7, 2011, pp. 1-10, XP015074424, [retrieved on Mar. 7, 2011].
Makoto N., et al., "On Tuning of Blocking LU decomposition for VP2000 series" The 42th Information Processing Society of Japan Conference (1st term in 1991), Feb. 25, 1991, pp. 71-72, 4B-8.
Matsuoka H., et al., "Low-Density Parity-Check Code Extensions Applied for Broadcast-Communication Integrated Content Delivery", Research Laboratories, NTT DOCOMO, Inc., 3-6, Hikari-No-Oka, Yokosuka, Kanagawa, 239-8536, Japan, ITC-SS21, 2010 IEICE, pp. 59-63.
Michael G et al., "Improved low-density parity-check codes using irregular graphs", Information Theory, IEEE Transactions on,Feb. 2001,vol. 47, No. 2,pp. 585-598.
Miller G., et al., "Bounds on the maximum likelihood decoding error probability of low density parity check codes", Information Theory, 2000. Proceedings. IEEE International Symposium on, 2000, p. 290.
Morioka S., "A Verification Methodology for Error Correction Circuits over Galois Fields", Tokyo Research Laboratory, IBM Japan Ltd, pp. 275-280, Apr. 22-23, 2002.
Moriyama, S., "5. Present Situation of Terrestrial Digital Broadcasting in Europe and USA", Journal of The Institute of Image Information and Television Engineers, Nov. 20, 1999, vol. 53, No. 11, pp. 1476-1478.
Motorola et al: "An Analysis of DCD Channel Mapping to BCAST File Delivery Sessions; OMA-CD-DCD-2007-0112-INP_DCD_Channel_Mapping_to_BCAST_File_Delivery", OMA-CD-DCD-2007-0112-INP_DCD_Channel_Mappi Ng_to_BCAST_File_Delivery, Open Mobile Alliance (OMA), 4330 La Jolla Village Dr., Suite 110 San Diego, CA 92122; USA Oct. 2, 2007 (Oct. 2, 2007), pp. 1-13, XP064036903.
Muller, et al., "A test-bed for the dynamic adaptive streaming over HTTP featuring session mobility" MMSys '11 Proceedings of the second annual ACM conference on Multimedia systems, Feb. 23-25, 2011, San Jose, CA, pp. 271-276.
Muramatsu J., et al., "Low density parity check matrices for coding of multiple access networks", Information Theory Workshop, 2003. Proceedings. 2003 IEEE , Apr. 4, 2003, pp. 304-307.
Nokia Corp., "Usage of 'mfra' box for Random Access and Seeking," S4-AHI127, 3GPP TSG-SA4 Ad-Hoc Meeting, Dec. 14-16, 2009, Paris, FR, 2 pp.
Ohashi A et al., "Low-Density Parity-Check (LDPC) Decoding of Quantized Data," Technical Report of the Institute of Electronics, Information and Communication Engineers, Aug. 23, 2002, vol. 102, No. 282, pp. 47-52, RCS2002-154.
Ozden, B. et al.: "A Low-Cost Storage Service for Movie on Demand Databases," Proceedings of the 20th Very Large DataBases (VLDB) Conference, Santiago, Chile (1994).
Pantos, "HTTP Live Streaming draft-pantos-http-live-streaming-02", Informational, Internet-Draft, Intended status: Informational, Expires: Apr. 8, 2010, http://tools.ietf.org/html/draft-pantos-http-live-streaming-02, pp. 1-20, Oct. 5, 2009.
Pantos R et al., "HTTP Live Streaming; draft-pantos-http-live-streaming-OT.txt ", HTTP Live Streaming; Draft-Pant0s-Http-Live-Streaming-01.Txt, Internet Engineering Task Force, IETF; Standardworkingdraft, Internet Society (ISOC) 4, Rue Des Falaises CH—1205 Geneva, Switzerland, No. 1, Jun. 8, 2009 (Jun. 8, 2009), XP015062692.
Paris, et al., "A low bandwidth broadcasting protocol for video on demand", Proc. International Conference on Computer Communications and Networks, vol. 7, pp. 690-697 (Oct. 1998).
Paris, et al., "Efficient broadcasting protocols for video on demand", International Symposium on Modeling, Analysis and Simulation of Computer and Telecommunication systems (MASCOTS), vol. 6, pp. 127-132 (Jul. 1998).
Perkins, et al.: "Survey of Packet Loss Recovery Techniques for Streaming Audio," IEEE Network; Sep./Oct. 1998, pp. 40-48.
Pyle, et al., "Microsoft http smooth Streaming: Microsoft response to the Call for Proposal on httpstreaming", 93 MPEG Meeting; Jul. 26, 2010-Jul. 30, 2010; Geneva; (Motion Picture Expert Group or ISO/IEC JTC1/SCE29/WG11), No. M17902, Jul. 22, 2010 (Jul. 22, 2010), XP030046492.
Qualcomm Europe S A R L: "Baseline Architecture and Definitions for HTTP Streaming", 3GPP Draft; S4-090603_HTTP_Streaming_Architecture, 3rd Generation Partnership Project (3GPP), Mobile Competence Centre; 650, Route Des Lucioles; F-06921 Sophia-Antipolis Cedex; France, No. Kista; 20090812, Aug. 12, 2009 (Aug. 12, 2009), XP050356889.
Qualcomm Incorporated: "Adaptive HTTP Streaming: Complete Proposal", 3GPP TSG-SA4 AHI Meeting S4-AHI170, Mar. 2, 2010, URL, http://www.3gpp.org/FTP/tsg_sa/WG4_CODEC/Ad-hoc_MBS/Docs_AHI/S4-AHI170.zip, S4-AHI170_C_AdaptiveHTTPStreaming-Full.doc.
Qualcomm Incorporated: "Corrections to 3GPP Adaptive HTTP Streaming", 3GPP TSG-SA4 #59 Change Request 26.234 CR0172 S4-100403, Jun. 16, 2010, URL, http://www.3gpp.org/FTP/tsg_sa/WG4_CODEC/TSGS4_59/Docs/S4-100403.zip, S4-100403_CR_26234-0172-AdaptiveHTTPStreaming-Rel-9.doc.
Qualcomm Incorporated: "RaptorQ Technical Overview", pp. 1-12, Oct. 1, 2010.
Qualcomm Incorporated: "RatorQ Forward Error Correction Scheme for Object Delivery draft-ietf-rmt-bb-fec-raptorq-04", Internet Engineering Task Force, IETF, pp. 1-68, Aug. 24, 2010.
Qualcomm Incorporated: "Use Cases and Examples for Adaptive httpstreaming", 3GPP Draft; S4-100408-Usecases-HSD, 3rd Generation Partnership Project (JGPP), Mobile Competence Centre; 650, Route Des Lucioles; F-06921 Sophia-Antipolis Cedex; France, vol. SA WG4, No. Prague, Czech Republic; 20100621, Jun. 17, 2010 (Jun. 17, 2010), pp. 1-22, XP050438085, [retrieved on Jun. 17, 2010].
Rangan, et al., "Designing an On-Demand Multimedia Service," IEEE Communication Magazine, vol. 30, pp. 56-64, (Jul. 1992).
Realnetworks Inc et al., "Format for HTTP Streaming Media Presentation Description", 3GPP Draft; S4-100020, 3rd Generation Partnership Project (3GPP), Mobile Competence Centre; 650, Route Des Lucioles; F-06921 Sophia-Anti Polis Cedex; France, vol. SA WG4, No. St Julians, Malta; 20100125, Jan. 20, 2010 (Jan. 20, 2010), XP050437753, [retrieved on Jan. 20, 2010].
Research in Motion UK Limited: "An MPD delta file for httpstreaming", 3GPP Draft; S4-100453, 3rd Generation Partnership Project (SGPP), Mobile Competence Centre; 650, Route Des Lucioles; F-06921 Sophia-Antipolis Cedex; France, vol. SA WG4, No. Prague, Czech Republic; 20100621, Jun. 16, 2010 (Jun. 16, 2010), XP050438066, [retrieved on Jun. 16, 2010].
Rhyu, et al., "Response to Call for Proposals on httpstreaming of MPEG Media", 93 MPEG Meeting; Jul. 26, 2010-Jul. 30, 2010; Geneva; (Motion Picture Expert Group or ISO/IEC JTC1/SCE29/WG11) No. M17779, Jul. 26, 2010 (Jul. 26, 2010), XP030046369.
Rizzo L. "Effective Erasure Codes for Reliable Computer Communication Protocols," Computer Communication Review, 27 (2) pp. 24-36 (Apr. 1, 1997), XP000696916.

(56) References Cited

OTHER PUBLICATIONS

Roca, V., et, al. "Low Density Parity Check (LDPC) Staircase and Triangle Forward Error Correction (FEC) Schemes", IETF RFC 5170 (Jun. 2008), pp. 1-34.
Roumy A., et al., "Unequal Erasure Protection and Object Bundle Protection with the Generalized Object Encoding Approach", Inria-00612583, Version 1, Jul. 29, 2011, 25 pages.
Samukawa, H. "Blocked Algorithm for LU Decomposition" Journal of the Information Processing Society of Japan, Mar. 15, 1993, vol. 34, No. 3, pp. 398-408.
Schulzrinne, et al., "Real Time Streaming Protocol (RTSP)" Network Working Group, Request for Comments: 2326, Apr. 1998, pp. 1-92.
Second Written Opinion from International Application No. PCT/US2011/047128, dated Jul. 19, 2012, 5 pp.
Shierl T; Gruneberg K; Narasimhan S; Vetro A: "ISO/IEC 13818-1:2007/FPDAM 4—Information Technology Generic Coding of Moving Pictures and Audio Systems amendment 4: Transport of Multiview Video over ITU-T Rec H.222.0 ISO/IEC 13818-1" ITU-T REC. H.222.0(May 2006)FPDAM 4, vol. MPEG2009, No. 10572, May 11, 2009 (May 11, 2009), pp. 1-20, XP002605067 p. 11, last two paragraphs sections 2.6.78 and 2.6.79 table T-1.
Sincoskie, W. D., "System Architecture for Large Scale Video on Demand Service," Computer Network and ISDN Systems, pp. 155-162, (1991).
Stockhammer T., et al., "DASH: Improvements on Representation Access Points and related flags", 97. MPEG Meeting; Jul. 18, 2011-Jul. 22, 2011; Torino; (Motion Picture Expert Group or ISO/IEC JTC1/SC29/WG11) No. m20339, Jul. 24, 2011 (Jul. 24, 2011), XP030048903.
Stockhammer, "WD 0.1 of 23001-6 Dynamic Adaptive Streaming over HTTP (DASH)", MPEG-4 Systems, International Organisation for Standardisation, ISO/IEC JTC1/SC29/WG11, Coding of Moving Pictures and Audio, MPEG 2010 Geneva/m11398, Jan. 6, 2011, 16 pp.
Sullivan et al., Document: JVT-AA007, "Editors' Draft Revision to ITU-T Rec. H.264|ISO/IEC 14496-10 Advanced Video Coding—In Preparation for ITU-T SG 16 AAP Consent (in integrated form)," Joint Video Team (JVT) of ISO/IEC MPEG & ITU-T VCEG (ISO/IEC JTC1/SC29/WG11 and ITU-T SG16 Q.6), 30th Meeting: Geneva, CH, Jan. 29-Feb. 3, 2009, pp. 1-683, http://wftp3.itu.int/av-arch/jvt-site/2009_01_Geneva/JVT-AD007.zip.
Sun, et al., "Seamless Switching of Scalable Video Bitstreams for Efficient Streaming," IEEE Transactions on Multimedia, vol. 6, No. 2, Apr. 2004, pp. 291-303.
Supplementary European Search Report—EP07757111—Search Authority—The Hague—Jan. 22, 2013.
Supplementary European Search Report—EP08831086—Search Authority—Munich—Oct. 6, 2014.
Supplementry European Search Report—EP08746007—Search Authority—Munich—Sep. 27, 2012.
Taiwan Search Report—TW099105049—TIPO—Sep. 6, 2013.
Taiwan Search Report—TW099105858—TIPO—Oct. 13, 2013.
Taiwan Search Report—TW099127778—TIPO—Mar. 5, 2014.
Taiwan Search Report—TW100124836—TIPO—Oct. 17, 2013.
Taiwan Search Report—TW100128446—TIPO—Oct. 2, 2014.
Taiwan Search Report—TW100128447—TIPO—Jan. 17, 2014.
Taiwan Search Report—TW100128448—TIPO—May 18, 2014.
Taiwan Search Report—TW102115099—TIPO—Jan. 16, 2015.
Telefon AB LM Ericsson, et al., "Media Presentation Description in httpstreaming", 3GPP Draft; S4-100080-MPD, 3rd Generation Partnership Project (3GPP), Mobile Competence Centre; 650, Route Des Lucioles; F-06921 Sophia-Antipolis Cedex; France, vol. SA WG4, No. St Julians, Malta; 20100125, Jan. 20, 2010 (Jan. 20, 2010), XP050437773, [retrieved on Jan. 20, 2010].
Tetsuo M., et al., "Comparison of Loss Resilient Ability between Multi-Stage and Reed-Solomon Coding", Technical report of IEICE. CQ, Communication Quality, vol. 103 (178), Jul. 4, 2003, pp. 19-24.
U.S. Appl. No. 12/840,146, by Ying Chen et al., filed Jul. 20, 2010.

U.S. Appl. No. 12/908,537, by Ying Chen et al., filed Oct. 20, 2010.
U.S. Appl. No. 12/908,593, by Ying Chen et al., filed Oct. 20, 2010.
U.S. Appl. No. 13/082,051, by Ying Chen et al., filed Apr. 7, 2011.
U.S. Appl. No. 13/205,559, by Ying Chen et al., filed Aug. 8 2011.
U.S. Appl. No. 13/205,565, by Ying Chen et al., filed Aug. 8, 2011.
U.S. Appl. No. 13/205,574, by Ying Chen et al., filed Aug. 8, 2011.
Universal Mobile Telecommunications System (UMTS); LTE; Transparent end-to-end Packet-switched Streaming Service (PSS); Protocols and codecs (3GPP TS 26.234 version 9.3.0 Release 9), Technical Specification, European Telecommunications Standards Institute (ETSI), 650, Route Des Lucioles; F-06921 Sophia-Antipolis; France, vol. 3GPP SA, No. V9.3.0, Jun. 1, 2010 (Jun. 1, 2010), XP014047290, pp. 1-178.
Viswanathan, et al., "Metropolitan area video-on-demand services using pyramid broadcasting", Multimedia Systems, 4(4): 197-208 (1996).
Viswanathan, et al., "Pyramid Broadcasting for Video-on-Demand Service", Proceedings of the SPIE Multimedia Computing and Networking Conference, vol. 2417, pp. 66-77 (San Jose, CA, Feb. 1995).
Viswanathan,Subramaniyam R., "Publishing in Wireless and Wireline Environments," Ph. D Thesis, Rutgers, The State University of New Jersey (Nov. 1994), 180pages.
Wadayama T, "Introduction to Low Density Parity Check Codes and Sum-Product Algorithm," Technical Report of the Institute of Electronics, Information and Communication Engineers, Dec. 6, 2001, vol. 101, No. 498, pp. 39-46, MR2001-83.
Watson, M., et, al. "Asynchronous Layered Coding (ALC) Protocol Instantiation", IETF RFC 5775, pp. 1-23, (Apr. 2010).
Watson M., et al., "Forward Error Correction (FEC) Framework draft-ietf-fecframe-framework-11," 2011, pp. 1-38, URL,http://tools.ietf.org/pdf/draft-ietf-fecframe-framework-11.pdf.
Watson M., et al., "Raptor FEC Schemes for FECFRAME draft-ietf-fecframe-raptor-04," 2010, pp. 1-21, URL,http://tools.ietf.org/pdf/draft-ietf-fecframe-raptor-04.pdf.
Wiegand, T., et al., "WD2: Working Draft 2 of High-Efficiency Video Coding", 20110128, No. JCTVC-D503, Jan. 28, 2011 (Jan. 28, 2011), XP002679642, Retrieved from the Internet: URL: http://wftp3.itu.int/av-arch/jctvc-site/2011_01_D_Daegu/ [retrieved on Jul. 11, 2012], pp. 153.
Wiegand, T., et al., "WD3: Working Draft 3 of High-Efficiency Video Coding," Document JCTVC-E603, 5th Meeting: Geneva, CH, Mar. 16-23, 2011. pp. 193.
Wiegand, T., et al.,"WD1: Working Draft 1 of High-Efficiency Video Coding", JCTVC-C403, Joint Collaborative Team on Video Coding (JCT-VC), of ITU-T SG16 WP3 and ISO/IEC JTC1/SC29/WG11, 3rd Meeting: Guangzhou, CN, Oct. 7-15, 2010, pp. 137.
Wong, J.W., "Broadcast delivery", Proceedings of the IEEE, 76(12): 1566-1577, (1988).
Written Opinion, PCT/US2008/060510—International Search Authority—Aug. 1, 2008.
Yamazaki M., et al., "Multilevel Block Modulation Codes Construction of Generalized DFT," Technical Report of the Institute of Electronics, Information and Communication Engineers, Jan. 24, 1997, vol. 96, No. 494, pp. 19-24, IT96-50.
Zorzi, et al.: "On the Statistics of Block Errors in Bursty Channels," IEEE Transactions on Communications, vol. 45, No. 6, Jun. 1997, p. 660-667.
Qualcomm Incorporated: "Pseudo CR:Adaptive HTTP Streaming—Full Solution Proposal," 3GPP TSG-SA WG4#57 S4-100060, Jan. 29, 2010, 17 pages.
Ramsey B, "HTTP Status: 206 Partial Content and Range Requests," May 5, 2008 obtained at http://benramsey.com/blog/2008/05/206-partial-content-and-range-requests/.
3GPF TS 26.234 v9.4.0 (2010-09), 3rd Generation Partnership Project; Technical Specification Group Services and System Aspects; Transparent end-to-end Packet-switched Streaming Service (PSS); Protocols and codecs (Release 9), xp050442099, pp. 84-168.
Qualcomm Incorporated: "Discussion Paper on DASH Industry Profile including codecs and other interoperability components (S4-110880)", 3GPP Draft; 3rd Generation Partnership Project

(56) References Cited

OTHER PUBLICATIONS (3GPP SA WG4), Nov. 5, 2011 (Nov. 5, 2011), pp. 1-10, XP 050577907, Jeju Island, Korea; Nov. 7-11, 2011 Section 3 Low-Latency Live Profile.
Mehrotra S., et al., "Rate-Distortion Optimized Client Side Rate Control for adaptive Media Streaming", Multimedia Signal Processing, 2009. MMSP'09. IEEE International Workshop on, Nov. 2009, XP031550761, 6 pages.

\* cited by examiner

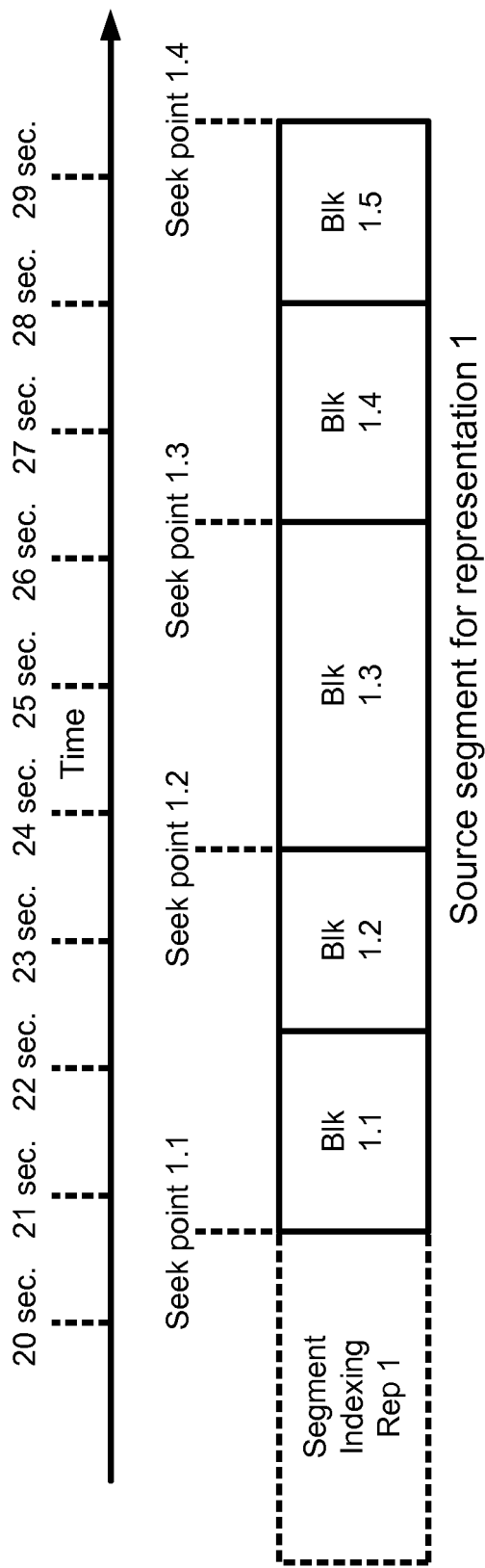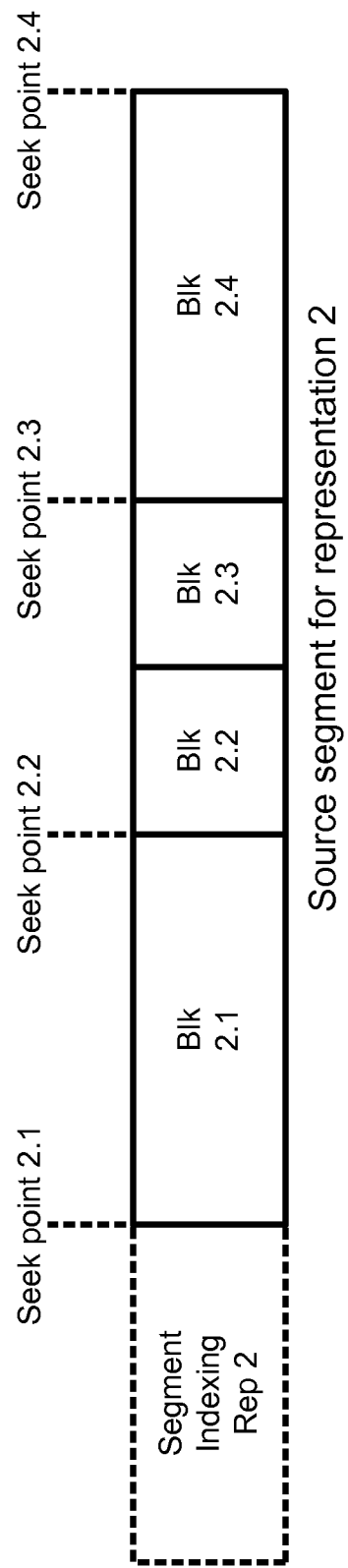
FIG. 8(a)

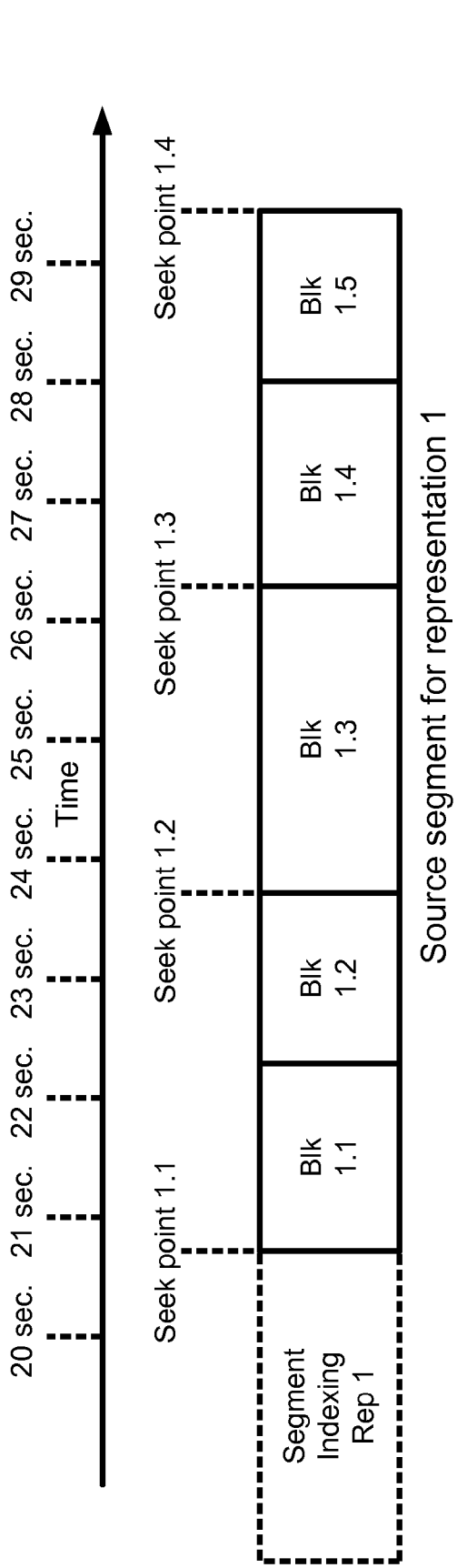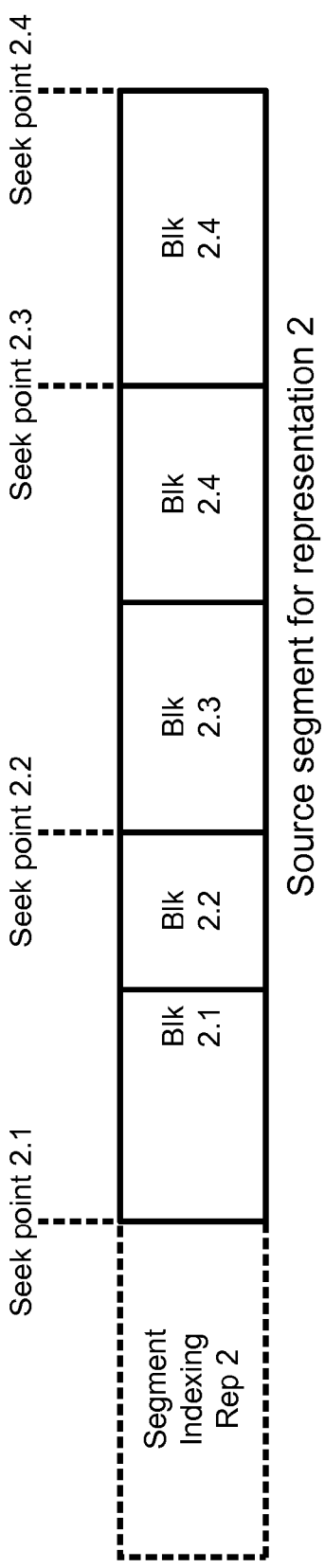
FIG. 8(b)

Continuous timing across segments
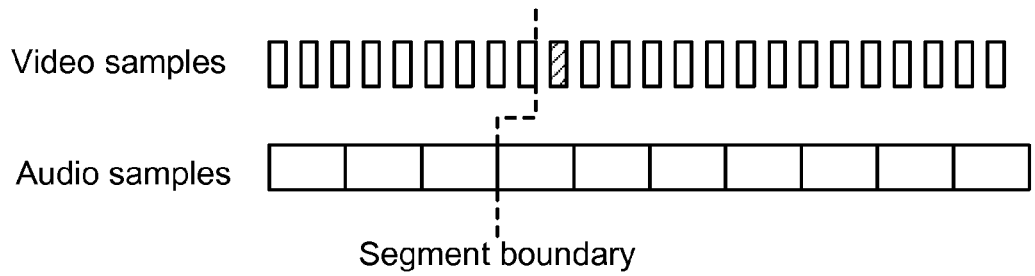
Discontinuous timing across segments
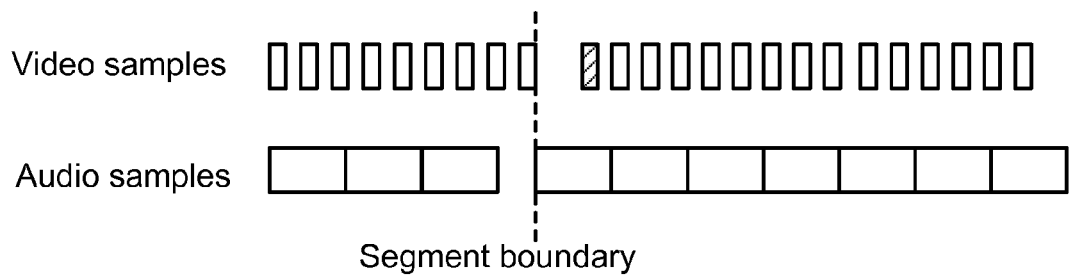
Assumptions:
- Hatched frame chosen as boundary point for independent reasons
- Audio must never begin later than video
Notes:
- In continuous case, second segment is the *same content* as the first
- In discontinuous case, second segment is *different content* from the first
FIG. 11

| Candidate request list | Priority | Ok for connection 1? | Ok for connection 2? | Ok for connection 3? |
|---|---|---|---|---|
| Request A | 0 | X | | |
| Request B | 0 | X | X | |
| Request C | 1 | X | | |
| Request D | 1 | | | X |
| Request E | 2 | | | X |
| Request F | 3 | | X | X |

FIG. 18

| Candidate request list | Priority | Ok for connection 1? | Ok for connection 2? | Ok for connection 3? |
|---|---|---|---|---|
| Request A | 5 | X | | X |
| Request G | 0 | | | |
| Request C | 4 | X | | |
| Request D | 1 | | | X |
| Request E | 2 | | | X |
| Request F | 3 | | X | X |

FIG. 19

```
<expression> ::= <literal> |
        <variable> |
        <function> |
        '(' <expression> ')' |
        <expression> <operator> <expression>

<literal> ::= <string> | <number>

<variable> ::= <token>

<function> ::= <token>'(' [ <expression> *( ',' <expression> ) ] ')'

<operator> ::= 1*<opchar>

<token> ::= <tokenchar> *(<tokenchar> | <digit> )

<string> ::= '"' *<char> '"'

<number> ::= [ '-' ] 1*<digit> [ '.' 1*<digit> ]

<digit> ::= '0-9'

<char> ::= <any ASCII char except '"'> | '/' '"'

<tokenchar> ::= 'A-Z' | 'a-z' | '_'

<opchar> ::= '-' | '+' | '=' | '/' | ';' | '%' | '*' |
```

*FIG. 21*

```c
unsigned long Hash( const char *p, unsigned long max )
{
    unsigned long hash = 0;
        while( *p != 0 )
            hash = ( hash << 5 ) ^ ( ( hash & 0xf8000000 ) >> 27 ) ^ *p++;
    return hash % max;
}
```

*FIG. 22*

Example 1

| Title: | Simple fixed domain mapping |
|---|---|
| File identifier construction rule: | printf("http://<domainname>/%s_%3d.dfx", id, seq) |
| File ID: | SPEED_PAO_S2_E1_5gsyd75 |
| Sequence #: | 22 |
| Result: | http://<domainname>/SPEED_PAO_S2_E1_5gsyd75_022.dfx |

Example 2

| Title: | Hash over 1000 domains based on file ID |
|---|---|
| File identifier construction rule: | printf("http://%3d.<domainname>/%s_%3d.dfx", hash(id, 1000), id, seq) |
| File ID: | SPEED_PAO_S2_E1_5gsyd75 |
| Sequence #: | 22 |
| Result: | http://564.<domainname>/SPEED_PAO_S2_E1_5gsyd75_022.dfx |

Example 3

| Title: | Hash over 10 domains and 1000 directories |
|---|---|
| File identifier construction rule: | printf("http://%2d.<domainname>/%3d/%s_%3d.dfx", hash(id, 10), hash(id, 1000), id, seq) |
| File ID: | SPEED_PAO_S2_E1_5gsyd75 |
| Sequence #: | 22 |
| Result: | http://4.<domainname>/564/SPEED_PAO_S2_E1_5gsyd75_022.dfx |

*FIG. 23* typical bandwidth fluctuation of 5 TCP connections

ENHANCED BLOCK-REQUEST STREAMING USING COOPERATIVE PARALLEL HTTP AND FORWARD ERROR CORRECTION

CROSS-REFERENCES TO RELATED APPLICATIONS

This application is a Continuation Application of and claims benefit under 35 U.S.C. §120 to U.S. Pat. No. 9,209,934, entitled "Enhanced Block-Request Streaming System Using Cooperative Parallel HTTP and Forward Error Correction," which is hereby incorporated by reference in its entirety for all purposes.

This application is a Nonprovisional Patent Application claiming benefit under 35 USC §119(e) of the following provisional applications, each naming Michael G. Luby, et al. and each entitled "Enhanced Block-Request Streaming System":

U.S. Provisional Patent Application No. 61/244,767, filed Sep. 22, 2009,

U.S. Provisional Patent Application No. 61/257,719, filed Nov. 3, 2009,

U.S. Provisional Patent Application No. 61/258,088, filed Nov. 4, 2009,

U.S. Provisional Patent Application No. 61/285,779, filed Dec. 11, 2009, and

U.S. Provisional Patent Application No. 61/296,725, filed Jan. 20, 2010.

This application also claims benefit under 35 USC §119 (e) of U.S. Provisional Patent Application No. 61/372,399, filed Aug. 10, 2010, naming Ying Chen, et al. and entitled "HTTP Streaming Extensions".

Each provisional application cited above is hereby incorporated by reference for all purposes. The present disclosure also incorporates by reference, as if set forth in full in this document, for all purposes, the following commonly assigned applications/patents:

U.S. Pat. No. 6,307,487 to Luby (hereinafter "Luby I");

U.S. Pat. No. 7,068,729 to Shokrollahi, et al. (hereinafter "Shokrollahi I");

U.S. Pat. No. 7,676,735, entitled "Forward Error-Correcting (FEC) Coding and Streaming" naming Luby, et al. (hereinafter "Luby II");

U.S. Pat. No. 9,178,535, entitled "Dynamic Stream Interleaving and Sub-Stream Based Delivery" naming Luby, et al. (hereinafter "Luby III");

U.S. patent application Ser. No. 12/705,202 filed Feb. 12, 2010 entitled "Block Partitioning for a Data Stream" naming Pakzad, et al. (hereinafter "Pakzad"); and U.S. patent application Ser. No. 12/859,161 filed Aug. 18, 2010 entitled "Methods and Apparatus Employing FEC Codes with Permanent Inactivation of Symbols for Encoding and Decoding Processes" naming Luby, et al. (hereinafter "Luby IV").

FIELD OF THE INVENTION

The present invention relates to improved media streaming systems and methods, more particularly to systems and methods that are adaptive to network and buffer conditions in order to optimize a presentation of streamed media and allows for efficient concurrent, or timely-distributed, delivery of streamed media data.

BACKGROUND OF THE INVENTION

Streaming media delivery may become increasingly important as it becomes more common for high quality audio and video to be delivered over packet-based networks, such as the Internet, cellular and wireless networks, power-line networks, and other types of networks. The quality with which the delivered streaming media can be presented may depend on a number of factors, including the resolution (or other attributes) of the original content, the encoding quality of the original content, the capabilities of the receiving devices to decode and present the media, timeliness and quality of the signal received at the receivers, etc. To create a perceived good streaming media experience, transport and timeliness of the signal received at receivers may be especially important. Good transport may provide fidelity of the stream received at the receiver relative to what a sender sends, while timeliness may represent how quickly a receiver can start playing out the content after an initial request for that content.

A media delivery system can be characterized as a system having media sources, media destinations, and channels (in time and/or space) separating sources and destinations. Typically, a source includes a transmitter with access to media in electronically manageable form, and a receiver with an ability to electronically control receipt of the media (or an approximation thereof) and provide it to a media consumer (e.g., a user having a display device coupled in some way to the receiver, a storage device or element, another channel, etc.).

While many variations are possible, in a common example, a media delivery system has one or more servers that have access to media content in electronic form, and one or more client systems or devices make requests for media to the servers, and the servers convey the media using a transmitter as part of the server, transmitting to a receiver at the client so that the received media can be consumed by the client in some way. In a simple example, there is one server and one client, for a given request and response, but that need not be the case.

Traditionally, media delivery systems may be characterized into either a "download" model or "streaming" model. The "download" model might be characterized by timing independence between the delivery of the media data and the playout of the media to the user or recipient device.

As an example, media is downloaded for enough in advance of when it is needed or will be used and when it is used, as much as is needed is already available at the recipient. Delivery in the download context is often performed using a file transport protocol, such as HTTP, FTP or File Delivery over Unidirectional Transport (FLUTE) and the delivery rate might be determined by an underlying flow and/or congestion control protocol, such as TCP/IP. The operation of the flow or congestion control protocol may be independent of the playout of the media to the user or destination device, which may take place concurrently with the download or at some other time.

The "streaming" mode might be characterized by a tight coupling between the timing of the delivery of the media data and the playout of the media to the user or recipient device. Delivery in this context is often performed using a streaming protocol, such as the Real Time Streaming Protocol (RTSP) for control and the Real Time Transport Protocol (RTP) for the media data. The delivery rate might be determined by a streaming server, often matching the playout rate of the data.

Some disadvantages of the "download" model may be that, due to the timing independence of the delivery and playout, either media data may not be available when it is needed for playout (for example due to the available bandwidth being less than the media data rate), causing playout to stop momentarily ("stalling"), which results in a poor user experience, or media data may be required to be downloaded very far in advance of playout (for example due to the available bandwidth being greater than the media data rate), consuming storage resources on the receiving device, which may be scarce, and consuming valuable network resources for the delivery which may be wasted if the content is not, eventually, played out or otherwise used.

An advantage of the "download" model may be that the technology needed to perform such downloads, for example HTTP, is very mature, widely deployed and applicable across a wide range of applications. Download servers and solutions for massive scalability of such file downloads (for example, HTTP Web Servers and Content Delivery Networks) may be readily available, making deployment of services based on this technology simple and low in cost.

Some disadvantages of the "streaming" model may be that generally the rate of delivery of media data is not adapted to the available bandwidth on the connection from server to client and that specialized streaming servers or more complex network architecture providing bandwidth and delay guarantees are required. Although streaming systems exist which support variation of the delivery data rate according to available bandwidth (for example Adobe Flash Adaptive Streaming), these are generally not as efficient as download transport flow control protocols such as TCP at utilizing all the available bandwidth.

Recently, new media delivery systems based on a combination of the "streaming" and "download" models have been developed and deployed. An example of such a model is referred to herein as a "block-request streaming" model, wherein a media client requests blocks of media data from serving infrastructure using a download protocol, such as HTTP. A concern in such systems may be the ability to start playing out a stream, for example decoding and rendering received audio and video streams using a personal computer and displaying the video on a computer screen and playing the audio through built in speakers, or as another example decoding and rendering received audio and video streams using a set top box and displaying the video on a television display device and playing the audio through a stereo system.

Other concerns, such as being able to decode the source blocks fast enough to keep up with the source streaming rate, to minimize the decoding latency and to reduce the use of available central processing unit (CPU) resources are issues. Another concern is to provide a robust and scalable streaming delivery solution that allows components of the system to fail without adversely affecting the quality of the streams delivered to receivers. Other problems might occur based on rapidly changing information about a presentation, as it is being distributed. Thus, it is desirable to have improved processes and apparatus.

BRIEF SUMMARY OF THE INVENTION

A block-request streaming system provides for improvements in the user experience and bandwidth efficiency of such systems, typically using an ingestion system that generates data in a form to be served by a conventional file server (HTTP, FTP, or the like), wherein the ingestion system intakes content and prepares it as files or data elements to be served by the file server, which might or might not include a cache. A client device can be adapted to take advantage of the ingestion process as well as including improvements that make for a better presentation independent of the ingestion process. In the block-request streaming system, the an ingestion system generates data according to erasure codes and the client device, through various selection and timing of requests for media data and redundant data, can efficiently decode media to provide for presentations.

The following detailed description together with the accompanying drawings will provide a better understanding of the nature and advantages of the present invention.

BRIEF DESCRIPTION OF THE DRAWINGS

FIG. 8(a) illustrates variable block sizing with aligned seek points over a plurality of versions of a media stream.

FIG. 8(b) illustrates variable block sizing with non-aligned seek points over a plurality of versions of a media stream.

FIG. 11 illustrates continuous and discontinuous timing across segments.

FIG. 18 illustrates an example of a candidate set of requests, their priorities, and which connections that they can be issued on, at a certain time.

FIG. 19 illustrates an example of a candidate set of requests, their priorities, and which connections that they can be issued on, that has evolved from one time to another.

FIG. 21 illustrates a syntax definition for a suitable expression language.

FIG. 22 illustrates an example of a suitable hash function.

FIG. 23 illustrates examples of file identifier construction rules.

Figure 1:
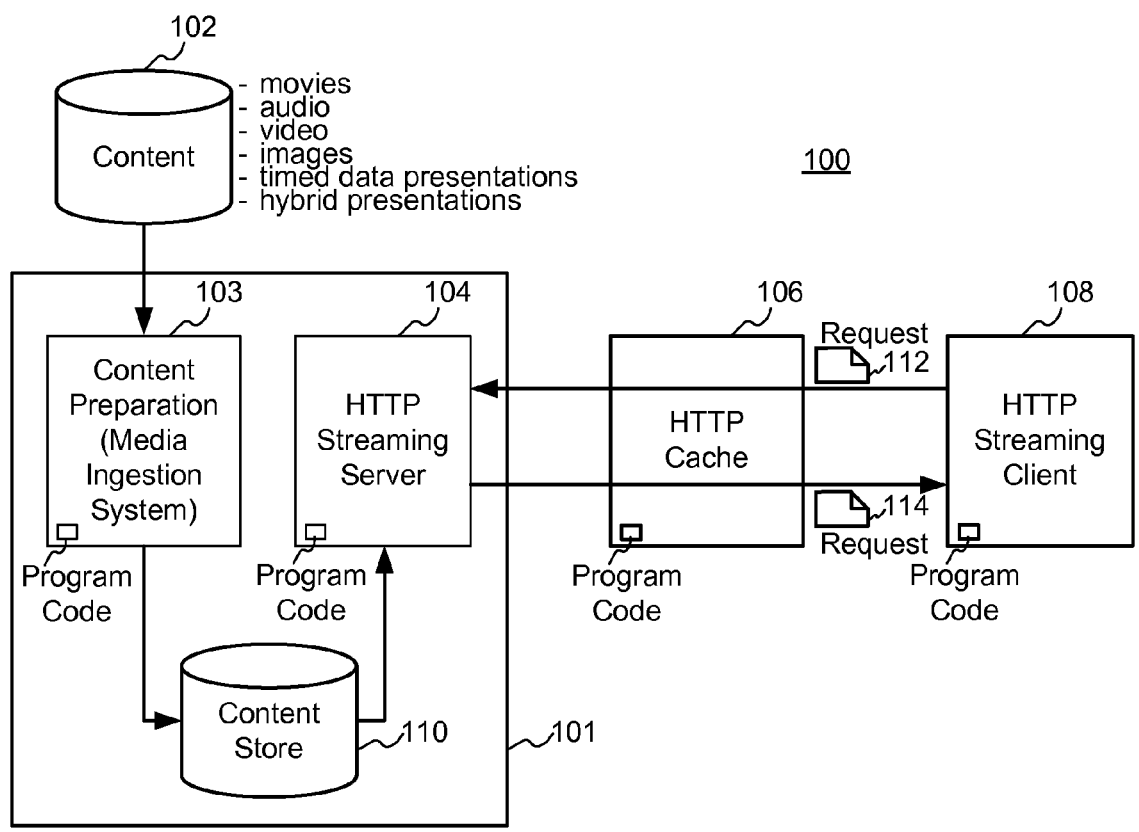
FIG. 1 depicts elements of a block-request streaming system according to embodiments of the present invention.

In the figures, like items are referenced with like numbers and sub-indices are provided in parentheses to indicate multiple instances of like or identical items. Unless otherwise indicated, the final sub-index (e.g., "N" or "M") is not intended to be limiting to any particular value and the number of instances of one item can differ from the number of instances of another item even when the same number are illustrated and the sub-index is reused.

DETAILED DESCRIPTION OF THE INVENTION

As described herein, a goal of a streaming system is to move media from its storage location (or the location where it is being generated) to a location where it is being consumed, i.e., presented to a user or otherwise "used up" by a human or electronic consumer. Ideally, the streaming system can provide uninterrupted playback (or more generally, uninterrupted "consumption") at a receiving end and can begin playing a stream or a collection of streams shortly after a user has requested the stream or streams. For efficiency reasons, it is also desirable that each stream be halted once the user indicates that the stream is no longer needed, such as when the user is switching from one stream to another stream or it obeys the presentation of a stream, e.g., the "subtitle" stream. If the media component, such as the video, is continued to be presented, but a different stream is selected to present this media component, it is often preferred to occupy limited bandwidth with the new stream and stop the old stream.

A block-request streaming system according to embodiments described herein provides many benefits. It should be understood that a viable system need not include all of the features described herein, as some applications might provide a suitably satisfying experience with less than all of the features described herein.

HTTP Streaming

HTTP streaming is a specific type of streaming. With HTTP streaming, the sources might be standard web servers and content delivery networks (CDNs) and might use standard HTTP. This technique may involve stream segmentation and the use of multiple streams, all within the context of standardized HTTP requests. The media, such as video, may by encoded at multiple bitrates to form different versions, or representations. The terms "version" and "representation" are used synonymously in this document. Each version or representation may be broken into smaller pieces, perhaps on the order of a few seconds each, to form segments. Each segment may then be stored on a web server or CDN as a separate file.

On the client side, requests may then be made, using HTTP, for individual segments that are seamlessly spliced together by the client. The client may switch to different data rates based on available bandwidth. The client may also request multiple representations, each presenting a different media component, and may present the media in these representations jointly and synchronously. Triggers for switching may include buffer occupancy and network measurements, for example. When operating in the steady state, the client may pace requests to the server to maintain a target buffer occupancy.

Advantages of HTTP streaming may include bit-rate adaptation, fast startup and seek, and minimal unnecessary delivery. These advantages come from controlling the delivery to be only a short time ahead of the playout, making maximum use of available bandwidth (through variable bit rate media), and optimizing stream segmentation and intelligent client procedures.

A media presentation description may be provided to an HTTP streaming client such that the client can use a collection of files (for example in formats specified by 3GPP, herein called a 3gp segments) to provide a streaming service to the user. A media presentation description, and possibly updates of this media presentation description, describe a media presentation that is a structured collection of segments, each containing media components such that the client can present the included media in a synchronized manner and can provide advanced features, such as seeking, switching bitrates and joint presentation of media components in different representations. The client may use the media presentation description information in different ways for the provisioning of the service. In particular, from the media presentation description, the HTTP streaming client may determine which segments in the collection can be accessed so that that the data is useful to the client capability and the user within the streaming service.

In some embodiments, the media presentation description may be static, although segments might be created dynamically. The media presentation description may be as compact as possible to minimize access and download time for the service. Other dedicated server connectivity may be minimized, for example regular or frequent timing synchronization between client and server.

The media presentation may be constructed to permit access by terminals with different capabilities, such as access to different access network types, different current network conditions, display sizes, access bitrates and codec support. The client may then extract the appropriate information to provide the streaming service to the user.

The media presentation description may also permit deployment flexibility and compactness according to the requirements.

In a simplest case, each Alternative Representation may be stored in a single 3GP file, i.e., a file conforming as defined in 3GPP TS26.244, or any other file that conforms to the ISO base media file format as defined in ISO/IEC 14496-12 or derived specifications (such as the 3GP file format described in 3GPP Technical Specification 26.244). In the remainder of this document, when referring to a 3GP file, it should be understood that ISO/IEC 14496-12 and derived specifications can map all described features to the more general ISO base media file format as defined in ISO/IEC 14496-12 or any derived specifications. The client may then request an initial portion of the file to learn the media metadata (which typically is stored in the Movie header box, also referred to as "moov" box) together with movie fragment times and byte offsets. The client may then issue HTTP partial get requests to obtain movie fragments as required.

In some embodiments it may be desirable to split each representation into several segments, where the segments. In case that the segment format is based on the 3GP file format, then segments contain non-overlapping time slices of the movie fragments, called "time-wise splitting". Each of these segments may contain multiple movie fragments and each may be a valid 3GP file in its own right. In another embodiment, the representation is split into an initial segment containing the metadata (typically the Movie Header "moov" box) and a set of media segments, each containing media data and the concatenation of the initial segment and any media segment forms a valid 3GP file as well as the concatenation of the initial segment and all media segments of one representation forms a valid 3GP file. The entire presentation may be formed by playing out each segment in turn, mapping the local timestamps within the file to the global presentation time according to the start time of each representation.

It should be noted that throughout this description references to a "segment" should be understood to include any data object which is fully or partially constructed or read from a storage medium or otherwise obtained as a result of a file download protocol request, including for example an HTTP request. For example, in the case of HTTP, the data objects may be stored in actual files residing on a disk or other storage medium connected to or forming part of an HTTP server, or the data objects may be constructed by a CGI script, or other dynamically executed program, which is executed in response to the HTTP request. The terms "file" and "segment" are used synonymously in this document unless otherwise specified. In the case of HTTP, the segment may be considered as the entity body of an HTTP request response.

The terms "presentation" and "content item" are used synonymously in this document. In many examples, the presentation is an audio, video or other media presentation that has a defined "playout" time, but other variations are possible.

The terms "block" and "fragment" are used synonymously in this document unless otherwise specified and generally refer to the smallest aggregation of data that is indexed. Based on the available indexing, a client can request different portions of a fragment in different HTTP requests, or can request one or more consecutive fragments or portions of fragments in one HTTP request. In the case where ISO base media file format based segments or 3GP file format based segments are used, a fragment typically refers to a movie fragment defined as the combination of a movie fragment header ('moof') box and a media data ('mdat') box.

Herein, a network carrying data is assumed to be packet-based in order to simplify the descriptions herein, with the recognition that, after reading this disclosure, one skilled in the art can apply embodiments of the present invention described herein to other types of transmission networks, such as continuous bit-stream networks.

Herein, FEC codes are assumed to provide protection against long and variable delivery times of data, in order to simplify the descriptions herein, with the recognition that, after reading this disclosure, one skilled in the art can apply embodiments of the present invention to other types of data transmission issues, such a bit-flip corruption of data. For example, without FEC, if the last portion of a requested fragment arrives much later or has high variance in its arrival time than previous portions of the fragment then the content zapping time can be large and variable, whereas using FEC and parallel requests, only the majority of the data requested for a fragment need arrive before it can be recovered, thereby reducing content zapping time and the variability in content zapping time. In this description, it might be assumed that the data to be encoded (i.e., source data) has been broken into equal length "symbols", which may be of any length (down to a single bit), but symbols could be of different lengths for different parts of the data, e.g., different symbol sizes might be used for different blocks of data.

In this description, in order to simplify the descriptions herein, it is assumed that the FEC is applied to a "block" or "fragment" of data at a time, i.e., a "block" is a "source block" for FEC encoding and decoding purposes. A client device can use the segment indexing described herein to help to determine the source block structure of a segment. One skilled in the art can apply embodiments of the present invention to other types of source block structures, e.g., a source block may be a portion of a fragment, or encompass one or more fragments or portions of fragments.

The FEC codes considered for use with block-request streaming are typically systematic FEC codes, i.e., the source symbols of the source block may be included as part of the encoding of the source block and thus the source symbols are transmitted. As one skilled in the art will recognize, the embodiments described herein apply equally well to FEC codes that are not systematic. A systematic FEC encoder generates, from a source block of source symbols, some number of repair symbols and the combination of at least some of the source and repair symbols are the encoded symbols that are sent over the channel representing the source block. Some FEC codes may be useful for efficiently generating as many repair symbols as needed, such as "information additive codes" or "fountain codes" and examples of these codes include "chain reaction codes" and "multi-stage chain reaction codes". Other FEC codes such, as Reed-Solomon codes may practically only generate a limited number of repair symbols for each source block.

It is assumed in many of these examples that a client is coupled to a media server or a plurality of media servers and the client requests streaming media over a channel or a plurality of channels from the media server or the plurality of media servers. However, more involved arrangements are also possible.

Examples of Benefits

With block-request streaming, the media client maintains a coupling between the timing of these block requests and the timing of the media playout to the user. This model may retain the advantages of the "download" model described above, while avoiding some of the disadvantages that stem from the usual de-coupling of media playout from data delivery. The block-request streaming model makes use of the rate and congestion control mechanisms available in transport protocols, such as TCP, to ensure that the maximum available bandwidth is used for media data. Additionally, the division of the media presentation into blocks allows each block of encoded media data to be selected from a set of multiple available encodings.

This selection may be based on any number of criteria, including matching of the media data rate to the available bandwidth, even when the available bandwidth is changing over time, matching of the media resolution or decoding complexity to client capabilities or configuration, or matching to user preferences, such as languages. The selection may also include the download and presentation of auxiliary components, such as accessibility components, closed captioning, sub-titles, sign language video, etc. Examples of existing systems using the block-request streaming model include Move Networks™, Microsoft Smooth Streaming and the Apple iPhone™ Streaming Protocol.

Commonly, each block of media data may be stored on a server as an individual file and then a protocol, such as HTTP, is used, in conjunction with HTTP server software executed on the server, to request the file as a unit. Typically, the client is provided with metadata files, which may for example be in Extensible Markup Language (XML) format or in playlist text format or in binary format, which describe features of the media presentation, such as the available encodings (for example, required bandwidth, resolutions, encoding parameters, media type, language), typically referred to as "representations" in this document, and the manner in which the encodings have been divided into blocks. For example, the metadata may include a Uniform Resource Locator (URL) for each block. The URLs itself may provide a scheme such as being prepended with the string "http://" to indicate that protocol that is to be used to access the documented resource is HTTP. Another example is "ftp://" to indicate that the protocol that is to be used is FTP.

In other systems, for example, the media blocks may be constructed "on-the-fly" by the server in response to a request from the client that indicates the portion of the media presentation, in time, that is requested. For example, in case of HTTP with scheme "http://", the execution of the request of this URL provides a request response that contains some specific data in the entity body of this request response. The implementation in the network on how to generate this request response may be quite different, depending on the implementation of the server servicing such requests.

Typically, each block may be independently decodable. For example in the case of video media, each block may begin with a "seek point." In some coding schemes, a seek point is referred to as "Random Access Points" or "RAPs", although not all RAPs may be designated as a seek point. Similarly, in other coding schemes, a seek point starts at a "Independent Data Refresh" frame, or "IDR", in the case of H.264 video encoding, although not all IDRs may be designated as a seek point. A seek point is a position in video (or other) media where a decoder can start decoding without requiring any data about prior frames or data or samples, as might be the case where a frame or sample that is being decoded was encoded not in a stand-alone fashion, but as, for example, the difference between the current frame and the prior frame.

A concern in such systems may be the ability to start playing out a stream, for example decoding and rendering received audio and video streams using a personal computer and displaying the video on a computer screen and playing the audio through built in speakers, or as another example decoding and rendering received audio and video streams using a set top box and displaying the video on a television display device and playing the audio through a stereo system. A primary concern may be to minimize the delay between when a user decides to watch a new content delivered as a stream and takes an action that expresses that decision, e.g., the user clicks on a link within a browser window or on the play button of a remote control device, and when the content starts being displayed on the user's screen, hereinafter called the "content zapping time". Each of these concerns can be addressed by elements of the enhanced system described herein.

An example of content zapping is when a user is watching a first content delivered via a first stream and then the user decides to watch a second content delivered via a second stream and initiates an action to start watching the second content. The second stream may be sent from the same set or a different set of servers as the first stream. Another example of content zapping is when a user is visiting a website and decides to start watching a first content delivered via a first stream by clicking on a link within the browser window. In a similar manner, a user may decide to start playing the content not from the beginning, but from some time within the stream. The user indicates to their client device to seek to a time position and the user might expect that the selected time is rendered instantaneously. Minimizing content zapping time is important for video watching to allow users a high quality fast content surfing experience when searching and sampling a wide range of available contents.

Recently, it has become common practice to consider using Forward Error Correction (FEC) codes for protection of streaming media during transmission. When sent over a packet network, examples of which include the Internet and wireless networks such as those standardized by groups such as 3GPP, 3GPP2 and DVB, the source stream is placed into packets as it is generated or made available, and thus the packets may be used to carry the source or content stream in the order it is generated or made available to receivers.

In a typical application of FEC codes to these types of scenarios, an encoder may use FEC code in the creation of repair packets, which are then sent in addition to the original source packets containing the source stream. The repair packets have a property that, when source packet loss occurs, received repair packets may be used to recover the data contained in the lost source packets. Repair packets can be used to recover content of lost source packets that are lost entirely, but might also be used to recover from partial packet loss occurs, either entirely received repair packets or even partially received repair packets. Thus, wholly or partially received repair packets can be used to recover wholly or partially lost source packets.

In yet other examples, other types of corruption can occur to the sent data, e.g., values of bits may be flipped, and thus repair packets may be used to correct such corruption and provide as accurate as possible recovery of the source packets. In other examples, the source stream is not necessarily sent in discrete packets, but instead may be sent for example as a continuous bit stream.

There are many examples of FEC codes that can be used to provide protection of a source stream. Reed-Solomon codes are well known codes for error and erasure correction in communication systems. For erasure correction over, for example, packet data networks, a well-known efficient implementation of Reed-Solomon codes uses Cauchy or Vandermonde matrices as described in L. Rizzo, "Effective Erasure Codes for Reliable Computer Communication Protocols", Computer Communication Review, 27(2):24-36 (April 1997) (hereinafter "Rizzo") and Bloemer, et al., "An XOR-Based Erasure-Resilient Coding Scheme", Technical Report TR-95-48, International Computer Science Institute, Berkeley, Calif. (1995) (hereinafter "XOR-Reed-Solomon") or elsewhere.

Other examples of FEC codes include LDPC codes, chain reaction codes such as those described in Luby I and multi-stage chain reaction codes such in Shokrollahi I.

Examples of the FEC decoding process for variants of Reed-Solomon codes are described in Rizzo and XOR-Reed-Solomon. In those examples, decoding may be applied after sufficient source and repair data packets have been received. The decoding process may be computationally intensive and, depending on the CPU resources available, this may take considerable time to complete, relative to the length of time spanned by the media in the block. The receiver may take into account this length of time required for decoding when calculating the delay required between the start of reception of the media stream and play-out of the media. This delay due to decoding is perceived by the user as a delay between their request for a particular media stream and the start of playback. It is thus desirable to minimize this delay.

In many applications, packets may be further subdivided into symbols on which the FEC process is applied. A packet can contain one or more symbol (or less than one symbol, but usually symbols are not split across groups of packets unless the error-conditions among groups of packets is known to be highly correlated). A symbol can have any size, but often the size of a symbol is at most equal to the size of the packet. Source symbols are those symbols that encode the data that is to be transmitted. Repair symbols are symbols generated from source symbols, directly or indirectly that are in addition to the source symbols (i.e., the data to be transmitted can be entirely recovered if all of the source symbols are available and none of the repair symbols are available.

Some FEC codes may be block-based, in that encoding operations depend on the symbol(s) that are in a block and can be independent of the symbols not in that block. With block-based encoding, an FEC encoder can generate repair symbols for a block from the source symbols in that block, then move on to the next block and not need to refer to source symbols other than those for the current block being encoded. In a transmission, a source block comprising source symbols may be represented by an encoded block comprising encoded symbols (which might be some source symbols, some repair symbols, or both). With the presence of repair symbols, not all of the source symbols are required in every encoded block.

For some FEC codes, notably Reed-Solomon codes, the encoding and decoding time may grow impractical as the number of encoded symbols per source block grows. Thus, in practice, there is often a practical upper bound (255 is an approximate practical limit for some applications) on the total number of encoded symbols that can be generated per source block, especially in a typical case where the Reed-Solomon encoding or decoding process is performed by custom hardware, e.g., the MPE-FEC processes that use Reed-Solomon codes included as part of the DVB-H standard for protecting streams against packet loss are implemented in specialized hardware within a cell phone that is limited to 255 Reed-Solomon total encoded symbols per source block. Since symbols are often required to be placed into separate packet payloads, this places a practical upper bound on the maximum length of the source block being encoded. For example, if a packet payload is limited to 1024 bytes or less and each packet carries one encoded symbol, then an encoded source block can be at most 255 kilobytes, and this is also, of course, an upper bound on the size of the source block itself.

Other concerns, such as being able to decode the source blocks fast enough to keep up with the source streaming rate, to minimize the decoding latency introduced by FEC decoding, and to only use a small fraction of the available CPU on the receiving device at any point in time during FEC decoding are addressed by elements described herein, as well as dealing with The need to provide a robust and scalable streaming delivery solution that allows components of the system to fail without adversely affecting the quality of the streams delivered to receivers.

A block request streaming system needs to support changes to the structure or metadata of the presentation, for example changes to the number of available media encodings or changes to the parameters of the media encodings such as bit rate, resolution, aspect ratio, audio or video codecs or codec parameters of changes in other metadata such as URLs associated with the content files. Such changes may be required for a number of reasons including editing together content from different sources such as advertising or different segments of a larger presentation, modification of URLs or other parameters which become necessary as a result of changes in the serving infrastructure for example due to configuration changes, equipment failures or recovery from equipment failures or other reasons.

Methods exist in which a presentation may be controlled by a continuously updated playlist file. Since this file is continuously updated, then at least some of the changes described above can be made within these updates. A disadvantage of a conventional method is that client devices must continually retrieve, also referred to as "polling", the playlist file, placing load on the serving infrastructure and that this file may not be cached for longer than the update interval, making the task for the serving infrastructure much more difficult. This is addressed by elements herein so that updates of the kind described above are provided without the need for continuous polling by clients for the metadata file.

Another problem, especially in the live services, typically known from broadcast distribution, is the lack of ability for the user to view content that has been broadcast earlier than the time when the user joined the program. Typically, local personal recording consumes unnecessary local storage or is not possible as the client was not tuned to the program or is prohibited by content protection rules. Network recording and time-shift viewing is preferred, but requires individual connections of the user to the server and a separate delivery protocol and infrastructure than the live services, resulting in duplicated infrastructure and significant server costs. This is also addressed by elements described herein.

System Overview

One embodiment of the invention is described with reference to FIG. 1, which shows a simplified diagram of a block-request streaming system embodying the invention.

In FIG. 1, a block-streaming system 100 is illustrated, comprising block serving infrastructure ("BSI") 101 in turn comprising an ingestion system 103 for ingesting content 102, preparing that content and packaging it for service by an HTTP streaming server 104 by storing it into a content store 110 that is accessible to both ingestion system 103 and HTTP streaming server 104. As shown, system 100 might also include an HTTP cache 106. In operation, a client 108, such as an HTTP streaming client, sends requests 112 to HTTP streaming server 104 and receives responses 114 from HTTP streaming server 104 or HTTP cache 106. In each case, elements shown in FIG. 1 might be implemented, at least in part, in software, therein comprising program code that is executed on a processor or other electronics.

The content might comprise movies, audio, 2D planar video, 3D video, other types of video, images, timed text, timed metadata or the like. Some content might involve data that is to be presented or consumed in a timed manner, such as data for presenting auxiliary information (station identification, advertising, stock quotes, Flash™ sequences, etc.) along with other media being played out. Other hybrid presentations might also be used that combine other media and/or go beyond merely audio and video.

Figure 2:
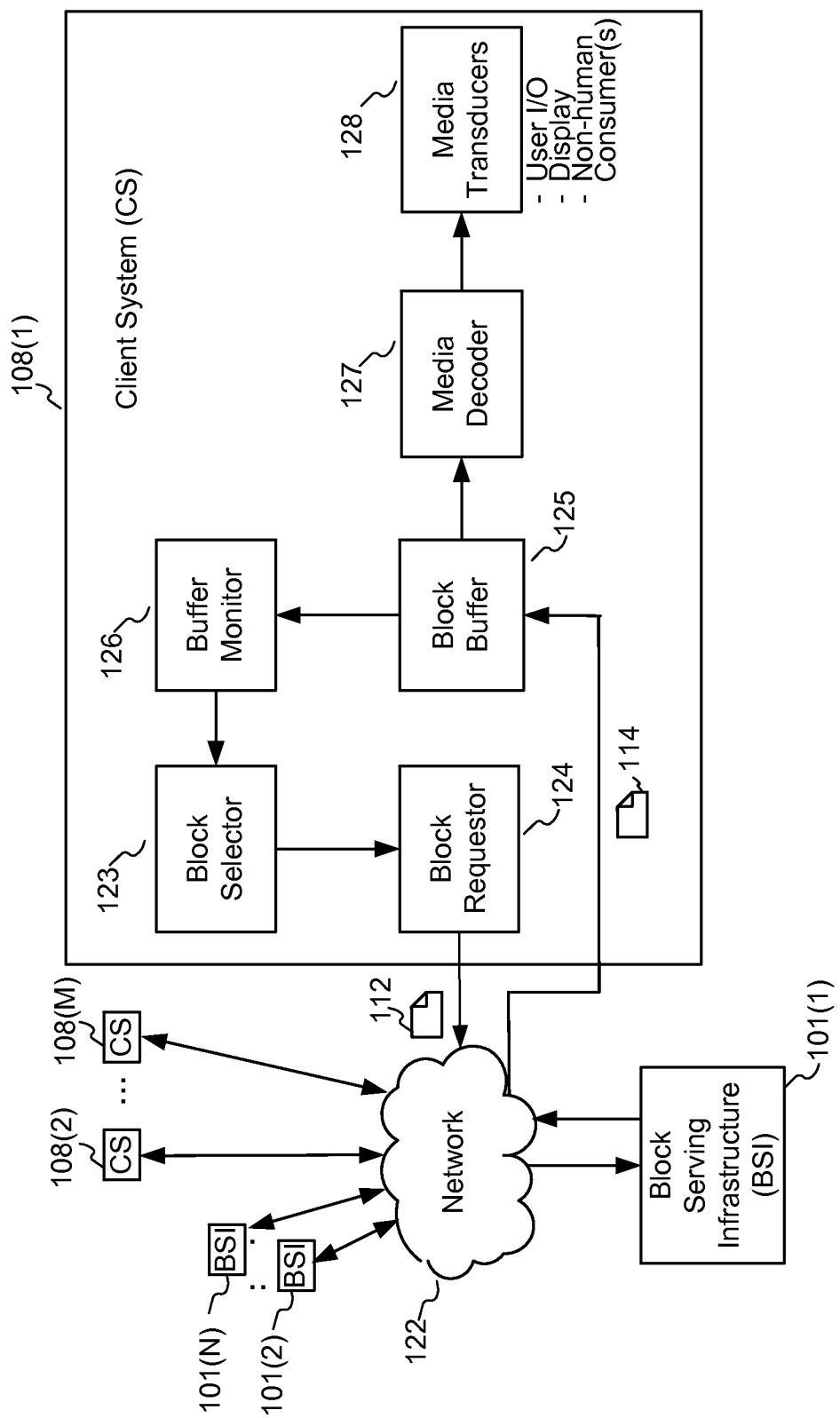
FIG. 2 illustrates the block-request streaming system of FIG. 1, showing greater detail in the elements of a client system that is coupled to a block serving infrastructure ("BSI") to receive data that is processed by a content ingestion system.

As illustrated in FIG. 2, media blocks may be stored within a block serving infrastructure 101(1), which could be, for example, an HTTP server, a Content Delivery Network device, an HTTP proxy, FTP proxy or server, or some other media server or system. Block serving infrastructure 101(1) is connected to a network 122, which could be, for example, an Internet Protocol ("IP") network such as the Internet. A block-request streaming system client is shown having six functional components, namely a block selector 123, provided with the metadata described above and performing a function of selecting blocks or partial blocks to be requested from among the plurality of available blocks indicated by the metadata, a block requestor 124, that receives request instructions from block selector 123 and performs the operations necessary to send a request for the specified block, portions of a block, or multiple blocks, to block serving infrastructure 101(1) over network 122 and to receive the data comprising the block in return, as well as a block buffer 125, a buffer monitor 126, a media decoder 127 and one or more media transducers 128 that facilitate media consumption.

Block data received by block requestor 124 is passed for temporary storage to block buffer 125, which stores the media data. Alternatively, the received block data can be stored directly into block buffer 125 as illustrated in FIG. 1. Media decoder 127 is provided with media data by block buffer 125 and performs such transformations on this data as are necessary to provide suitable input to media transducers 128, which render the media in a form suitable for user or other consumption. Examples of media transducers include visual display devices such as those found in mobile phones, computer systems or televisions, and might also include audio rendering devices, such as speakers or headphones.

An example of a media decoder would be a function that transforms data in the format described in the H.264 video coding standard into analogue or digital representations of video frames, such as a YUV-format pixel map with associated presentation timestamps for each frame or sample.

Buffer monitor 126 receives information concerning the contents of block buffer 125 and, based on this information and possibly other information, provides input to block selector 123, which is used to determine the selection of blocks to request, as is described herein.

In the terminology used herein, each block has a "playout time" or "duration" that represents the amount of time it would take for the receiver to play the media included in that block at normal speed. In some cases, the playout of the media within a block may depend on having already received data from previous blocks. In rare cases, the playout of some of the media in a block may depend on a subsequent block, in which case the playout time for the block is defined with respect to the media that can be played out within the block without reference to the subsequent block, and the playout time for the subsequent block is increased by the playout time of the media within this block that can only playout after having received the subsequent block. Since including media in a block that depends on subsequent blocks is a rare case, in the remainder of this disclosure we assume that media in one block does not depend on subsequent blocks, but note that those skilled in the art will recognize that this variant can be easily added to the embodiments described below.

The receiver may have controls such as "pause", "fast forward", "reverse", etc. that may result in the block being consumed by playout at a different rate, but if the receiver can obtain and decode each consecutive sequence of blocks in an aggregate time equal to or less than their aggregate playout time excluding the last block in the sequence then the receiver can present the media to the user without stalling. In some descriptions herein, a particular position in the media stream is referred to as a particular "time" in the media, corresponding to the time that would have elapsed between the beginning of the media playout and the time when the particular position in the video stream is reached. The time or position in a media stream is a conventional concept. For example, where the video stream comprises 24 frames per second, the first frame could be said to have a position or time of t=0.0 seconds and the 241st frame could be said to have a position or time of t=10.0 seconds. Naturally, in a frame-based video stream, position or time need not be continuous, as each of the bits in the stream from the first bit of the 241st frame to just before the first bit of the 242nd frame might all have the same time value.

Adopting the above terminology, a block-request streaming system (BRSS) comprises one or more clients that make requests to one or more content servers (for example, HTTP servers, FTP Servers, etc.). An ingestion system comprises one or more ingestion processors, wherein an ingestion processor receives content (in real-time or not), processes the content for use by the BRSS and stores it into storage accessible to the content servers, possibly also along with metadata generated by the ingestion processor.

The BRSS also might contain content caches that coordinate with the content servers. The content servers and content caches might be conventional HTTP servers and HTTP caches that receive requests for files or segments in the form of HTTP requests that include a URL, and may also include a byte range, in order to request less than all of the file or segment indicated by the URL. The clients might include a conventional HTTP client that makes requests of HTTP servers and handles the responses to those requests, where the HTTP client is driven by a novel client system that formulates requests, passes them to the HTTP client, gets responses from the HTTP client and processes those (or storing, transforming, etc.) in order to provide them to a presentation player for playout by a client device. Typically, the client system does not know in advance what media is going to be needed (as the needs might depend on user input, changes in user input, etc.), so it is said to be a "streaming" system in that the media is "consumed" as soon as it is received, or shortly thereafter. As a result, response delays and bandwidth constraints can cause delays in a presentation, such as causing a pause in a presentation as the stream catches up to where the user is in consuming the presentation.

In order to provide for a presentation that is perceived to be of good quality, a number of details can be implemented in the BRSS, either at the client end, at the ingestion end, or both. In some cases, the details that are implemented are done in consideration of, and to deal with, the client-server interface at the network. In some embodiments, both the client system and the ingestion system are aware of the enhancement, whereas in other embodiments, only one side is aware of the enhancement. In such cases, the entire system benefits from the enhancement even though one side is not aware of it, while in others, the benefit only accrues if both sides are aware of it but when one side is not aware, it still operates without failing.

Figure 3:
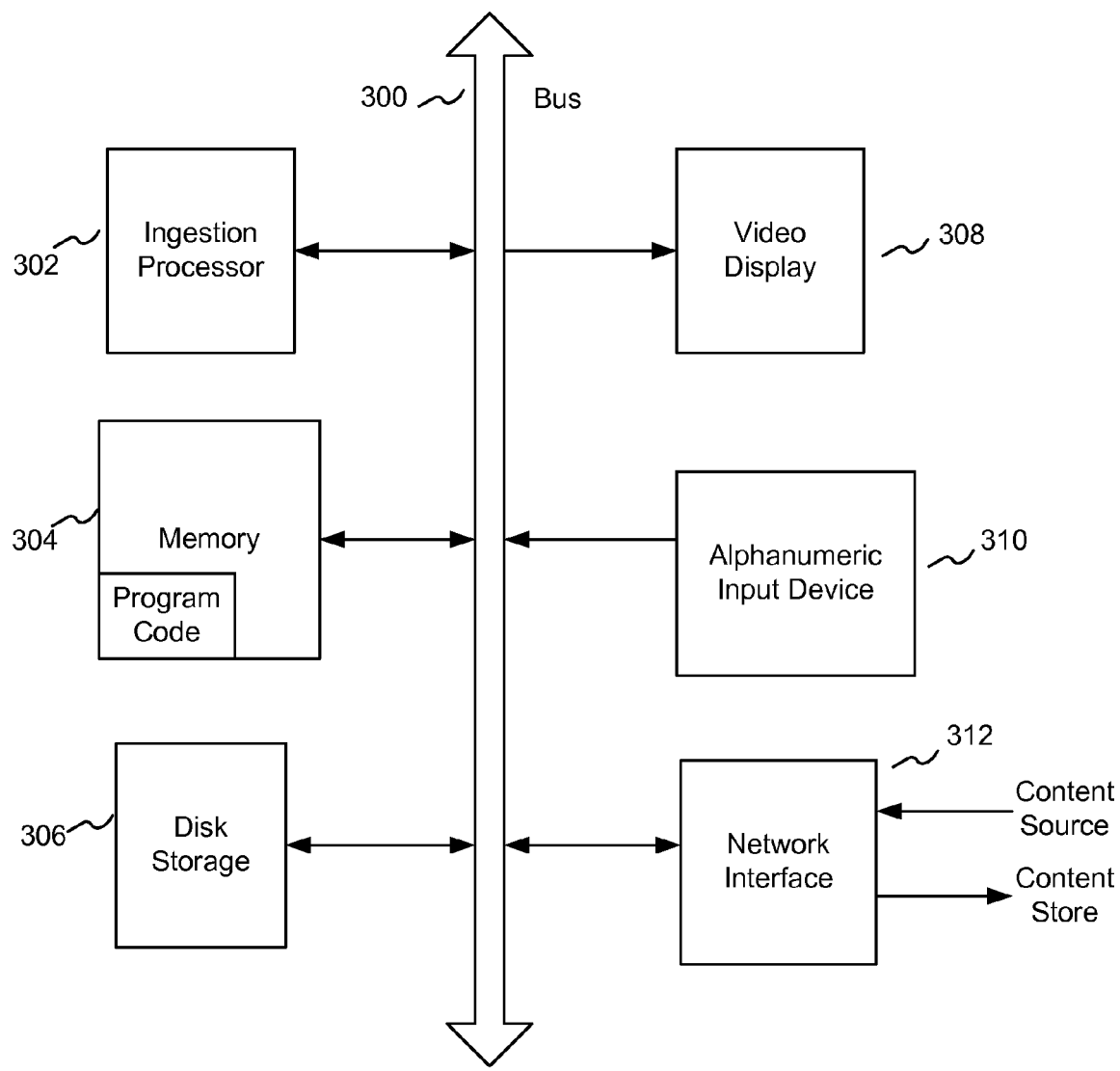
FIG. 3 illustrates a hardware/software implementation of an ingestion system.

As illustrated in FIG. 3, the ingestion system may be implemented as a combination of hardware and software components, according to various embodiments. The ingestion system may comprise a set of instructions that can be executed to cause the system to perform any one or more of the methodologies discussed herein. The system may be realized as a specific machine in the form of a computer. The system may be a server computer, a personal computer (PC), or any system capable of executing a set of instructions (sequential or otherwise) that specify actions to be taken by that system. Further, while only a single system is illustrated, the term "system" shall also be taken to include any collection of systems that individually or jointly execute a set (or multiple sets) of instructions to perform any one or more of the methodologies discussed herein.

The ingestion system may include the ingestion processor 302 (e.g., a central processing unit (CPU)), a memory 304 which may store program code during execution, and disk storage unit 306, all of which communicate with each other via a bus 300. The system may further include a video display unit 308 (e.g., a liquid crystal display (LCD) or cathode ray tube (CRT)). The system also may include an alphanumeric input device 310 (e.g., a keyboard), and a network interface device 312 for receiving content source and delivering content store.

The disk storage unit 306 may include a machine-readable medium on which may be stored one or more sets of instructions (e.g., software) embodying any one or more of the methodologies or functions described herein. The instructions may also reside, completely or at least partially, within the memory 304 and/or within the ingestion processor 302 during execution thereof by the system, with the memory 304 and the ingestion processor 302 also constituting machine-readable media.

Figure 4:
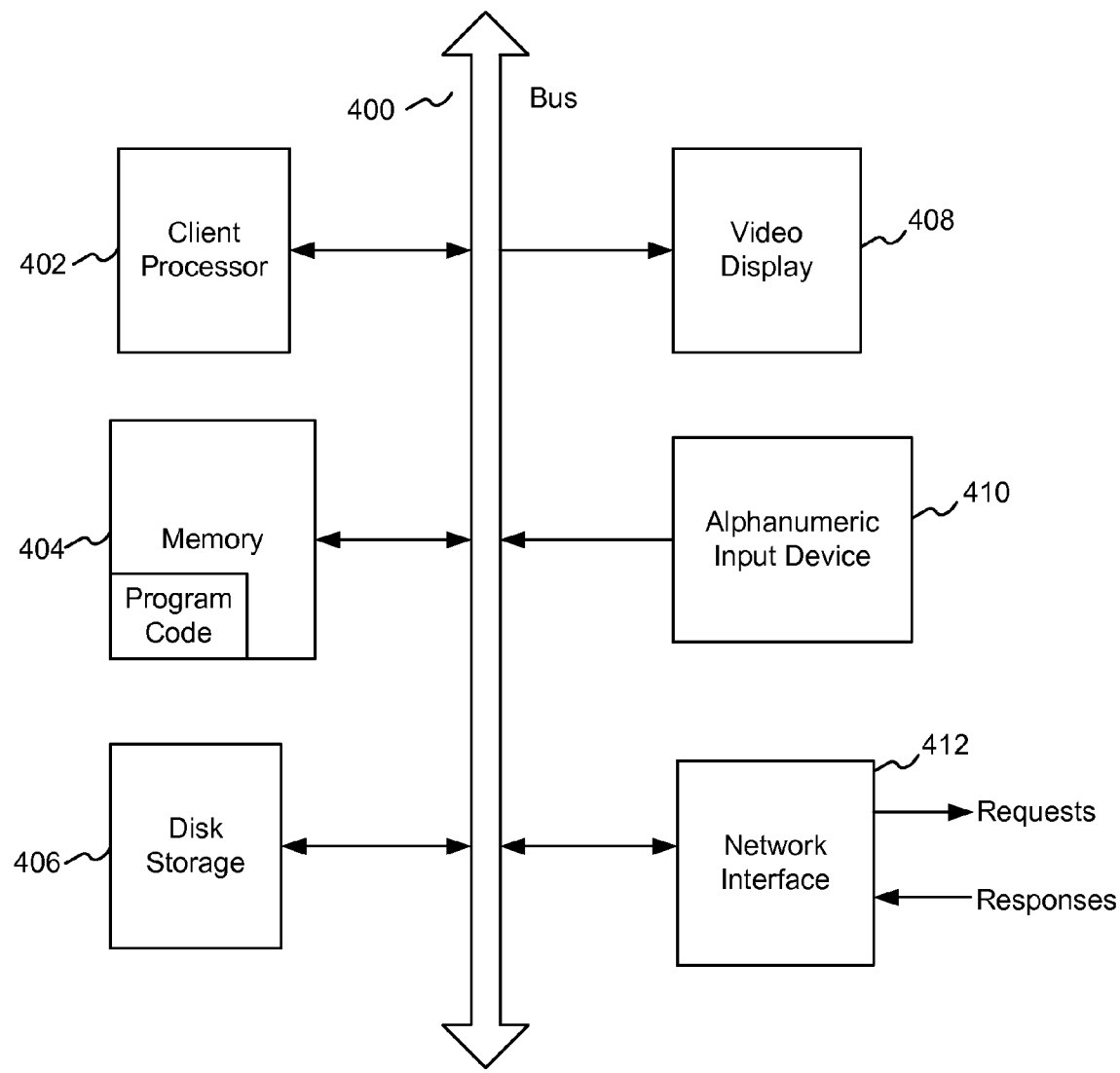
FIG. 4 illustrates a hardware/software implementation of a client system.

As illustrated in FIG. 4, the client system may be implemented as a combination of hardware and software components, according to various embodiments. The client system may comprise a set of instructions that can be executed to cause the system to perform any one or more of the methodologies discussed herein. The system may be realized as a specific machine in the form of a computer. The system may be a server computer, a personal computer (PC), or any system capable of executing a set of instructions (sequential or otherwise) that specify actions to be taken by that system. Further, while only a single system is illustrated, the term "system" shall also be taken to include any collection of systems that individually or jointly execute a set (or multiple sets) of instructions to perform any one or more of the methodologies discussed herein.

The client system may include the client processor 402 (e.g., a central processing unit (CPU)), a memory 404 which may store program code during execution, and disk storage unit 406, all of which communicate with each other via a bus 400. The system may further include a video display unit 408 (e.g., a liquid crystal display (LCD) or cathode ray tube (CRT)). The system also may include an alphanumeric input device 410 (e.g., a keyboard), and a network interface device 412 for sending requests and receiving responses.

The disk storage unit 406 may include a machine-readable medium on which may be stored one or more sets of instructions (e.g., software) embodying any one or more of the methodologies or functions described herein. The instructions may also reside, completely or at least partially, within the memory 404 and/or within the client processor 402 during execution thereof by the system, with the memory 404 and the client processor 402 also constituting machine-readable media.

Usage of 3GPP File Format

The 3GPP File Format or any other file based on the ISO base media file format, such as the MP4 file format or the 3GPP2 file format, may be used as the container format for HTTP streaming with the following features. A segment index may be included in each segment to signal time offsets and byte ranges, such that the client can download the appropriate pieces of files or media segments as required. Global presentation timing of the entire media presentation and local timing within each 3GP file or media segment may be accurately aligned. Tracks within one 3GP file or media segment may be accurately aligned. Tracks across representations may also be aligned by assigning each of them to the global timeline such that switching across representation may be seamless and joint presentation of media components in different representations may be synchronous.

The file format may contain a profile for Adaptive Streaming with the following properties. All movie data may be contained in movie fragments—the "moov" box may not contain any sample information. Audio and Video sample data may be interleaved, with similar requirements as for the progressive download profile as specified in TS26.244. The "moov" box may be placed at the start of the file, followed by fragment offset data, also referred to as a segment index, containing offset information in time and byte ranges for each fragment or at least a subset of fragments in the containing segment.

It may also be possible for the Media Presentation Description to reference files that follow the existing Progressive Download profile. In this case the client may use the Media Presentation Description simply to select the appropriate alternative version from amongst multiple available versions. Clients may also use HTTP partial get requests with files compliant to the Progressive Download profile to request subsets of each alternative version and thereby implement a less efficient form of adaptive streaming. In this case the different representations containing the media in the progressive download profile may still adhere to a common global timeline to enable seamless switching across representations.

Advanced Methods Overview

In the following sections, methods for improved block-request streaming systems are described. It should be understood that some of these improvements can be used with or without others of these improvements, depending on the needs of the application. In the general operation, a receiver makes requests of a server or other transmitter for specific blocks or portions of blocks of data. Files, also called segments, may contain multiple blocks and are associated with one representation of a media presentation.

Preferably, indexing information, also called "segment indexing" or "segment map", is generated that provides a mapping from playout or decode times to byte offsets of corresponding blocks or fragments within a segment. This segment indexing may be included within the segment, typically at the beginning of the segment (at least some of the segment map is at the beginning) and is often small. The segment index may also be provided in a separate index segment or file. Especially in cases where the segment index is contained in the segment, the receiver may download some or all of this segment map quickly and subsequently use this to determine the mapping between time offsets and corresponding byte positions of fragments associated with those time offsets within the file.

A receiver can use the byte offset to request data from the fragments associated with particular time offsets, without having to download all of the data associated with other fragments not associated with the time offsets of interest. In this way, the segment map or segment indexing can greatly improve the ability of a receiver to directly access the portions of the segment that are relevant to the current time offsets of interest, with benefits including improved content zapping times, ability to quickly change from one representation to another as network conditions vary, and reduced wastage of network resources downloading media that is not played out at a receiver.

In case switching from one representation (referred to herein as the "switch-from" representation) to another representation (referred to herein as the "switch-to" representation) is considered, the segment index may also be used to identify the start time of a random access point in the switch-to representation to identify the amount of data to be requested in the switch-from representation to ensure that seamless switching is enabled in a sense that media in the switch-from representation is downloaded up to a presentation time such that the playout of the switch-to representation can start seamlessly from the random access point.

Those blocks represent segments of the video media or other media that the requesting receiver needs in order to generate the output for the user of the receiver. The receiver of the media can be a client device, such as when the receiver receives content from a server that transmits the content. Examples include set-top boxes, computers, game consoles, specially-equipped televisions, handheld devices, specially-equipped mobile phones, or other client receivers.

Many advanced buffer management methods are described herein. For example, a buffer management method enables clients to request blocks of the highest media quality that may be received in time to be played out with continuity. A variable block size feature improves compression efficiency. The ability to have multiple connections for transmitting blocks to the requesting device while limiting the frequency of the requests provides improved transmission performance. Partially received blocks of data can be used to continue the media presentation. A connection can be re-used for multiple blocks without having to commit the connection at the start to a particular set of blocks. Consistency in the selection of servers from among multiple possible servers by multiple clients is improved, which reduces the frequency of duplicate content in nearby servers and improves the probability that a server contains an entire file. Clients can request media blocks based on metadata (such as available media encodings) that are embedded in the URLs for the files containing the media blocks. A system can provide for calculation and minimization of the amount of buffering time required before playout of the content can begin without incurring subsequent pauses in media playout. Available bandwidth can be shared among multiple media blocks, adjusted as the playout time of each block approaches, so that, if necessary, a greater share of available bandwidth can be allocated towards the block with the nearest playout time.

HTTP streaming may employ metadata. Presentation level metadata includes, for example, stream duration, available encodings (bitrates, codecs, spatial resolutions, frame rates, language, media types), pointers to stream metadata for each encoding, and content protection (digital rights management (DRM) information). Stream metadata may be URLs for the segment files.

Segment metadata may include byte range versus time information for requests within a segment and identification of Random Access Points (RAPs) or other seek points, where some or all of this information may be part of a segment indexing or segment map.

Streams may comprise multiple encodings of the same content. Each encoding may then be broken into segments where each segment corresponds to a storage unit or file. In the case of HTTP, a segment is typically a resource that can be referenced by a URL and the request of such URL results in the return of the segment as the entity body of the request response message. Segments may comprise multiple groups of pictures (GoPs). Each GoP may further comprise multiple fragments where the segment indexing provides time/byte-offset information for each fragment, i.e., the unit of indexing is a fragment.

Fragments or portions of fragments may be requested through parallel TCP connections to increase throughput. This can mitigate problems that arise when sharing connections on a bottleneck link or when connections are lost due to congestion, thus increasing overall speed and reliability of delivery, which can substantially improve the speed and reliability of the content zapping time. Bandwidth can be traded for latency by over-requesting, but care should be taken to avoid making requests too far into the future that can increase the risk of starvation.

Multiple requests for segments on the same server may be pipelined (making next request before current request completes) to avoid repetitious TCP startup delays. Requests for consecutive fragments may be aggregated into one request.

Some CDNs prefer large files and may trigger background fetches of an entire file from an origin server when first seeing a range request. Most CDNs will, however, serve range requests from cache if the data is available. It may therefore be advantageous to have some portion of the client requests be for a whole segment file. These requests can later be cancelled if necessary.

Valid switch points may be seek points, specifically RAPs for example, in the target stream. Different implementations are possible such as fixed GoP structures or alignment of RAPs across streams (based on the beginning of the media or based on the GoPs).

In one embodiment, segments and GoPs may be aligned across different rate streams. In this embodiment, GoPs may be of variable size and may contain multiple fragments, but fragments are not aligned between the different rate streams.

In some embodiments, file redundancy may be employed to advantage. In these embodiments, an erasure code is applied to each fragment to generate redundant versions of the data. Preferably, the source formatting is not changed due to the usage of FEC, and additional repair segments, for example as dependent representation of the original representation, containing FEC repair data are generated and made available as an additional step in the ingestion system. The client, which is able to reconstruct a fragment using only source data for that fragment, may only request source data for the fragment within the segment from the servers. If the servers are unavailable or the connection to the servers are slow, which can be determined either before or after the request for source data, additional repair data may be requested for the fragment from the repair segment, which decreases the time to reliably deliver enough data to recover the fragment, possibly using FEC decoding to use a combination of received source and repair data to recover the source data of the fragment. Furthermore, additional repair data can be requested to allow recovery of the fragment if a fragment becomes urgent, i.e., its playout time becomes imminent, which increases the data share for that fragment on a link but is more efficient than closing other connections on the link to free up bandwidth. This may also mitigate the risk of starvation from the use of parallel connections.

The fragment format may be a stored stream of real time transport protocol (RTP) packets with audio/video synchronization achieved through real time transport control protocol RTCP.

The segment format may also be a stored stream of MPEG-2 TS packets with audio/video synchronization achieved MPEG-2 TS internal timing.

Using Signalling and/or Block Creation to Make Streaming More Efficient

A number of features can be used or not, in a block-request streaming system, to provide for improved performance. Performance can be related to the ability to playout a presentation without stalling, obtaining media data within bandwidth constraints, and/or doing so within limited processor resources at a client, server and/or ingestion system. Some of these features will now be described.

Indexing within Segments

In order to formulate partial GET requests for Movie Fragments, the client may be informed of the byte offset and start time in decoding or presentation time of all media components contained in the fragments within the file or segment and also which fragments begin or contain a Random Access Points (and so are suitable to be used as switch points between alternative representations), wherein this information is often referred to as the segment indexing or segment map. The start time in decoding or presentation time may be expressed directly or may be expressed as deltas relative to a reference time.

This time and byte offset indexing information may require at least 8 bytes of data per movie fragment. As an example, for a two hour movie contained within a single file, with 500 ms movie fragments, this would be a total of about 112 kilobytes of data. Downloading all of this data when starting a presentation may result in a significant additional startup delay. However, the time and byte offset data can be encoded hierarchically, so that the client can quickly find a small chunk of time and offset data relevant to the point in the presentation at which it wishes to start. The information may also be distributed within a segment such that some refinement of the segment index may be located interleaved with media data.

Note that if the a representation is segmented timewise into multiple segments, the use of this hierarchical coding may not be necessary, as the complete time and offset data for each segment may already be quite small. For example, if segments are one minute instead of two hours in the above example, the time-byte offset indexing information is around 1 kilobyte of data, which can typically fit within a single TCP/IP packet.

Different options are possible to add fragment time and byte offset data to a 3GPP file:

First, the Movie Fragment Random Access Box ("MFRA") may be used for this purpose. The MFRA provides a table, which may assist readers in finding random access points in a file using movie fragments. In support of this function, the MFRA incidentally contains the byte offsets of MFRA boxes containing random access points. The MFRA may be placed at or near the end of the file, but this is not necessarily the case. By scanning from the end of the file for a Movie Fragment Random Access Offset Box and using the size information in it, one may be able to locate the beginning of a Movie Fragment Random Access Box. However, placing the MFRA at the end for HTTP streaming requires typically at least 3-4 HTTP requests to access the desired data: at least one to request the MFRA from the end of the file, one to obtain the MFRA and finally one to obtain the desired fragment in the file. Therefore, placing at the beginning may be desirable as then the mfra may be downloaded together with the first media data in a single request. Also, using the MFRA for HTTP streaming may be inefficient, since none of the information in the "MFRA" is needed apart from the time and moof_offset and specifying offsets instead of lengths may require more bits.

Second, the Item Location Box ("ILOC") may be used. The "ILOC" provides a directory of metadata resources in this or other files, by locating their containing file, their offset within that file, and their length. For example, a system might integrate all the externally referenced metadata resources into one file, re-adjusting file offsets and file references accordingly. However, the "ILOC" is intended for giving the location of metadata so it may be difficult for this to coexist with real metadata.

Last, and perhaps most suitable, is the specification of a new box, referred to as Time Index Box ("TIDX"), specifically dedicated to the purpose of providing exact fragment times or durations and byte offset in an efficient manner. This is described in more detail in the next section. An alternative box with the same functionalities may be the Segment Index Box ("SIDX"). Herein, unless otherwise indicated, these two might be interchangeable, as both boxes provide the ability to provide exact fragment times or durations and byte offset in an efficient manner. The difference between the TIDX and the SIDX are provided below. It should be apparent how to interchange the TIDX boxes and SIDX boxes, as both boxes implement a segment index.

Segment Indexing

A segment has an identified start time and an identified number of bytes. Multiple fragments may be concatenated into a single segment and clients may issue requests that identify the specific byte range within the segment that correspond to the required fragment or subset of the fragment. For example, when HTTP is used as the request protocol, then the HTTP Range header may be used for this purpose. This approach requires that the client has access to a "segment index" of the segment that specifies the position within the segment of the different fragments. This "segment index" may be provided as part of the metadata. This approach has the result that far fewer files need to be created and managed compared to the approach where every block is kept in a separate file. Management of the creation, transfer and storage of very large numbers of files (which could extend to many thousands for a 1 hour presentation, say) can be complex and error-prone and so reduction in the number of files represents an advantage.

If the client only knows the desired start time of a smaller portion of a segment, it might request the whole file, then read the file through to determine the appropriate playout starting location. To improve bandwidth usage, segments can include an index file as metadata, where the index file maps the byte ranges of individual blocks with the time ranges that the blocks correspond to, called segment indexing or segment map. This metadata can be formatted as XML data or they may be binary, for example following the atom and box structure of the 3GPP file format. The indexing can be simple, wherein the time and byte ranges of each block are absolute relative to the start of the file, or they can be hierarchical, wherein some blocks are grouped into parent blocks (and those into grandparent blocks, etc.) and the time and byte range for a given block is expressed relative to the time and/or byte range of the block's parent block.

Example Indexing Map Structure

In one embodiment, the original source data for one representation of a media stream may be contained in one or more media files herein called a "media segment", wherein each media segment contains the media data used to playback a continuous time segment of the media, e.g., 5 minutes of the media playback.

Figure 6:
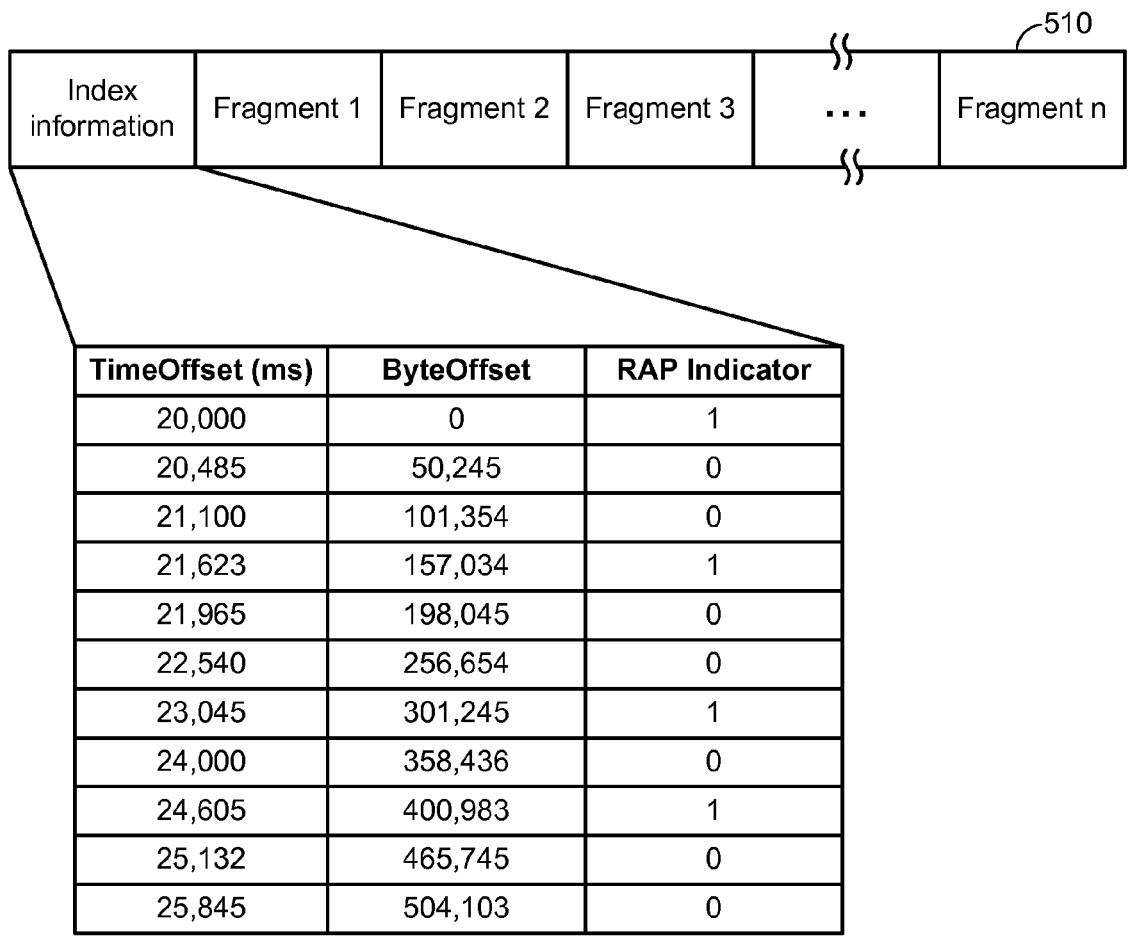
FIG. 6 illustrates details of a typical source segment, as might be stored in the content store illustrated in FIGS. 1 and 5.

FIG. 6 shows an example overall structure of a media segment. Within each segment, either at the beginning or spread throughout the source segment, there can also be indexing information, which comprises a time/byte-offset segment map. The time/byte-offset segment map in one embodiment may be a list of time/byte-offset pairs (T(0), B(0)), (T(1), B(1)), . . . , (T(i), B(i)), . . . , (T(n), B(n)), wherein T(i−1) represents a start time within the segment for playback of the i-th fragment of media relative to initial start time of the media amongst all media segments, T(i) represents an end time for the i-th fragment (and thus the start time for the next fragment), and the byte-offset B(i−1) is the corresponding byte index of the beginning of the data within this source segment where the i-th fragment of media starts relative to the beginning of the source segment, and B(i) is the corresponding end byte index of the i-th fragment (and thus the index of the first byte of the next fragment). If the segment contains multiple media components, then T(i) and B(i) may be provided for each component in the segment in a absolute way or they may be expressed relative to another media component that serves a reference media component.

In this embodiment, the number of fragments in the source segment is n, where n may vary from segment to segment.

In another embodiment, the time offset in the segment index for each fragment may be determined with absolute start time of the first fragment and the durations of each fragment. In this case, the segment index may document the start time of the first fragment and the duration of the all fragments that are included in the segment. The segment index may also only document a subset of the fragments. In that case, the segment index documents the duration of a subsegment that is defined as one or more consecutive fragments, ending either at the end of the containing segment, or at the beginning of the next subsegment.

For each fragment, there may also be a value that indicates whether or not the fragment starts at or contains a seek point, i.e., at a point wherein no media after that point depends on any media previous to that point, and thus the media from that fragment forward can be played out independently of previous fragments. Seek points are, in general, points in the media where playout can start independently of all previous media. FIG. 6 also shows a simple example of possible segment indexing for a source segment. In that example, the time offset value is in units of milliseconds, and thus the first fragment of this source segment starts 20 seconds from the beginning of the media, and the first fragment has a playout time of 485 milliseconds. The byte offset of the start of the first fragment is 0, and the byte offset of the end of the first fragment/start of the second fragment is 50,245, and thus the first fragment is of size 50,245 bytes. If the fragment or the subsegment does not start with a random access point, but the random access point is contained in the fragment or subsegment, then the decoding time or presentation time difference between the start time and the actual RAP time may be given. This enables that in case of switching to this media segment, the client can accurately know the time until the switch from representation needs to be presented.

In addition to, or instead of, simple or hierarchical indexing, daisy-chained indexing and/or a hybrid indexing could be used.

Because the sample durations for different tracks might not be the same (for example, video samples might be displayed for 33 ms, whereas an audio sample might last 80 ms), the different tracks in a Movie Fragment might not begin and end at precisely the same time, i.e., the audio may begin slightly before or slightly after the video, with the opposite being true of the preceding fragment, to compensate. To avoid ambiguity, the timestamps specified in the time and byte offset data may be specified relative to a particular track and this may be the same track for each representation. Usually this will be the video track. This allows the client to identify exactly the next video frame when it is switching representations.

Care may be taken during presentation to maintain a strict relationship between track timescales and presentation time, to ensure smooth playout and maintenance of audio/video synchronisation despite the above issue.

Figure 7A:
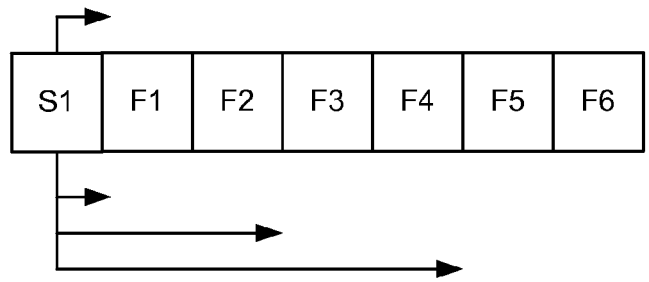
FIGS. 7a and 7b illustrate simple and hierarchical indexing within files.
Figure 7B:
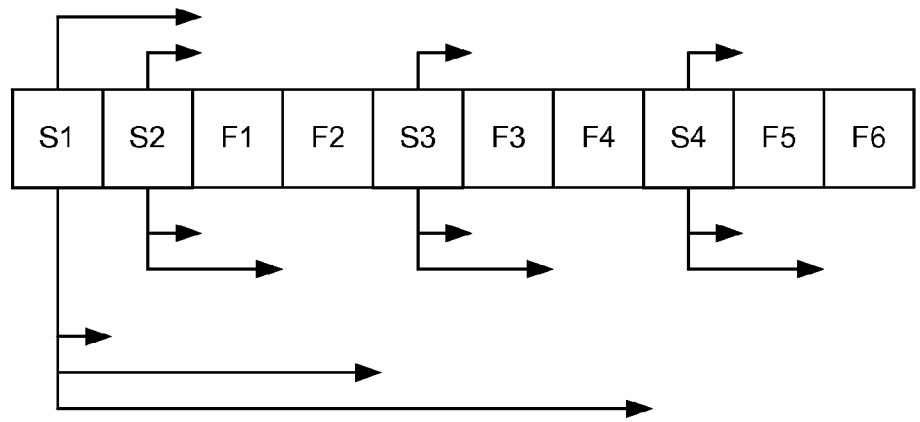

FIG. 7 illustrates some examples, such as a simple index 700 and a hierarchical index 702.

Two specific example of a box that contains a segment map are provided below, one referred to as time index box ('TIDX') and one referred to as ('SIDX'). The definition follows the box structure according to the ISO base media file format. Other designs for such boxes to define similar syntax and with the same semantics and functionality should be apparent to the reader.

Time Index Box

Definition

Box Type: 'tidx'

Container: File

Mandatory: No

Quantity: Any number zero or one

The Time Index Box may provide a set of time and byte offset indices that associate certain regions of the file with certain time intervals of the presentation. The Time Index Box may include a targettype field, which indicates the type of the referenced data. For example, a Time Index Box with targettype "moof" provides an index to the Media Fragments contained in the file in terms of both time and byte offsets. A Time Index Box with targettype of Time Index Box can be used to construct a hierarchical time index, allowing users of the file to quickly navigate to the required portion of the index.

The segment index may for example contain the following syntax:

```
aligned(8) class TimeIndexBox
extends FullBox('frai') {
    unsigned int(32) targettype;
        unsigned int(32) time_reference_track_ID;
    unsigned int(32) number_of_elements;
    unsigned int(64) first_element_offset;
    unsigned int(64) first_element_time;
    for(i=1; i <= number_of_elements; i++)
    {
        bit (1)      random_access_flag;
        unsigned int(31) length;
        unsigned int(32) deltaT;
    }
}
```

Semantics targettype: is the type of the box data referenced by this Time Index Box. This can be either Movie Fragment Header ("moof") or Time Index Box ("tidx").

time-reference_track_id: indicates the track with respect to which the time offsets in this index are specified.

number_of_elements: the number of elements indexed by this Time Index Box.

first_element_offset: The byte offset from the start of the file of the first indexed element.

first_element_time: The start time of the first indexed element, using the timescale specified in the Media Header box of the track identified by the time_reference_track_id.

random_access_flag: One if the start time of the element is a random access point. Zero otherwise.

length: The length of the indexed element in bytes deltaT: The difference in terms of the timescale specified in the Media Header box of the track identified by the time_reference_track_id between the start time of this element and the start time of the next element.

Segment Index Box

The Segment Index Box ('sidx') provides a compact index of the movie fragments and other Segment Index Boxes in a segment. There are two loop structures in the Segment Index Box. The first loop documents the first sample of the subsegment, that is, the sample in the first movie fragment referenced by the second loop. The second loop provides an index of the subsegment. The container for 'sidx' box is the file or segment directly.

Syntax

```
aligned(8) class SegmentIndexBox extends FullBox('sidx', version, 0) {
  unsigned int(32) reference_track_ID;
  unsigned int(16) track_count;
  unsigned int(16) reference_count;
  for (i=1; i<= track_count; i++)
  {
    unsigned int(32)      track_ID;
    if (version==0)
    {
      unsigned int(32)          decoding_time;
    } else
    {
      unsigned int(64)          decoding_time;
    }
  }
  for(i=1; i <= reference_count; i++)
  {
    bit (1)             reference_type;
    unsigned int(31)    reference_offset;
    unsigned int(32)    subsegment_duration;
    bit(1)              contains_RAP;
    unsigned int(31)    RAP_delta_time;
  }
}
```

Semantics:

reference_track_ID provides the track_ID for the reference track.

track_count: the number of tracks indexed in the following loop (1 or greater);

reference_count: the number of elements indexed by second loop (1 or greater);

track_ID: the ID of a track for which a track fragment is included in the first movie fragment identified by this index; exactly one track_ID in this loop is equal to the reference_track_ID;

decoding_time: the decoding time for the first sample in the track identified by track_ID in the movie fragment referenced by the first item in the second loop, expressed in the timescale of the track (as documented in the timescale field of the Media Header Box of the track);

reference_type: when set to 0, indicates that the reference is to a movie fragment ('moof') box; when set to 1, indicates that the reference is to a segment index ('sidx') box;

reference_offset: the distance in bytes from the first byte following the containing Segment Index Box, to the first byte of the referenced box;

subsegment_duration: when the reference is to Segment Index Box, this field carries the sum of the subsegment_duration fields in the second loop of that box; when the reference is to a movie fragment, this field carries the sum of the sample durations of the samples in the reference track, in the indicated movie fragment and subsequent movie fragments up to either the first movie fragment documented by the next entry in the loop, or the end of the subsegment, whichever is earlier; the duration is expressed in the timescale of the track (as documented in the timescale field of the Media Header Box of the track);

contains_RAP: when the reference is to a movie fragment, then this bit may be 1 if the track fragment within that movie fragment for the track with track_ID equal to reference_track_ID contains at least one random access point, otherwise this bit is set to 0; when the reference is to a segment index, then this bit is set to 1 only if any of the references in that segment index have this bit set to 1, and 0 otherwise;

RAP_delta_time: if contains_RAP is 1, provides the presentation (composition) time of a random access point (RAP); reserved with the value 0 if contains_RAP is 0. The time is expressed as the difference between the decoding time of the first sample of the subsegment documented by this entry and the presentation (composition) time of the random access point, in the track with track_ID equal to reference_track_ID.

Differences between TIDX and SIDX

The SIDX and the SIDX provide the same functionality with respect to indexing. The first loop of the SIDX provides in addition global timing for the first movie fragment, but the global timing may as well be contained in the movie fragment itself, either absolute or relative to the reference track.

The second loop of the SIDX implements the functionality of the TIDX. Specifically, the SIDX permits to have a mixture of targets for the reference for each index referred to by reference_type, whereas the TIDX only references either only TIDX or only MOOF. The number_of_elements in TIDX corresponds to the reference_count in SIDX, the time-reference_track_id in TIDX corresponds to reference_track_ID in SIDX, the first_element_offset in TIDX corresponds to the reference_offset in the first entry of the second loop, the first_element_time in TIDX corresponds to the decoding_time of the reference_track in the first loop, the random_access_flag in TIDX corresponds to the contains_RAP in the SIDX with the additional freedom that in the SIDX the RAP may not necessarily be placed at the start of the fragment, and therefore requiring the RAP_delta_time, the length in TIDX corresponds to the reference_offset in SIDX and finally the deltaT in TIDX corresponds to the subsegment_duration in SIDX. Therefore the functionalities of the two boxes are equivalent.

Variable Block Sizing and Sub-GoP Blocks

For video media, the relationship between video encoding structure and the block structure for requests can be important. For example, if each block begins with a seek point, such as a Random Access Point ("RAP"), and each block represents an equal period of video time, then the positioning of at least some seek points in the video media is fixed and seek points will occur at regular intervals within the video encoding. As is well known to those of skill in the art of video encoding, compression efficiency may be improved if seek points are placed according to relationships between video frames, and in particular, if they are placed at frames that have little in common with previous frames. This requirement that blocks represent equal amounts of time thus places a restriction on the video encoding, such that compression may be sub-optimal.

It is desirable to allow the position of seek points within a video presentation to be chosen by the video encoding system, rather than requiring seek points at fixed positions. Allowing the video encoding system to choose the seek points results in improved video compression and thus a higher quality of video media can be provided using a given available bandwidth, resulting in an improved user experience. Current block-request streaming systems can require that all blocks be of the same duration (in video time), and that each block must begin with a seek point and this is thus a disadvantage of existing systems.

A novel block-request streaming system that provides advantages over the above is now described. In one embodiment, the video encoding process of a first version of the video component may be configured to choose the positions of seek points in order to optimize compression efficiency, but with a requirement that there is a maximum on the duration between seek points. This latter requirement does restrict the choice of seek points by the encoding process and thus reduces compression efficiency. However, the reduction in compression efficiency is small compared to that incurred if regular fixed positions is required for the seek points, provided the maximum on the duration between seek points is not too small (for example, greater than around a second). Furthermore, if the maximum on the duration between seek points is a few seconds, then the reduction in compression efficiency compared to completely free positioning of seek points is generally very small.

In many embodiments, including this embodiment, it may be that some RAPs are not seek points, i.e., there may be a frame that is a RAP that is between two consecutive seek points that is not chosen to be a seek point, for example because the RAP is too close in time to the surrounding seek points, or because the amount of media data between the seek point preceding or following the RAP and the RAP is too small.

The position of seek points within all other versions of the media presentation may be constrained to be the same as the seek points in a first (for example, the highest media data rate) version. This does reduce the compression efficiency for these other version compared to allowing the encoder free choice of seek points.

The use of seek points typically required a frame to be independently decodable, which generally results in a low compression efficiency for that frame. Frames that are not required to be independently decodable can be encoded with reference to data in other frames, which generally increases compression efficiency for that frame by an amount that is dependent on the amount of commonality between the frame to be encoded and the reference frames. Efficient choice of seek point positioning preferentially chooses as a seek point frame a frame that has low commonality with previous frames and thereby minimizes the compression efficiency penalty incurred by encoding the frame in a way that is independently decodable.

However, the level of commonality between a frame and potential reference frames is highly correlated across different representations of the content, since the original content is the same. As a result, the restriction of seek points in other variants to be the same positions as the seek points in the first variant does not make a large difference in compression efficiency.

The seek point structure preferably is used to determined the block structure. Preferably, each seek point determined the start of a block, and there may be one or more blocks that encompass the data between two consecutive seek points. Since the duration between seek points is not fixed for encoding with good compression, not all blocks are required to have the same playout duration. In some embodiments, blocks are aligned between versions of the content—that is, if there is a block spanning a specific group of frames in one version of the content, then there is a block spanning the same group of frames in another version of the content. The blocks for a given version of the content do not overlap and every frame of the content is contained within exactly one block of each version.

An enabling feature that allows the efficient use of variable durations between seek points, and thus variable duration GoPs, is the segment indexing or segment map that can be included in a segment or provided by other means to a client, i.e., this is metadata associated with this segment in this representation that may be provided comprising the start time and duration of each block of the presentation. The client may use this segment indexing data when determining the block at which to start the presentation when the user has requested that the presentation start at a particular point that is within a segment. If such metadata is not provided, then presentation can begin only at the beginning of the content, or at a random or approximate point close to the desired point (for example by choosing the starting block by dividing the requested starting point (in time) by the average block duration to give the index of the starting block).

In one embodiment, each block may be provided as a separate file. In another embodiment, multiple consecutive blocks may be aggregated into a single file to form a segment. In this second embodiment, metadata for each version may be provided comprising the start time and duration of each block and the byte offset within the file at which the block begins. This metadata may be provided in response to an initial protocol request, i.e., available separately from the segment or file, or may be contained within the same file or segment as the blocks themselves, for example at the beginning of the file. As will be clear to those of skill in the art, this metadata may be encoded in a compressed form, such as gzip or delta encoding or in binary form, in order to reduce the network resources required to transport the metadata to the client.

FIG. 6 shows an example of segment indexing where the blocks are variable size, and where the scope of blocks is a partial GoP, i.e., a partial amount of the media data between one RAP and the next RAP. In this example, the seek points are indicated by the RAP indicator, wherein a RAP indicator value of 1 indicates that the block starts with or contains a RAP, or seek point, and wherein a RAP indicator of 0 indicates that the block does not contain a RAP or seek point. In this example, the first three blocks, i.e., bytes 0 through 157,033, comprise the first GoP, which has a presentation duration of 1.623 seconds, with a presentation time running from 20 seconds into the content to 21.623 seconds. In this example, the first of the three first blocks comprises 0.485 seconds of presentation time, and comprises the first 50,245 bytes of the media data in the segment. In this example, blocks 4, 5, and 6 comprise the second GoP, blocks 7 and 8 comprise the third GoP, and blocks 9, 10 and 11 comprise the fourth GoP. Note that there may be other RAPs in the media data that are not designated as seek points, and are thus not signaled as RAPs in the segment map.

Referring again to FIG. 6, if the client or receiver wants to access the content starting at time offset approximately 22 seconds into the media presentation, then the client could first use other information, such as the MPD described in more detail later, to first determine that the relevant media data is within this segment. The client can download the first portion of the segment to obtain the segment indexing, which in this case is just a few bytes, for example using an HTTP byte range request. Using the segment indexing, the client may determine that the first block that it should download is the first block with a time offset that is at most 22 seconds and that starts with a RAP, i.e., is a seek point. In this example, although block 5 has a time offset that is smaller than 22 seconds, i.e., its time offset is 21.965 seconds, the segment indexing indicates that block 5 does not start with a RAP, and thus instead, based on the segment indexing, the client selects to download block 4, since its start time is at most 22 seconds, i.e, its time offset is 21.623 seconds, and it starts with a RAP. Thus, based on the segment indexing, the client will make an HTTP range request starting at byte offset 157,034.

If segment indexing were not available then the client might have to download all previous 157,034 bytes of data before downloading this data, leading to a much longer startup time, or channel zapping time, and to wasteful downloading of data that is not useful. Alternatively, if segment indexing were not available, the client might approximate where the desired data starts within the segment, but the approximation might be poor and it may miss the appropriate time and then requires to go backward which again increases the start-up delay.

Generally, each block encompasses a portion of the media data that, together with previous blocks, can be played out by a media player. Thus, the blocking structure and the signaling of the segment indexing blocking structure to the client, either contained within the segment or provided to the client through other means, can significantly improve the ability of the client to provide fast channel zapping, and seamless playout in the face of network variations and disruptions. The support of variable duration blocks, and blocks that encompass only portions of a GoP, as enabled by the segment indexing, can significantly improve the streaming experience. For example, referring again to FIG. 6 and the example described above where the client wants to start playout at approximately 22 seconds into the presentation, the client may request, through one or more requests, the data within block 4, and then feed this into media player as soon as it is available to start playback. Thus, in this example, the playout begins as soon as the 42,011 bytes of block 4 are received at the client, thus enabling a fast channel zapping time. If instead the client needed to request the entire GoP before playout was to commence, the channel zapping time would be longer, as this is 144,211 bytes of data.

In other embodiments, RAPs or seek points may also occur in the middle of a block, and there may be data in the segment indexing that indicates where that RAP or seek point is within the block or fragment. In other embodiments, the time offset may be the decode time of the first frame within the block, instead of the presentation time of the first frame within the block.

FIGS. 8(*a*) and (*b*) illustrate an example of variable block sizing an aligned seek point structure across a plurality of versions or representations; FIG. 8(*a*) illustrates variable block sizing with aligned seek points over a plurality of versions of a media stream, while FIG. 8(*b*) illustrates variable block sizing with non-aligned seek points over a plurality of versions of a media stream.

Time is shown across the top in seconds, and the blocks and seek points of the two segments for the two representations are shown from left to right in terms of their timing with respect to this time line, and thus the length of each block shown is proportional to its playout time and not proportional to the number of bytes in the block. In this example, the segment indexing for both segments of the two representations would have the same time offsets for the seek points, but potentially differing numbers of blocks or fragments between seek points, and different byte offsets to blocks due to the different amounts of media data in each block. In this example, if the client wants to switch from representation 1 to representation 2 at presentation time approximately 23 seconds, then the client could request up through block 1.2 in the segment for representation 1, and start requesting the segment for representation 2 starting at block 2.2, and thus the switch would occur at the presentation coinciding with seek point 1.2 in representation 1, which is at the same time as seek point 2.2 in representation 2.

As should be clear from the foregoing, the block-request streaming system described does not constrain the video encoding to place seek points at specific positions within the content and this mitigates one of the problems of existing systems.

In the embodiments described above it is organized so that the seek points for the various representations of the same content presentation are aligned. However, in many cases, it is preferable to relax this alignment requirement. For example, it is sometimes the case that encoding tools have been used to generate the representations that do not have the capabilities to generate seek point aligned representations. As another example, the content presentation may be encoded into different representations independently, without no seek point alignment between different representations. As another example, a representation may contain more seek points as it has lower rates and more commonly it needs to be switched or it contains seek points to support trick modes such fast forward or rewind or fast seeking. Thus, it is desirable to provide methods that make a block-request streaming system capable of efficiently and seamlessly dealing with non-aligned seek points across the various representations for a content presentation.

In this embodiment, the positions of seek points across representations may not align. Blocks are constructed such that a new block starts at each seek point, and thus there might not be alignment between blocks of different versions of the presentation. An example of such a non-aligned seek point structure between different representations is shown in FIG. 8(*b*). Time is shown across the top in seconds, and the blocks and seek points of the two segments for the two representations are shown from left to right in terms of their timing with respect to this time line, and thus the length of each block shown is proportional to its playout time and not proportional to the number of bytes in the block. In this example, the segment indexing for both segments of the two representations would have potentially different time offsets for the seek points, and also potentially differing numbers of blocks or fragments between seek points, and different byte offsets to blocks due to the different amounts of media data in each block. In this example, if the client wants to switch from representation 1 to representation 2 at presentation time approximately 25 seconds, then the client could request up through block 1.3 in the segment for representation 1, and start requesting the segment for representation 2 starting at block 2.3, and thus the switch would occur at the presentation coinciding with seek point 2.3 in representation 2, which is in the middle of the playout of block 1.3 in representation 1, and thus some of the media for block 1.2 would not be played out (although the media data for the frames of block 1.3 that are not played out may have to be loaded into the receiver buffer for decoding other frames of block 1.3 that are played out).

In this embodiment, the operation of block selector 123 may be modified such that whenever it is required to select a block from a representation that is different from the previously selected version, the latest block whose first frame is not later than the frame subsequent to the last frame of the last selected block is chosen.

This last described embodiment may eliminate the requirement to constrain the positions of seek points within versions other than the first version and thus increases compression efficiency for these versions resulting in a higher quality presentation for a given available bandwidth and this an improved user experience. A further consideration is that video encoding tools which perform the function of seek point alignment across multiple encodings (versions) of the content may not be widely available and therefore an advantage of this latest described embodiment is that currently available video encoding tools may be used. Another advantage is that encoding of different versions of the content may proceed in parallel without any need for coordination between encoding processes for the different versions. Another advantage is that additional versions of the content may be encoded and added to the presentation at a later time, without having to provide the encoding tools with the lists of specific seek point positions.

Generally, where pictures are encoded as groups of pictures (GoPs), the first picture in the sequence can be a seek point, but that need not always be the case.

Optimal Block Partitioning

One issue of concern in a block-request streaming system is the interaction between the structure of encoded media, for example video media, and the block structure used for block requests. As will be known to those of skill in the art of video encoding, it is often the case that the number of bits required for the encoded representation of each video frame varies, sometimes substantially, from frame to frame. As a result the relationship between the amount of received data and the duration of media encoded by that data may not be straightforward. Furthermore, the division of media data into block within a block-request streaming system adds a further dimension of complexity. In particular, in some systems the media data of a block may not be played out until the entire block has been received, for example the arrangement of media data within a block or dependencies between media samples within a block of the use of erasure codes may result in this property. As a result of these complex interactions between block size and block duration and the possible need to receive an entire block before beginning playout it is common for client systems to adopt a conservative approach wherein media data is buffered before playout begins. Such buffering results in a long channel zapping time and thus a poor user experience.

Pakzad describes "block partitioning methods" which are new and efficient methods to determine how to partition a data stream into contiguous blocks based on the underlying structure of the data stream and further describes several advantages of these methods in the context of a streaming system. A further embodiment of the invention to apply the block partitioning methods of Pakzad to a block-request streaming system is now described. This method may comprise arranging the media data to be presented into approximate presentation time order, such that the playout time of any given element of media data (for example a video frame or audio sample) differs from that of any adjacent media data element by less than a provided threshold. The media data so ordered may be considered a data stream in the language of Pakzad and any of the methods of Pakzad applied to this data stream identify block boundaries with the data stream. The data between any pair of adjacent block boundaries is considered a "Block" in the language of this disclosure and the methods of this disclosure are applied to provide for presentation of the media data within a block-request streaming system. As will be clear to those of skill in the art on reading this disclosure the several advantages of the methods disclosed in Pakzad may then be realized in the context of a block-request streaming system.

As described in Pakzad, the determination of the block structure of a segment, including the blocks that encompass partial GoPs or portions of more than on GoP, can impact the ability of the client to enable fast channel zapping times. In Pakzad, methods were provided that, given a target startup time, would provide a block structure and a target download rate that would ensure that if the client started downloading the representation at any seek point and started playout after the target startup time has elapsed then the playout would continue seamlessly as long as at each point in time the amount of data the client has downloaded is at least the target download rate times the elapsed time from the beginning of the download. It is advantageous for the client to have access to the target startup time and the target download rate, as this provides the client with a means to determine when to start playing out the representation at the earliest point in time, and allows the client to continue to play out the representation as long as the download meets the condition described above. Thus, the method described later provides a means for including the target startup time and the target download rate within the Media Presentation Description, so that it can be used for the purposes described above.

Media Presentation Data Model

Figure 5:
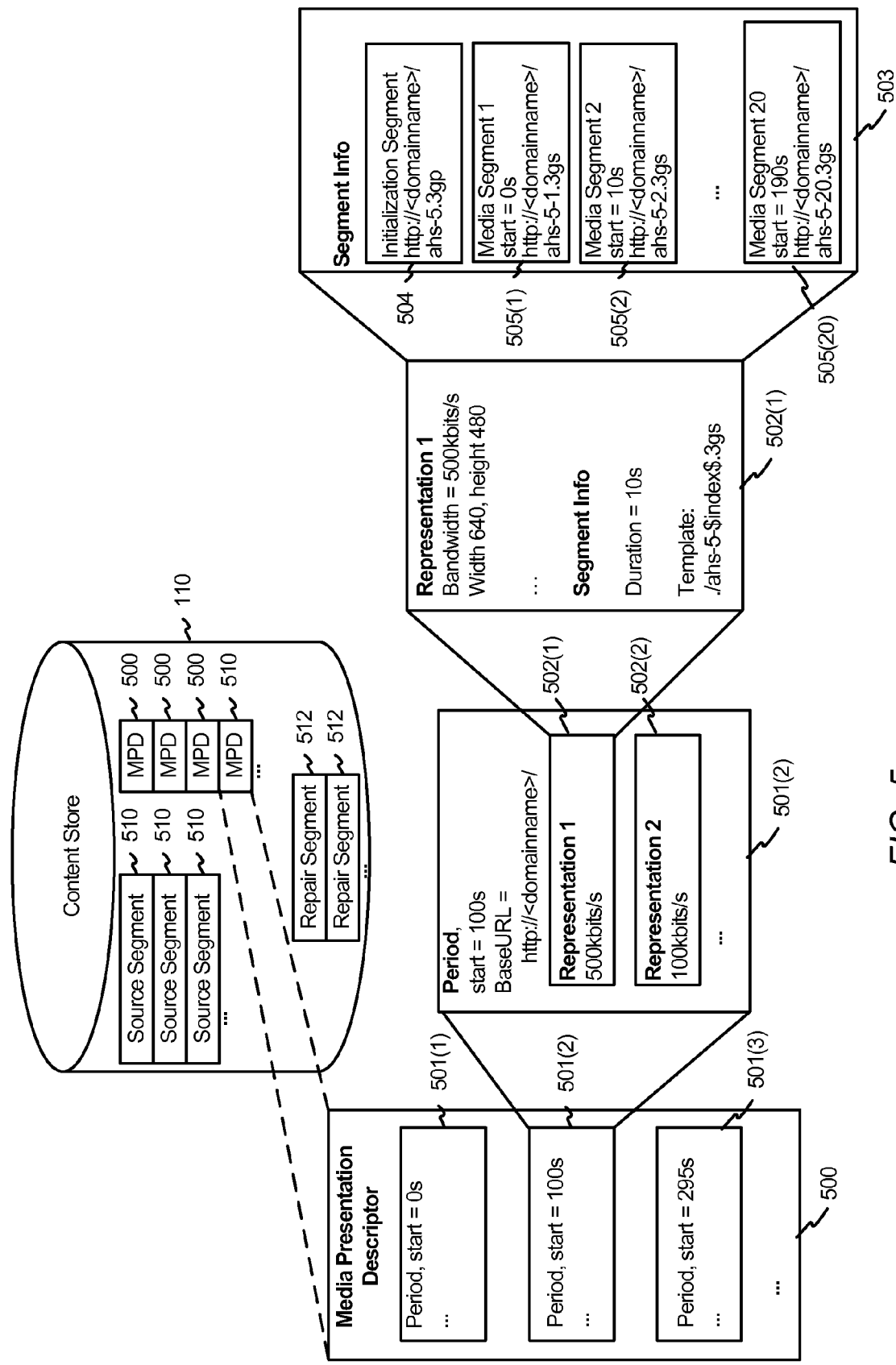
FIG. 5 illustrates possible structures of the content store shown in FIG. 1, including segments and media presentation descriptor ("MPD") files, and a breakdown of segments, timing, and other structure within an MPD file.

FIG. 5 illustrates possible structures of the content store shown in FIG. 1, including segments and media presentation description ("MPD") files, and a breakdown of segments, timing, and other structure within an MPD file. Details of possible implementations of MPD structures or files will now be described. In many examples, the MPD is described as a file, but non-file structures can be used as well.

As illustrated there, content store 110 holds a plurality of source segments 510, MPDs 500 and repair segments 512. An MPD might comprise period records 501, which in turn might comprise representation records 502, that contain segment information 503 such as references to initialization segments 504 and media segments 505.

Figure 9A:
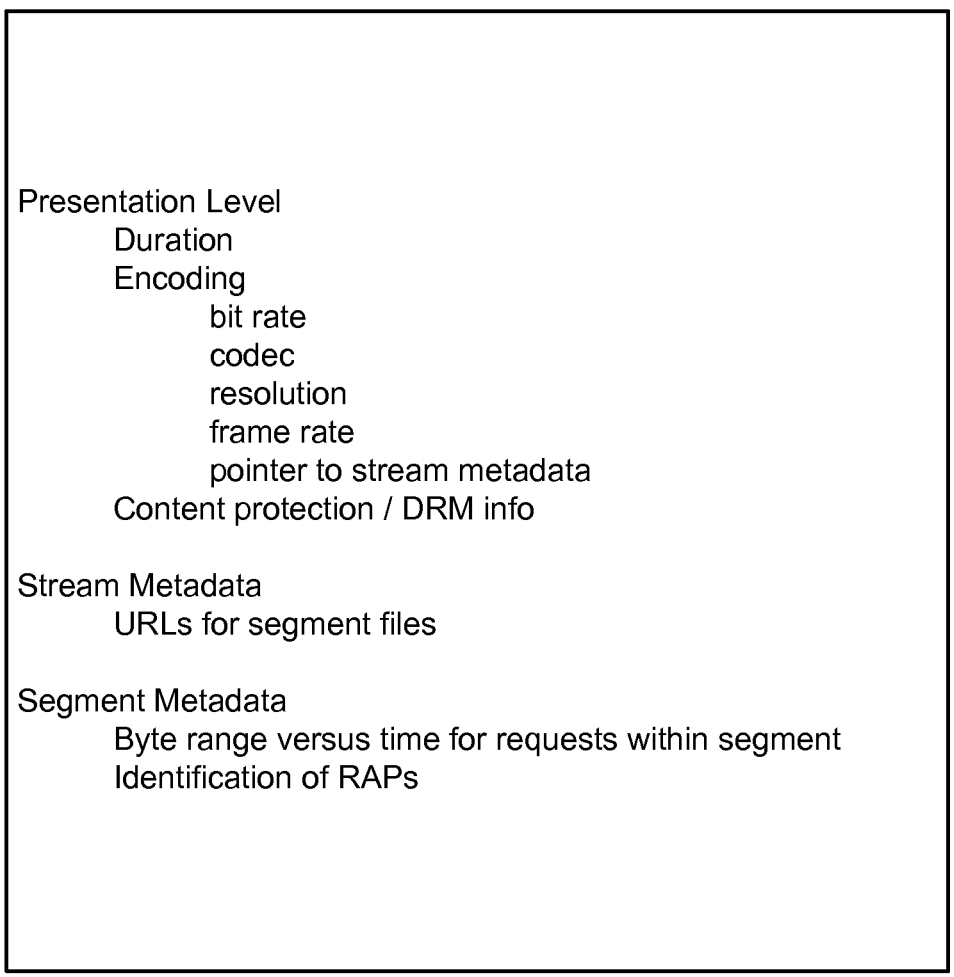
FIG. 9(a) illustrates a Metadata Table.
Figure 9B:
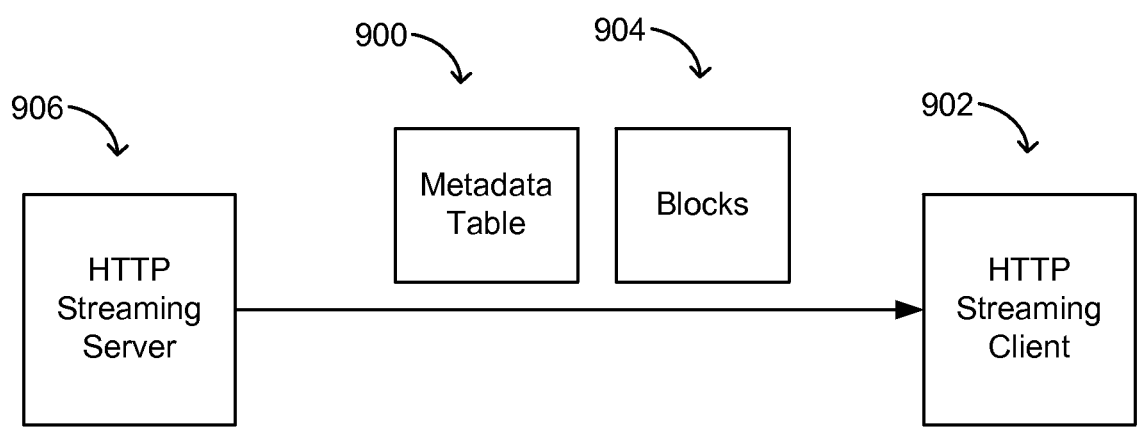
FIG. 9(b) illustrates the transmission of Blocks and Metadata Table from server to client.

FIG. 9(a) illustrates an example metadata table 900, while FIG. 9(b) illustrates an example of how an HTTP streaming client 902 obtains metadata table 900 and media blocks 904 over a connection to an HTTP streaming server 906.

In the methods described herein, a "Media Presentation Description" is provided that comprises information regarding the representations of the media presentation that are available to the client. Representations may be alternatives in a sense that the client selects one out the different alternatives, or they may be complementary in a sense that the client selects several of the representations, each possibly also from a set of alternatives, and presents them jointly. The representations may advantageously be assigned to groups, with the client programmed or configured to understand that, for representations in one group, they are each alternatives to each other, whereas representations from different groups are such that more than one representation is to be presented jointly. In other words, if there are more than one representation in a group, the client picks one representation from that group, one representation from the next group, etc., to form a presentation.

Information describing representations may advantageously include details of the applied media codecs including profiles and levels of those codecs which are required to decode the representation, video frame rates, video resolution and data rates. The client receiving the Media Presentation Description may use this information to determine in advance whether a representation is suitable for decoding or presentation. This represents an advantage because if the differentiating information would only be contained in the binary data of the representation it would be necessary to request the binary data from all representations and to parse and extract the relevant information in order to discover information about its suitability. These multiple requests and the parsing annex extraction of the data may take some time which would result in a long start up time and therefore a poor user experience.

Additionally, the Media Presentation Description may comprise information restricting the client requests based on the time of day. For example for a live service the client may be restricted to requesting parts of the presentation which are close to the "current broadcast time". This represents an advantage since for live broadcast it may be desirable to purge data from the serving infrastructure for content that was broadcast more than a provided threshold before the current broadcast time. This may be desirable for the reuse of storage resources within the serving infrastructure. This may also be desirable depending on the type of service offered, e.g., in some cases a presentation may be made available only live because of a certain subscription model of receiving client devices, whereas other media presentations may be made available live and on-demand, and other presentations may be made available only live to a first class of client devices, only on-demand to a second class of client devices, and a combination of either live or on-demand to a third class of client devices. The methods described in the Media Presentation Data Model (below) allow the client to be informed of such policies so that the client can avoid making requests and adjusting the offerings to the user, for data that may not be available in the serving infrastructure. As an alternative, for example, the client may present a notification to the user that this data is not available.

In a further embodiment of the invention the media segments may be compliant to the ISO Base Media File Format described in ISO/IEC 14496-12 or derived specifications (such as the 3GP file format described in 3GPP Technical Specification 26.244). The Usage of 3GPP File Format section (above) describes novel enhancements to the ISO Base Media File Format permitting efficient use of the data structures of this file format within a block-request streaming system. As described in this reference, information may be provided within the file permitting fast and efficient mapping between time segments of the media presentation and byte ranges within the file. The media data itself may be structured according to the Movie Fragment construction defined in ISO/IEC14496-12. This information providing time and byte offsets may be structured hierarchically or as a single block of information. This information may be provided at the start of the file. The provision of this information using an efficient encoding as described in the Usage of 3GPP File Format section results in the client being able to retrieve this information quickly, for example using an HTTP partial GET requests, in the case that the file download protocol used by the block request streaming system is HTTP, which results in a short start up, seek or stream switch time and therefore in an improved user experience.

The representations in a media presentation are synchronized in a global timeline to ensure seamless switching across representations, typically being alternatives, and to ensure synchronous presentation of two ore more representations. Therefore, sample timing of contained media in representations within an adaptive HTTP streaming media presentation can be related to a continuous global timeline across multiple segments.

Figure 10:
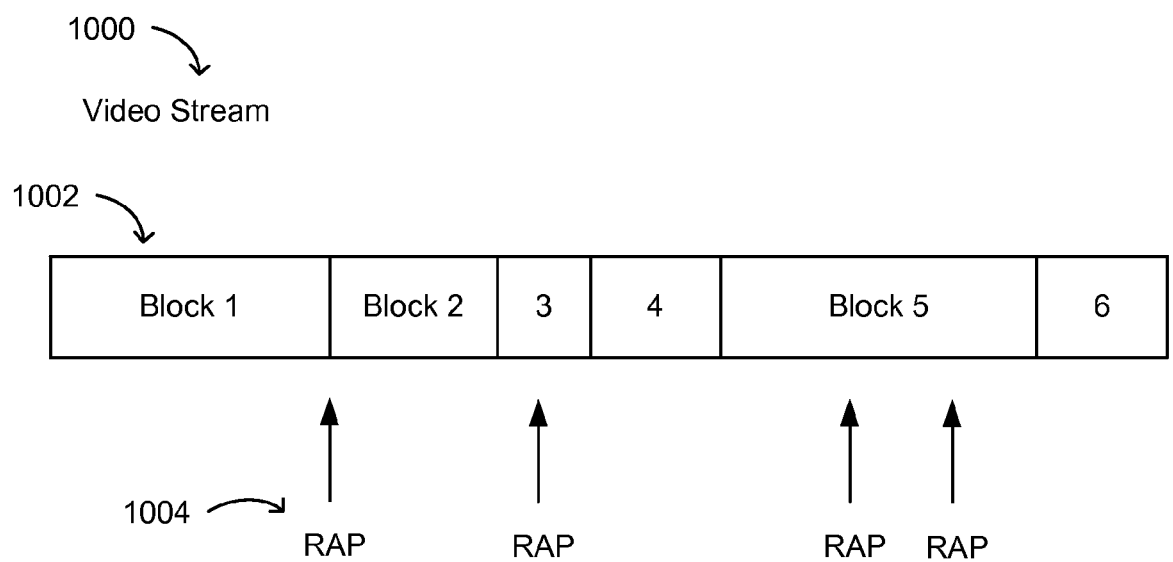
FIG. 10 illustrates blocks that are independent of random access point (RAP) boundaries.

A block of encoded media containing media of multiple types, for example audio and video, may have different presentation end times for the different types of media. In a block request streaming system, such media blocks may be played out consecutively in such a way that each media type is played continuously and thus media samples of one type from one block may be played out before media samples of another type of the preceding block, which is referred to herein as "continuous block splicing." As an alternative, such media blocks may be played out in such a way that the earliest sample of any type of one block is played after the latest sample of any type of the preceding block, which is referred to herein as "discontinuous block splicing." Continuous block splicing may be appropriate when both blocks contain media from the same content item and the same representation, encoded in sequence, or in other cases. Typically, within one representation continuous block splicing may be applied when splicing two blocks. This is advantageous as existing encoding can be applied and segmentation can be done without needing to align media tracks at block boundaries. This is illustrated in FIG. 10, where video stream 1000 comprises block 1002 and other blocks, with RAPs such as RAP 1004.

Media Presentation Description

A media presentation may be viewed as a structured collection of files on an HTTP-Streaming server. The HTTP-Streaming client can download sufficient information to present the streaming service to the user. Alternative representations may comprise of one or more 3GP files or parts of 3GP files conforming to the 3GPP file format or at least to a well defined set of data structures that can be easily converted from or to a 3GP file.

A media presentation may be described by a media presentation description. The Media Presentation Description (MPD) may contain metadata that the client can use to construct appropriate file requests, for example HTTP GET requests, to access the data at appropriate time and to provide the streaming service to the user. The media presentation description may provide sufficient information for the HTTP streaming client to select the appropriate 3GPP files and pieces of files. The units that are signalled to the client to be accessible are referred to as segments.

Among others, a media presentation description may contain elements and attributes as follows.

MediaPresentationDescription Element

An Element encapsulating metadata used by the HTTP Streaming Client to provide the streaming service to the end user. The MediaPresentationDescription Element may contain one or more of the following attributes and elements.

Version: Version number for protocol to ensure extensibility.

PresentationIdentifier: Information such that the presentation may be uniquely identified among other presentations. May also contain private fields or names.

UpdateFrequency: Update frequency of the media presentation description, i.e. how often the client may reload the actual media presentation description. If not present, the media presentation may be static. Updating the media presentation may mean that the media presentation cannot be cached.

MediaPresentationDescriptionURI: Uniform Resource Identifier (URI) for dating the media presentation description.

Stream: Describes the type of the Stream or media presentation: video, audio, or text. A video stream type may contain audio and may contain text.

Service: Describes the service type with additional attributes. Service types may be live and on-demand. This may be used to inform the client that seeking and access beyond some current time is not permitted.

MaximumClientPreBufferTime: A maximum amount of time the client may pre-buffer the media stream. This timing may differentiate streaming from progressive download if the client is restricted to download beyond this maximum pre-buffer time. The value may not be present indicating that no restrictions in terms of pre-buffering may apply.

SafetyGuardIntervalLiveService: Information on the maximum turn-around time of a live service at the server. Provides an indication to the client what of information already accessible at the current time. This information may be necessary if the client and the server are expected to operate on UTC time and no tight time synchronization is provided.

TimeShiftBufferDepth: Information on how far back the client may move in a live service relative to the current time. By the extension of this depth, time-shift viewing and catch-up services may be permitted without specific changes in service provisioning.

LocalCachingPermitted: This flag indicates if the HTTP Client can cache the downloaded data locally after it has been played.

LivePresentationInterval: Contains time intervals during which the presentation may be available by specifying StartTimes and EndTimes. The StartTime indicates the start time of the services and the EndTime indicates the end-time of the service. If the EndTime is not specified, then the end time is unknown at current time and the UpdateFrequency may ensure that the clients gets access to the end-time before the actual end-time of the service.

OnDemandAvailabilityInterval: The presentation interval indicates the availability of the service on the network. Multiple presentation intervals may be provided. The HTTP Client may not be able to access the service outside any specified time window. By the provisioning of the OnDemand Interval, additional time-shift viewing may be specified. This attribute may also be present for a live service. In case it is present for a live service, the server may ensure that the client can access the service as OnDemand Service during all provided availability intervals. Therefore, the LivePresentationInterval may not overlap with any OnDemandAvailabilityInterval.

MPDFileInfoDynamic: Describes the default dynamic construction of files in the media presentation. More details are provided below. The default specification on MPD level may save unnecessary repetition if the same rules for several or all alternative representations are used.

MPDCodecDescription: Describes the main default codecs in the media presentation. More details are provided below. The default specification on MPD level may save unnecessary repetition if the same codecs for several or all representations are used.

MPDMoveBoxHeaderSizeDoesNotChange: A flag to indicate if the MoveBox Header changes in size among the individual files within the entire media presentation. This flag can be used to optimize the download and may only be present in case of specific segment formats, especially those for which segments contain the moov header.

FileURIPattern: A pattern used by the Client to generate Request messages for files within the media presentation. The different attributes permit generation of unique URIs for each of the files within the media presentation. The base URI may be an HTTP URI.

Alternative Representation: Describes a list of representations.

AlternativeRepresentation Element:

An XML Element that encapsulates all metadata for one representation. The AlternativeRepresentation Element may contain the following attributes and elements.

RepresentationID: A unique ID for this specific Alternative Representation within the media presentation.

FilesInfoStatic: Provides an explicit list of the starting times and the URI of all files of one alternative presentation. The static provisioning of the list of files may provide the advantage of an exact timing description of the media presentation, but it may not be as compact, especially if the alternative representation contains many files. Also, the file names may have arbitrary names.

FilesInfoDynamic: Provides an implicit way to construct the list of the starting times and the URI of one alternative presentation. The dynamic provisioning of the list of files may provide the advantage of a more compact representation. If only the sequence of starting times are provided, then the timing advantages also hold here, but the file names are to be constructed dynamically based in the FilePatternURI. If only the duration of each segment is provided then the representation is compact and may be suited for use within live services, but the generation of the files may be governed by global timing.

APMoveBoxHeaderSizeDoesNotChange: A flag that indicates if the MoveBox Header changes in size among the individual files within the Alternative Description. This flag can be used to optimize the download and may only be present in case of specific segment formats, especially those for which segments contain the moov header.

APCodecDescription: Describes the main codecs of files in the alternative presentation.

Media Description Element

MediaDescription: An element that may encapsulate all metadata for the media that is contained in this representation. Specifically it may contain information about the tracks in this alternative presentation as well as recommended grouping of tracks, if applicable. The MediaDescription Attribute contains the following attributes:

TrackDescription: An XML attribute that encapsulates all metadata for the media that is contained in this representation. The TrackDescription Attribute contains the following attributes:

TrackID: A unique ID for the track within the alternative representation. This may be used in case the track is part of a grouping description.

Bitrate: The bitrate of the track.

TrackCodecDescription: An XML attribute that contains all attributes on the codec used in this track. The TrackCodecDescription Attribute contains the following attributes:

MediaName: An attribute defining the media type. The media types include "audio", "video", "text", "application", and "message".

Codec: CodecType including profile and level.

LanguageTag: LanguageTag if applicable.

MaxWidth, MaxHeight: For video, Height and Width of contained video in pixel.

SamplingRate: For audio, sampling rate

GroupDescription: An attribute that provides recommendation to the client for appropriate grouping based on different parameters.

GroupType: A type based on which the client may decide how to group tracks.

The information in a media presentation description is advantageously used by an HTTP streaming client to perform requests for files/segments or parts thereof at appropriate times, selecting the segments from adequate representations that match its capabilities, for example in terms of access bandwidth, display capabilities, codec capabilities, and so on as well as preferences of the user such as language, and so on. Furthermore, as the Media Presentation description describes representations that are time-aligned and mapped to a global timeline, the client may also use the information in the MPD during an ongoing media presentation for initiating appropriate actions to switch across representations, to present representations jointly or to seek within the media presentation.

Signalling Segment Start Times

A representation may be split, timewise, into multiple segments. An inter-track timing issue exists between the last fragment of one segment and the next fragment of the next segment. In addition, another timing issue exists in the case that segments of constant duration are used.

Using the same duration for every segment may have the advantage that the MPD is both compact and static. However, every segment may still begin at a Random Access Point. Thus, either the video encoding may be constrained to provide Random Access Points at these specific points, or the actual segment durations may not be precisely as specified in the MPD. It may be desirable that the streaming system does not place unnecessary restrictions on the video encoding process and so the second option may be preferred.

Specifically, if the file duration is specified in the MPD as d seconds, then the n-th file may begin with the Random Access Point at or immediately following time (n−1)d.

In this approach, each file may include information as to the exact start time of the segment in terms of global presentation time. Three possible ways to signal this include:

(1) First, restrict the start time of each segment to the exact timing as specified in the MPD. But then the media encoder may not have any flexibility on the placement of the IDR frames and may require special encoding for file streaming.

(2) Second, add the exact start time to the MPD for each segment. For the on-demand case, the compactness of MPD may be reduced. For the live case, this may require a regular update of the MPD, which may reduce scalability.

(3) Third, add the global time or the exact start time relative to the announced start time of the representation or the announced start time of the segment in the MPD to the segment in a sense that the segment contains this information. This might be added to a new box dedicated to adaptive streaming. This box may also include the information as provided by the "TIDX" or "SIDX" box. A consequence of this third approach is that when seeking to a particular position near the beginning of one of the segments the client may, based on the MPD, choose the subsequent segment to the one containing the required seek point. A simple response in this case may be to move the seek point forward to the start of the retrieved segment (i.e., to the next Random Access Point after the seek point). Usually, Random Access Points are provided at least every few seconds (and often there is little encoding gain from making them less frequent) and so in the worst case the seek point may be moved to be a few seconds later than specified. Alternatively, the client could determine in retrieving the header information for the segment that the requested seek point is in fact in the previous segment and request that segment instead. This may result in an occasional increase in the time required to execute the seek operation.

Accessible Segments List

The media presentation comprises a set of representations each providing some different version of encoding for the original media content. The representations themselves advantageously contain information on the differentiating parameters of the representation compared to other parameters. They also contain, either explicitly or implicitly, a list of accessible segments.

Segments may be differentiated in time-less segments containing metadata only and media segments that primarily contain media data. The Media Presentation Description ("MPD") advantageously identifies and assigns different attributes to each of the segments, either implicitly or explicitly. Attributes advantageously assigned to each segment comprise the period during which a segment is accessible, the resources and protocols through which the segments are accessible. In addition, media segments are advantageously assigned attributes such as the start time of the segment in the media presentation, and the duration of the segment in the media presentation.

Where the media presentation is of type "on-demand", as advantageously indicated by an attribute in the media presentation description such as the OnDemandAvailabilityInterval, then the media presentation description typically describes the entire segments and also provides indication when the segments are accessible and when the segments are not accessible. The start times of segments are advantageously expressed relative to the start of the media presentation such that two clients starting the play-back of the same media presentations, but at different times, can use the same media presentation description as well as the same media segments. This advantageously improves the ability to cache the segments.

Where the media presentation is of type "live", as advantageously indicated by an attribute in the media presentation description such as the attribute Service, then the segments comprising the media presentation beyond the actual time of day are generally not generated or at least not accessible despite the segments are fully described in the MPD. However, with the indication that the media presentation service is of type "live", the client may produce a list of accessible segments along with the timing attributes for a client internal time NOW in wall-clock time based on the information contained in the MPD and the download time of the MPD. The server advantageously operates in a sense that it makes resource accessible such that a reference client operating with the instance of the MPD at wall-clock time NOW can access the resources.

Specifically, the reference client produces a list of accessible segments along with the timing attributes for a client internal time NOW in wall-clock time based on the information contained in the MPD and the download time of the MPD. With time advancing, the client will use the same MPD and will create a new accessible segment list that can be used to continuously playout the media presentation. Therefore, the server can announce segments in an MPD before these segments are actually accessible. This is advantageous, as it reduces frequent updating and downloading of the MPD.

Assume that a list of segments, each with start time, tS, is described either explicitly by a play list in elements such as FileInfoStatic or implicitly by using an element such as FileInfoDynamic. An advantageous method to generate a segment list using FileInfoDynamic is described below. Based on this construction rule, the client has access to a list of URIs for each representation, r, referred to herein as FileURI(r,i), and a start time tS(r,i) for each segment with index i.

The use of information in the MPD to create the accessible time window of segments may be performed using the following rules.

For a service of type "on-demand", as advantageously indicated by an attribute such as Service, if the current wall-clock time at the client NOW is within any range of the availability, advantageously expressed by an MPD element such as OnDemandAvailabilityInterval, then all described segments of this On-Demand presentation are accessible. If the current wall-clock time at the client NOW is outside any range of the availability, then none of the described segments of this On-Demand presentation are accessible.

For a service of type "live", as advantageously indicated by an attribute such as Service, the start time tS(r,i) advantageously expresses the time of availability in wall-clock time. The availability start time may be derived as a combination of the live service time of the event and some turn-around time at the server for capturing, encoding, and publishing. The time for this process may, for example, be specified in the MPD, for example using a safety guard interval tG specified for example specified as SafetyGuardIntervalLiveService in the MPD. This would provide the minimum difference between UTC time and the availability of the data on the HTTP streaming server. In another embodiment, the MPD explicitly specifies the availability time of the segment in the MPD without providing the turn-around time as a difference between the event live time and the turn-around time. In the following descriptions, it is assumed that any global times are specified as availability times. One or ordinary skill in art of live media broadcasting can derive this information from suitable information in the media presentation description after reading this description.

If the current wall-clock time at the client NOW is outside any range of the live presentation interval, advantageously expressed by an MPD element such as LivePresentationInterval, then none of the described segments of this live presentation are accessible. If the current wall-clock time at the client NOW is within the live presentation interval then at least certain segments of the described segments of this live presentation may be accessible.

The restriction of the accessible segments is governed by the following values:

The wall-clock time NOW (as available to the client).

The permitted time-shift buffer depth tSB for example specified as TimeShiftBufferDepth in the media presentation description.

A client at relative event time $t_1$ may only be allowed to request segments with start times tS(r, i) in the interval of (NOW-tTSB) and NOW or in an interval such that the end time of the segment with duration d is also included resulting in an interval of (NOW-tTSB-d) and NOW.

Updating the MPD

In some embodiments, the server does not know in advance the file or segment locator and start times of the segments as for example the server location will change, or the media presentation includes some advertisement from a different server, or the duration of the media presentation is unknown, or the server wants to obfuscate the locator for the following segments.

In such embodiments, the server might only describe segments that are already accessible or get accessible shortly after this instance of the MPD has been published. Furthermore, in some embodiments, the client advantageously consumes media close to the media described in the MPD such that the user experiences the contained media program as close as possible to the generation of the media content. As soon as the client anticipates that it reaches the end of the described media segments in the MPD, it advantageously requests a new instance of the MPD to continue continuous play-out in the expectation that the server has published a new MPD describing new media segments. The server advantageously generates new instances of the MPD and updates the MPD such that clients can rely on the procedures for continuous updates. The server may adapt its MPD update procedures along with the segment generation and publishing to the procedures of a reference client that acts as a common client may act.

If a new instance of the MPD only describes a short time advance, then the clients need to frequently request new instances of MPD. This may result in scalability problems and unnecessary uplink and downlink traffic due to unnecessary frequent requests.

Therefore, it is relevant on the one hand to describe segments as far as possible into the future without necessarily making them accessible yet, and on the other hand to enable unforeseen updates in the MPD to express new server locations, permit insertion of new content such as advertisements or to provide changes in codec parameters.

Furthermore, in some embodiments, the duration of the media segments may be small, such as in the range of several seconds. The duration of media segments is advantageously flexible to adjust to suitable segment sizes that can be optimized to delivery or caching properties, to compensate for end-to-end delay in live services or other aspects that deal with storage or delivery of segments, or for other reasons. Especially in cases where the segments are small compared to the media presentation duration, then a significant amount of media segment resources and start times need to be described in the media presentation description. As a result, the size of the media presentation description may be large which may adversely affect the download time of the media presentation description and therefore affect the start-up delay of the media presentation and also the bandwidth usage on the access link. Therefore, it is advantageous to not only permit the description of a list of media segments using playlists, but also permit the description by using templates or URL construction rules. Templates and URL construction rules are used synonymously in this description.

In addition, templates may advantageously be used to describe segment locators in live cases beyond the current time. In such cases, updates of the MPD are per se unnecessary as the locators as well as the segment list are described by the templates. However, unforeseen events may still happen that require changes in the description of the representations or the segments. Changes in an adaptive HTTP streaming media presentation description may be needed when content from multiple different sources is spliced together, for example, when advertising has been inserted. The content from different sources may differ in a variety of ways. Another reason, during live presentations, is that it may be necessary to change the URLs used for content files to provide for fail-over from one live origin server to another.

In some embodiments, it is advantageous that if the MPD is updated, then the updates to the MPD are carried out such that the updated MPD is compatible with the previous MPD in the following sense that the reference client and therefore any implemented client generates an identically functional list of accessible segments from the updated MPD for any time up to the validity time of the previous MPD as it would have done from the previous instance of the MPD. This requirement ensures that (a) clients may immediately begin using the new MPD without synchronisation with the old MPD, since it is compatible with the old MPD before the update time; and (b) the update time need not be synchronised with the time at which the actual change to the MPD takes place. In other words, updates to the MPD can be advertised in advance and the server can replace the old instance of the MPD once new information is available without having to maintain different versions of the MPD.

Two possibilities may exist for media timing across an MPD update for a set of representations or all representations. Either (a) the existing global timeline continues across the MPD update (referred to herein as a "continuous MPD update"), or (b) the current timeline ends and a new timeline begins with the segment following the change (referred to herein as a "discontinuous MPD update").

The difference between these options may be evident when considering that the tracks of a Media Fragment, and hence of a Segment, generally do not begin and end at the same time because of the differing sample granularity across tracks. During normal presentation, samples of one track of a fragment may be rendered before some samples of another track of the previous fragment i.e. there is some kind of overlap between fragments although there is may not be overlap within a single track.

The difference between (a) and (b) is whether such overlap may be enabled across an MPD update. When the MPD update is because of splicing of completely separate content, such overlap is generally difficult to achieve as the new content needs new encoding to be spliced with the previous content. It is therefore advantageous to provide the ability for discontinuously updating the media presentation by restarting the timeline for certain segments and possibly also define a new set of representations after the update. Also, if the content has been independently encoded and segmented, then it is also avoided to adjust timestamps to fit within the global timeline of the previous piece of content.

When the update is for lesser reasons such as only adding new media segments to list of described media segments, or if the location of the URLs is changed then overlap and continuous updates may be allowed.

In the case of a discontinuous MPD update, the timeline of the last segment of the previous representation ends at the latest presentation end time of any sample in the segment. The timeline of the next representation (or, more accurately, the first presentation time of the first media segment of the new part of the media presentation, also referred to as new period) typically and advantageously begins at this same instant as the end of the presentation of the last period such that seamless and continuous playout is ensured.

The two cases are illustrated in the FIG. 11.

It is preferred and advantageous to restrict MPD updates to segment boundaries. The rationale for restricting such changes or updates to segment boundaries is as follows. First, changes to the binary metadata for each representation, typically the Movie Header, may take place at least at segment boundaries. Second, the Media Presentation Description may contain the pointers (URLs) to the segments. In a sense the MPD is the "umbrella" data structure grouping together all the segment files associated with the media presentation. To maintain this containment relationship, each segment may be referenced by a single MPD and when the MPD is updated, it advantageously only updated at a segment boundary.

Segment boundaries are not generally required to be aligned, however for the case of content spliced from different sources, and for discontinuous MPD updates generally, it makes sense to align the segment boundaries (specifically, that the last segment of each representation may end at the same video frame and may not contain audio samples with a presentation start time later than the presentation time of that frame). A discontinuous update may then start a new set of representations at a common time instant, referred to as period. The start time of the validity of this new set of representations is provided, for example by a period start time. The relative start time of each representation is reset to zero and the start time of the period places the set of representations in this new period in the global media presentation timeline.

For continuous MPD updates, segment boundaries are not required to be aligned. Each segment of each alternative representation may be governed by a single Media Presentation Description and thus the update requests for a new instances of the Media Presentation Description, generally triggered by the anticipation that no additional media segments are described in the operating MPD, may take place at different times depending on the consumed set of representations including the set of representations that are anticipated to be consumed.

To support updates in MPD elements and attributes in a more general case, any elements not only representations or set of representations may be associated with a validity time. So, if certain elements of the MDP need to be updated, for example where the number of representations is changed or the URL construction rules are changed, then these elements may each be updated individually at specified times, by providing multiple copies of the element with disjoint validity times.

Validity is advantageously associated with the global media time, such that the described element associated with a validity time is valid in a period of the global timeline of the media presentation.

As discussed above, in one embodiment, the validity times are only added to a full set of representations. Each full set then forms a period. The validity time then forms the start time of the period. In other words, in a specific case of the using the validity element, a full set of representations may be valid for a period in time, indicated by a global validity time for a set of representations. The validity time of a set of representations is referred to as a period. At the start of a new period, the validity of the previous set representation is expired and the new set of representations is valid. Note again that the validity times of periods are preferably disjoint.

As noted above, changes to the Media Presentation Description take place at segment boundaries, and so for each representation, the change an element actually takes place at the next segment boundary. The client may then form a valid MPD including a list of segments for each instant of time within the presentation time of the media.

Discontinuous block splicing may be appropriate in cases where the blocks contain media data from different representations, or from different content, for example from a segment of content and an advertisement, or in other cases. It may be required in a block request streaming system that changes to presentation metadata take place only at block boundaries. This may be advantageous for implementation reasons because updating media decoder parameters within a block may be more complex than updating them only between blocks. In this case, it may advantageously be specified that validity intervals as described above may be interpreted as approximate, such that an element is considered valid from the first block boundary not earlier than the start of the specified validity interval to the first block boundary not earlier than the end of the specified validity interval.

An example embodiment of the above describes novel enhancements to a block-request streaming system is described in the later presented section titled Changes to Media Presentations.

Segment Duration Signalling

Discontinuous updates effectively divide the presentation into a series of disjoint intervals, referred to as period. Each period has its own timeline for media sample timing. The media timing of representation within a period may advantageously be indicated by specifying a separate compact list of segment durations for each period or for each representation in a period.

An attribute, for example referred to as period start time, associated to elements within the MPD may specify the validity time of certain elements within the media presentation time. This attribute may be added to any elements (attributes that may get assigned a validity may be changed to elements) of the MPD.

For discontinuous MPD updates the segments of all representations may end at the discontinuity. This generally implies at least that the last segment before the discontinuity has a different duration from the previous ones. Signalling segment duration may involve indicating either that all segments have the same duration or indicating a separate duration for every segment. It may be desirable to have a compact representation for a list of segment durations which is efficient in the case that many of them have the same duration.

Durations of each segment in one representation or a set of representations may advantageously be carried out with a single string that specifies all segment durations for a single interval from the start of the discontinuous update, i.e., the start of the period until the last media segment described in the MPD. In one embodiment, the format of this element is a text string conforming to a production that contains a list of segment duration entries where each entry contains a duration attribute dur and an optional multiplier mull of the attribute indicating that this representation contains <mult> of the first entry segments of duration <dur> of the first entry, then <mult> of the second entry segments of duration <dur> of the second entry and so on.

Each duration entry specifies the duration of one or more segments. If the <dur> value is followed by the "*" character and a number, then this number specifies the number of consecutive segments with this duration, in seconds. If the multiplier sign "*" is absent, the number of segments is one. If the "*" is present with no following number, then all subsequent segments have the specified duration and there may be no further entries in the list. For example, the string "30*" means all segments have a duration of 30 seconds. The string "30*12 10.5" indicates 12 segments of duration 30 seconds, followed by one of duration 10.5 seconds.

If segment durations are specified separately for each alternative representation, then the sum of segment durations within each interval may be the same for each representation. In the case of video tracks, the interval may end on the same frame in each alternative representation.

Those of ordinary skill in the art, upon reading this disclosure, may find similar and equivalent ways to express segment durations in a compact manner.

In another embodiment, the duration of a segment is signalled to be constant for all segments in the representation except for the last one by a signal duration attribute <duration>. The duration of the last segment before a discontinuous update may be shorter as long as the start point of the next discontinuous update or the start of a new period is provided, which then implies the duration of the last segment reaching up to the start of the next period.

Changes and Updates to Representation Metadata

Indicating changes of binary coded representation metadata such as movie header "moov" changes may be accomplished in different ways: (a) there may be one moov box for all representation in a separate file referenced in the MPD, (b) there may be one moov box for each alternative representation in a separate file referenced in each Alternative Representation, (c) each segment may contain a moov box and is therefore self-contained, (d) there may be a moov Box for all representation in one 3GP file together with MPD.

Note that in case of (a) and (b), the single 'moov' may be advantageously combined with the validity concept from above in a sense that more 'moov' boxes may be referenced in an MPD as long as their validity is disjoint. For example, with the definition of a period boundary, the validity of the 'moov' in the old period may expire with the start of the new period.

In case of option (a), the reference to the single moov box may be assigned a validity element. Multiple Presentation headers may be allowed, but only one may be valid at a time. In another embodiment, the validity time of the entire set of representations in a period or the entire period as defined above may be used as a validity time for this representation metadata, typically provided as the moov header.

In case of option (b), the reference to the moov box of each representation may be assigned a validity element. Multiple Representation headers may be allowed, but only one may be valid at a time. In another embodiment, the validity time of the entire representation or the entire period as defined above may be used as a validity time for this representation metadata, typically provided as the moov header.

In case of options (c), no signalling in the MPD may be added, but additional signalling in the media stream may be added to indicate if the moov box will change for any of the upcoming segments. This is further explained in the below in the context of "Signaling Updates Within Segment Metadata".

Signaling Updates within Segment Metadata

To avoid frequent updates of the media presentation description to get knowledge on potential updates, it is advantageous to signal any such updates along with the media segments. There may be provided an additional element or elements within the media segments themselves which may indicate that updated metadata such as the media presentation description is available and has to be accessed to within a certain amount of time to successfully continue creation of accessible segment lists. In addition, such elements may provide a file identifier, such as a URL, or information that may be used to construct a file identifier, for the updated metadata file. The updated metadata file may include metadata equal to that provided in the original metadata file for the presentation modified to indicate validity intervals together with additional metadata also accompanied by validity intervals. Such an indication may be provided in media segments of all the available representations for a media presentation. A client accessing a block request streaming system, on detecting such an indication within a media block, may use the file download protocol or other means to retrieve the updated metadata file. The client is thereby provided with information about changes in the media presentation description and the time at which they will occur or have occurred. Advantageously, each client requests the updated media presentation description only once when such a changes occur rather than "polling" and receiving the file many times for possible updates or changes.

Examples of changes include addition or removal of representations, changes to one or more representation such as change in bit-rate, resolution, aspect ratio, included tracks or codec parameters, and changes to URL construction rules, for example a different origin server for an advertisement. Some changes may affect only the initialization segment such as the Movie Header ("moov") atom associated with a representation, whereas other changes may affect the Media Presentation Description (MPD).

In the case of on-demand content, these changes and their timing may be known in advance and could be signalled in the Media Presentation Description.

For live content, changes may not be known until the point at which they occur. One solution is to allow the Media Presentation Description available at a specific URL to be dynamically updated and to require clients to regularly request this MPD in order to detect changes. This solution has disadvantage in terms of scalability (origin server load and cache efficiency). In a scenario with large numbers of viewers, caches may receive many requests for the MPD after the previous version has expired from cache and before the new version has been received and all of these may be forwarded to the origin server. The origin server may need to constantly process requests from caches for each updated version of the MPD. Also, the updates may not easily be time-aligned with changes in the media presentation.

Since one of the advantages of HTTP Streaming is the ability to utilise standard web infrastructure and services for scalability, a preferred solution may involve only "static" (i.e. cachable) files and not rely on clients "polling" files to see if they have changed.

Solutions are discussed and proposed to resolve the update of metadata including the media presentation description and binary representation metadata such as "moov" atoms in an Adaptive HTTP Streaming media presentation.

For the case of live content, the points at which the MPD or "moov" may change might not be known when the MPD is constructed. As frequent "polling" of the MPD to check for updates should generally be avoided, for bandwidth and scalability reasons, updates to the MPD may be indicated "in band" in the segment files themselves, i.e., each media segment may have the option to indicate updates. Depending on the segment formats (a) to (c) from above, different updating may be signalled.

Generally, the following indication may advantageously be provided in a signal within the segment: an indicator that the MPD may be updated before requesting the next segment within this representation or any next segment that has start time greater than the start time of the current segment. The update may be announced in advance indicating that the update need only to happen at any segment later than the next one. This MPD update may also be used to update binary representation metadata such as Movie Headers in case the locator of the media segment is changed. Another signal may indicate that with the completion of this segment, no more segments that advance time should be requested.

In case segments are formatted according to the segment format (c), i.e., each media segment may contain self-initialising metadata such as the movie header, then yet another signal may be added indicating that the subsequent segment contains an updated Movie Header (moov). This advantageously allows the movie header to be included in the segment, but the Movie Header need only be requested by the client if the previous segment indicates a Movie Header Update or in the case of seeking or random access when switching representations. In other cases, the client may issue a byte range request to the segment that excludes the movie header from the download, therefore advantageously saving bandwidth.

In yet another embodiment, if the MPD Update indication is signalled, then the signal may also contain a locator such as URL for the updated Media Presentation Description. The updated MPD may describe the presentation both before and after the update, using the validity attributes such as a new and old period in case of discontinuous updates. This may advantageously be used to permit time-shift viewing as described further below but also advantageously allows the MPD update to be signalled at any time before the changes it contains take effect. The client may immediately download the new MPD and apply it to the ongoing presentation.

In a specific realization, the signalling of the any changes to the media presentation description, the moov headers or the end of presentation may be contained in a streaming information box that is formatted following the rules of the segment format using the box structure of the ISO base media file format. This box may provide a specific signal for any of the different updates.

Streaming Information Box
Definition
Box Type: 'sinf'
Container: None
Mandatory: No
Quantity: Zero or one.

The Streaming Information Box contains information about the streaming presentation of which the file is a part.
Syntax

```
aligned(8) class StreamingInformationBox
    extends FullBox('sinf') {
    unsigned int(32) streaming_information_flags;
        /// The following are optional fields
        string mpd_location
}
```

Semantics
streaming_information_flags contains the logical OR of zero or more of the following:
0x00000001 Movie Header update follows
0x00000002 Presentation Description update
0x00000004 End-of-presentation
mpd_location is present if and only if the Presentation Description update flags is set and provides a Uniform Resource Locator for the new Media Presentation Description.

Example Use Case for MPD Updates for Live Services

Suppose a service provider wants to provide a live football event using the enhanced block-request streaming described herein. Perhaps millions of users might want to access the presentation of the event. The live event is sporadically interrupted by breaks when a time out is called, or other lull in the action, during which advertisements might be added. Typically, there is no or little advance notice of the exact timing of the breaks.

The service provider might need to provider redundant infrastructure (e.g., encoders and servers) to enable a seamless switch-over in case any of the components fail during the live event.

Suppose a user, Anna, accesses the service on a bus with her mobile device, and the service is available immediately. Next to her sits another user, Paul, who watches the event on his laptop. A goal is scored and both celebrate this event at the same time. Paul tells Anna that the first goal in the game was even more exciting and Anna uses the service so that she can view the event 30 minutes back in time. After having seen the goal, she goes back to the live event.

To address that use case, the service provider should be able to update the MPD, signal to the clients that an updated MPD is available, and permit clients to access the streaming service such that it can present the data close to real-time.

Updating of the MPD is feasible in an asynchronous manner to the delivery of segments, as explained herein elsewhere. The server can provide guarantees to the receiver that an MPD is not updated for some time. The server may rely on the current MPD. However, no explicit signaling is needed when the MPD is updated before the some minimum update period.

Completely synchronous playout is hardly achieved as client may operate on different MPD update instances and therefore, clients may have drift. Using MPD updates, the server can convey changes and the clients can be alerted to changes, even during a presentation. In-band signaling on a segment-by-segment basis can be used to indicate the update of the MPD, so updates might be limited to segment boundaries, but that should be acceptable in most applications.

An MPD element can be added that provides the publishing time in wall-clock time of the MPD as well as an optional MPD update box that is added at the beginning of segments to signal that an MPD update is required. The updates can be done hierarchically, as with the MPDs.

The MPD "Publish time" provides a unique identifier for the MPD and when the MPD was issued. It also provides an anchor for the update procedures.

The MPD update box might be found in the MPD after the "styp" box, and defined by a Box Type="mupe", needing no container, not being mandatory and having a quantity of zero or one. The MPD update box contains information about the media presentation of which the segment is a part.

Example syntax is as follows:

```
aligned(8) class MPDUpdateBox
extends FullBox('mupe') {
  unsigned int(3) mpd information flags;
  unsigned int(1) new-location flag;
  unsigned int(28) latest_mpd_update time;
  /// The following are optional fields
  string mpd_location
}
```

The semantics of the various objects of the class MPDUpdateBox might be as follows:
 mpd_information_flags: the logical OR of zero or more of the following:
  0x00 Media Presentation Description update now
  0x01 Media Presentation Description update ahead
  0x02 End-of-presentation
  0x03-0x07 Reserved
 new_location flag: if set to 1, then the new Media Presentation Description is available at a new location specified in mpd_location.
 latest_mpd_update time: specifies the time (in ms) by when the MPD update is necessary relative to the MPD issue time of the latest MPD. The client may choose to update the MPD any time between now.
 mpd_location: is present if and only if the new_location_flag is set and if so, mpd_location provides a Uniform Resource Locator for the new Media Presentation Description.

If the bandwidth used by updates is an issue, the server may offer MPDs for certain device capabilities such that only these parts are updated.

Time-Shift Viewing and Network PVR

When time-shift viewing is supported, it may happen that for the life-time of the session two or more MPDs or Movie Headers are valid. In this case by updating the MPD when necessary, but adding the validity mechanism or the period concept, a valid MPD may exist for the entire time-window. This means that server may ensure that any MPD and Movie header are announced for any period of time that is within the valid time-window for time-shift viewing. It is up to the client to ensure that its available MPD and metadata for its current presentation time is valid. Migration of a live session to a network PVR session using only minor MPD updates may also be supported.

Special Media Segments

An issue when the file format of ISO/IEC 14496-12 is used within a block request streaming system is that, as described in the foregoing, it may be advantageous to store the media data for a single version of the presentation in multiple files, arranged in consecutive time segments. Furthermore it may be advantageous to arrange that each file begins with a Random Access Point. Further it may be advantageous to choose the positions of the seek points during the video encoding process and to segment the presentation into multiple files each beginning with a seek point based on the choice of seek points that was made during the encoding process, wherein each Random Access Point may or may not be placed at the beginning of a file but wherein each file begins with a Random Access Point. In one embodiment with the properties described above, the presentation metadata, or Media Presentation Description, may contain the exact duration of each file, where duration is taken for example to mean the different between the start time of the video media of a file and the start time of the video media of the next file. Based on this information in the presentation metadata the client is able to construct a mapping between the global timeline for the media presentation and the local timeline for the media within each file.

In another embodiment, the size of the presentation metadata may be advantageously reduced by specifying instead that every file or segment have the same duration. However in this case and where media files are constructed according to the method above the duration of each file may not be exactly equal to the duration specified in the media presentation description because a Random Access Point may not exist at the point which is exactly the specified duration from the start of the file.

A further embodiment of the invention to provide for correct operation of the block-request streaming system despite the discrepancy mentioned above is now described. In this method there may be provided an element within each file which specifies the mapping of the local timeline of the media within the file (by which is meant the timeline starting from timestamp zero against which the decoding and composition timestamps of the media samples in the file are specified according to ISO/IEC 14496-12) to the global presentation timeline. This mapping information may comprise a single timestamp in global presentation time that corresponds to the zero timestamp in the local file timeline. The mapping information may alternatively comprise an offset value that specifies the difference between the global presentation time corresponding to the zero timestamp in local file timeline and the global presentation time corresponding to the start of the file according to the information provided in the presentation metadata.

Example for such boxes may for example be the track fragment decode time ('tfdt') box or the track fragment adjustment box ('tfad') together with the track fragment media adjustment ('tfma') box.

Example Client Including Segment List Generation

An example client will now be described. It might be used as a reference client for the server to ensure proper generation and updates of the MPD.

An HTTP streaming client is guided by the information provided in the MPD. It is assumed that the client has access to the MPD that it received at time T, i.e., the time it was able to successfully receive an MPD. Determining successful reception may include the client obtaining an updated MPD or the client verifying that the MPD has not been updated since the previous successful reception.

An example client behaviour is introduced. For providing a continuous streaming service to the user, the client first parses the MPD and creates a list of accessible segments for each representation for the client-local time at a current system time, taking into account segment list generation procedures as detailed below possibly using play-lists or using URL construction rules. Then, the client selects one or multiple representations based on the information in the representation attributes and other information, e.g., available bandwidth and client capabilities. Depending on grouping representations may be presented standalone or jointly with other representations.

For each representation, the client acquires the binary metadata such as the "moov" header for the representation, if present, and the media segments of the selected representations. The client accesses the media content by requesting segments or byte ranges of segments, possibly using the segment list. The client may initially buffer media before starting the presentation and, once the presentation has started, the client continues consuming the media content by continuously requesting segments or parts of segments taking into account the MPD update procedures.

The client may switch representations taking into account updated MPD information and/or updated information from its environment, e.g., change of available bandwidth. With any request for a media segment containing a random access point, the client may switch to a different representation. When moving forward, i.e., the current system time (referred to as the "NOW time" to represent the time relative to the presentation) advancing, the client consumes the accessible segments. With each advance in the NOW time, the client possibly expands the list of accessible segments for each representation according to the procedures specified herein.

Figure 29:
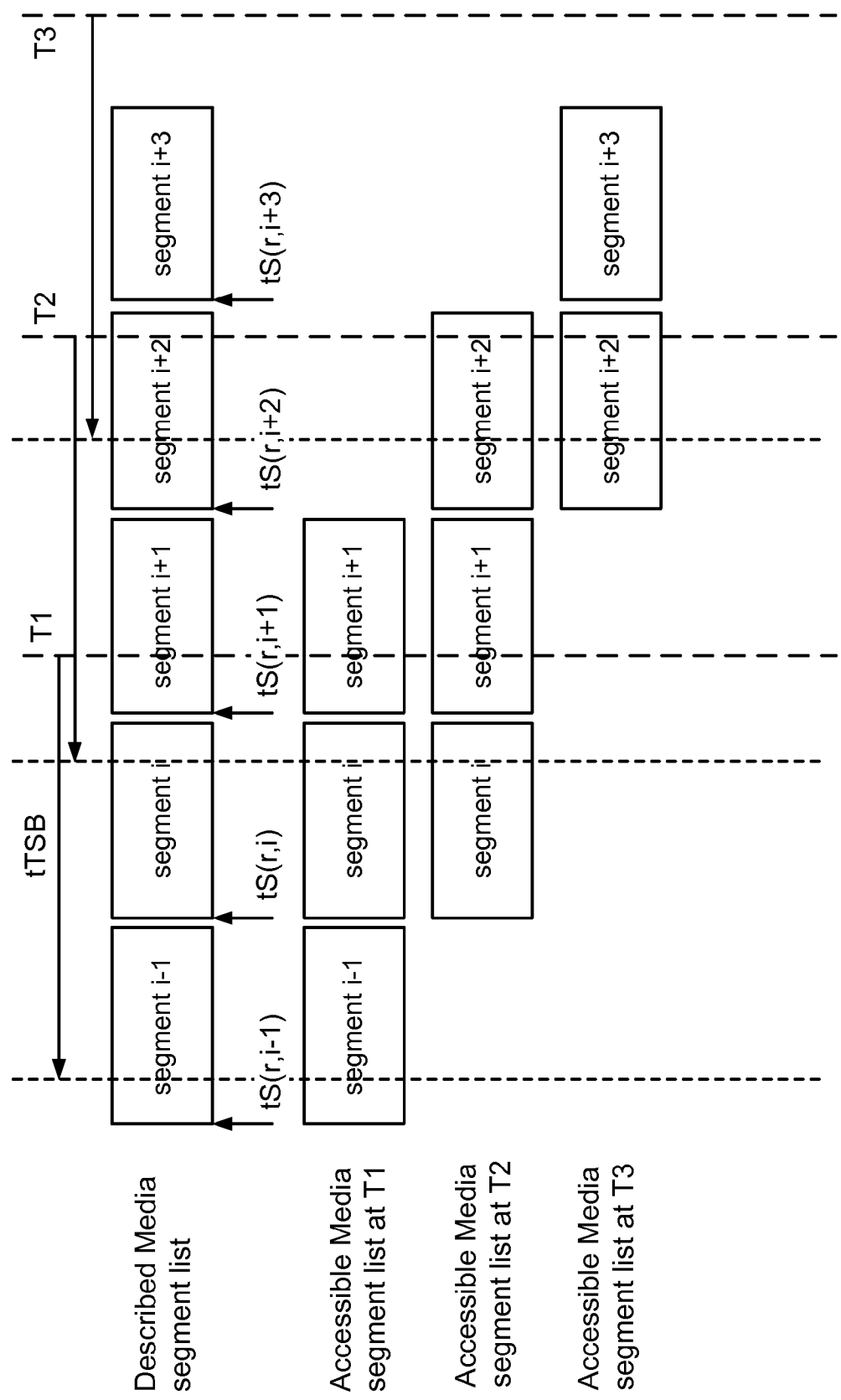
FIG. 29 illustrates a procedure for live services at different times at the client.

If the end of the media presentation is not yet reached and if the current playback time gets within a threshold for which the client anticipates to run out media of the media described in the MPD for any consuming or to be consumed representation, then the client may request an update of the MPD, with a new fetch time reception time T. Once received, the client then takes into account the possibly updated MPD and the new time T in the generation of the accessible segment lists. FIG. 29 illustrates a procedure for live services at different times at the client.

Accessible Segment List Generation

Assume that the HTTP streaming client has access to an MPD and may want to generate an accessible segment list for a wall-clock time NOW. The client is synchronised to a global time reference with certain precision, but advantageously no direct synchronization to the HTTP streaming server is required.

The accessible segment list for each representation is preferably defined as a list pair of a segment start time and segment locator where the segment start time may be defined as being relative to the start of the representation without loss of generality. The start of the representation may be aligned with the start of a period or if this concept is applied. Otherwise, the representation start can be at the start of the media presentation.

The client uses URL construction rules and timing as, for example, defined further herein. Once a list of described segments is obtained, this list is further restricted to the accessible ones, which may be a subset of the segments of the complete media presentation. The construction is governed by the current value of the clock at the client NOW time. Generally, segments are only available for any time NOW within a set of availability times. For times NOW outside this window, no segments are available. In addition, for live services, assume the some time checktime provides information on how far into the future the media is described. The checktime is defined on the MPD-documented media time axis; when the client's playback time reaches checktime, it advantageously requests a new MPD.

; when the client's playback time reaches checktime, it advantageously requests a new MPD.

Then, the segment list is further restricted by the checktime together with the MPD attribute TimeShiftBufferDepth such that only media segments available are those for which the sum of the start time of the media segment and the representation start time falls in the interval between NOW minus timeShiftBufferDepth minus the duration of the last described segment and the smaller value of either checktime or NOW.

Scalable Blocks

Sometimes available bandwidth falls so low that the block or blocks currently being received at a receiver become unlikely to be completely received in time to be played out without pausing the presentation. The receiver might detect such situations in advance. For example, the receiver might determine that it is receiving blocks encoding 5 units of media every 6 units of time, and has a buffer of 4 units of media, so that the receiver might expect to have to stall, or pause, the presentation, about 24 units of time later. With sufficient notice, the receiver can react to such a situation by, for example, abandoning the current stream of blocks and start requesting a block or blocks from a different representation of the content, such as one that uses less bandwidth per unit of playout time. For example, if the receiver switched to a representation where blocks encoded for at least 20% more video time for the same size blocks, the receiver might be able to eliminate the need to stall until the bandwidth situation improved.

However, it might be wasteful to have the receiver entirely discard the data already received from the abandoned representation. In an embodiment of a block-streaming system described herein, the data within each block can be encoded and arranged in such a way that certain prefixes of the data within the block can be used to continue the presentation without the remainder of the block having been received. For example, the well-known techniques of scalable video encoding may be used. Examples of such video encoding methods include H.264 Scalable Video Coding (SVC) or the temporal scalability of H.264 Advanced Video Coding (AVC). Advantageously, this method allows the presentation to continue based on the portion of a block that has been received even when reception of a block or blocks might be abandoned, for example due to changes in the available bandwidth. Another advantage is that a single data file may be used as the source for multiple different representations of the content. This is possible, for example, by making use of HTTP partial GET requests that select the subset of a block corresponding to the required representation.

One improvement detailed herein is an enhanced segment map, a scalable segment map. The scalable segment map contains the locations of the different layers in the segment such that the client can access the parts of the segments accordingly and extract the layers. In another embodiment, the media data in the segment is ordered such that the quality of the segment is increasing while downloading the data gradually from the beginning of the segment. In another embodiment, the gradual increase of the quality is applied for each block or fragment contained in the segment, such that the fragment requests can be done to address the scalable approach.

Figure 12:
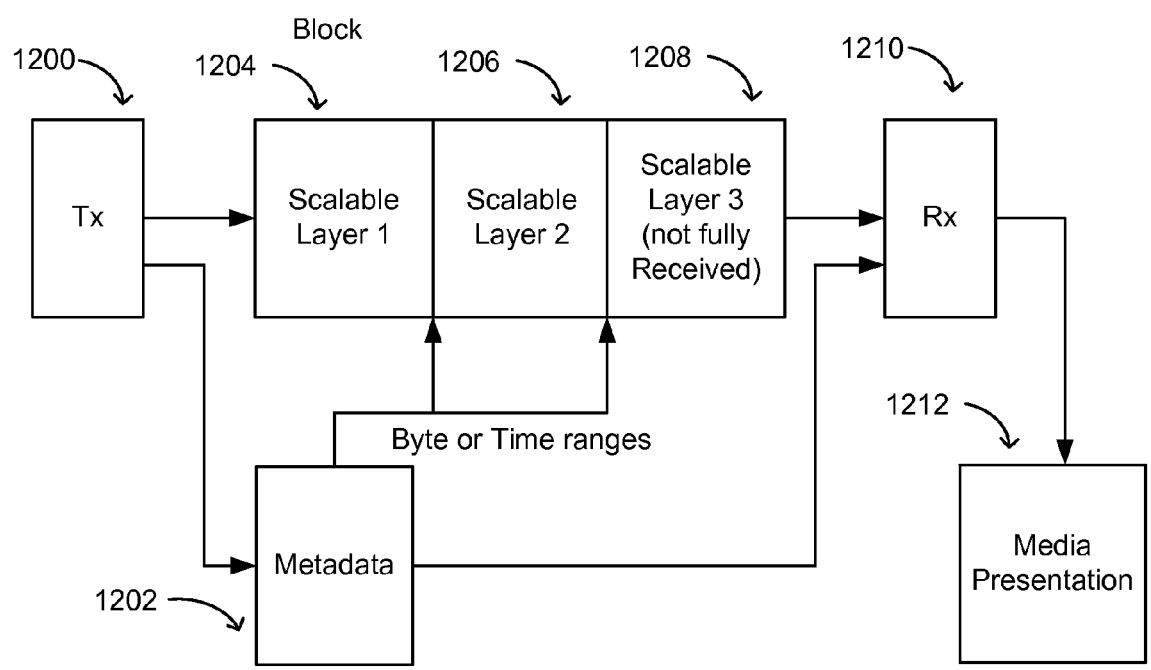
FIG. 12 is a figure showing an aspect of scalable blocks.

FIG. 12 is a figure showing an aspect of scalable blocks. In that figure, a transmitter 1200 outputs metadata 1202, scalable layer 1 (1204), scalable layer 2 (1206), and scalable layer 3 (1208), with the latter being delayed. A receiver 1210 can then use metadata 1202, scalable layer 1 (1204), and scalable layer 2 (1206) to present media presentation 1212.

Independent Scalability Layers

As explained above, it is undesirable for a block-request streaming system to have to stall when the receiver is unable to receive the requested blocks of a specific representation of the media data in time for its playout, as that often creates a poor user experience. Stalls can be avoided, reduced or mitigated by restricting a data rate of the representations chosen to be much less than the available bandwidth, so that it becomes very unlikely that any given portion of the presentation would not be received in time, but this strategy has the disadvantage that the media quality is necessarily much lower than could in principle be supported by the available bandwidth. A lower quality presentation than is possible also can be interpreted as a poor user experience. Thus, the designer of a block-request streaming system is faced with a choice in the design of the client procedures, programming of the client or configuration of hardware, to either request a content version that has a much lower data rate than the available bandwidth, in which case the user may suffer poor media quality, or to request a content version that has a data rate close to the available bandwidth, in which case the user may suffer a high probability of pauses during the presentation as the available bandwidth changes.

To handle such situations, the block-streaming systems described herein might be configured to handle multiple scalability layers independently, such that a receiver can make layered requests and a transmitter can respond to layered requests.

In such embodiments, the encoded media data for each block may be partitioned into multiple disjoint pieces, referred to herein as "layers", such that a combination of layers comprises the whole of the media data for a block and such that a client that has received certain subsets of the layers may perform decoding and presentation of a representation of the content. In this approach, the ordering of the data in the stream is such that contiguous ranges are increasing in the quality and the metadata reflects this.

An example of a technique that may be used to generate layers with the property above is the technique of Scalable Video Coding for example as described in ITU-T Standards H.264/SVC. Another example of a technique that may be used to generate layers with the property above is the technique of temporal scalability layers as provided in ITU-T Standard H.264/AVC.

In these embodiments, metadata might be provided in the MPD or in the segment itself that enables the construction of requests for individual layers of any given block and/or combinations of layers and/or a given layer of multiple blocks and/or a combination of layers of multiple blocks. For example, the layers comprising a block might be stored within a single file and metadata might be provided specifying the byte ranges within the file corresponding to the individual layers.

A file download protocol capable of specifying byte ranges, for example HTTP 1.1, may be used to request individual layers or multiple layers. Furthermore, as will be clear to one of skill in the art on reviewing this disclosure, the techniques described above pertaining to the construction, request and download of blocks of variable size and variable combinations of blocks may be applied in this context as well.

Combinations

A number of embodiments are now described which may be advantageously employed by a block-request streaming client in order to achieve an improvement in the user experience and/or a reduction in serving infrastructure capacity requirements compared to existing techniques by use of media data partitioned into layers as described above.

In a first embodiment, the known techniques of a block request streaming system may be applied with the modification that different versions of the content are in some cases replaced by different combinations of the layers. That is to say that where an existing system might provide two distinct representations of the content the enhanced system described here might provide two layers, where one representation of the content in the existing system is similar in bit-rate, quality and possibly other metrics to the first layer in the enhanced system and the second representation of the content in the existing system is similar in bit-rate, quality and possibly other metrics to the combination of the two layers in the enhanced system. As a result the storage capacity required within the enhanced system is reduced compared to that required in the existing system. Furthermore, whereas the clients of existing system may issue requests for blocks of one representation or the other representation, clients of the enhanced system may issue requests for either the first or both layers of a block. As a result, the user experience in the two systems is similar. Furthermore, improved caching is provided as even for different qualities common segments are used which are then cached with higher likelihood.

In a second embodiment, a client in an enhanced block-request streaming system employing the method of layers now described may maintain a separate data buffer for each of several layers of the media encoding. As will be clear to those of skill in the art of data management within client devices, these "separate" buffers may be implemented by allocation of physically or logically separate memory regions for the separate buffers or by other techniques in which the buffered data is stored in a single or multiple memory regions and the separation of data from different layers is achieved logically through the use of data structures which contain references to the storage locations of data from the separate layers and so in the follow the term "separate buffers" should be understood to include any method in which the data of the distinct layers can be separately identified. The client issues requests for individual layers of each block based on the occupancy of each buffer, for example, the layers may be ordered in a priority order such that a request for data from one layer may not be issued if the occupancy of any buffer for a lower layer in the priority order is below a threshold for that lower layer. In this method, priority is given to receiving data from the lower layers in the priority order such that if the available bandwidth falls below that required to also receive higher layers in the priority order then only the lower layers are requested. Furthermore, the thresholds associated with the different layers may be different, such that for example lower layers have higher thresholds. In the case that the available bandwidth changes such that the data for a higher layer cannot be received before the playout time of the block then the data for lower layers will necessarily already have been received and so the presentation can continue with the lower layers alone. Thresholds for buffer occupancy may be defined in terms of bytes of data, playout duration of the data contained in the buffer, number of blocks or any other suitable measure.

In a third embodiment, the methods of the first and second embodiments may be combined such that there are provided multiple media representations each comprising a subset of the layers (as in the first embodiment) and such that the second embodiment is applied to a subset of the layers within a representation.

In a fourth embodiment the methods of the first, second and/or third embodiments may be combined with the embodiment in which multiple independent representations of the content are provided such that for example at least one of the independent representations comprises multiple layers to which the techniques of the first, second and/or third embodiments are applied.

Advanced Buffer Manager

In combination with buffer monitor 126 (see FIG. 2), an advanced buffer manager can be used to optimize a client-side buffer. Block-request streaming systems want to ensure that media playout can start quickly and continue smoothly, while simultaneously providing the maximum media quality to the user or destination device. This may require that the client requests blocks that have the highest media quality, but that also can be started quickly and received in time thereafter to be played out without forcing a pause in the presentation.

In embodiments that use the advanced buffer manager, the manager determines which blocks of media data to request and when to make those requests. An advanced buffer manager might, for example, be provided with a set of metadata for the content to be presented, this metadata including a list of representations available for the content and metadata for each representation. Metadata for a representation may comprise information about the data rate of the representation and other parameters, such as video, audio or other codecs and codec parameters, video resolution, decoding complexity, audio language and any other parameters that might affect the choice of representation at the client.

Metadata for a representation may also comprise identifiers for the blocks into which the representation has been segmented, these identifiers providing the information needed for the client to request a block. For example, where the request protocol is HTTP, the identifier might be an HTTP URL possibly together with additional information identifying a byte range or time span within the file identified by the URL, this byte range or time span identifying the specific block within the file identified by the URL.

In a specific implementation, the advanced buffer manager determines when a receiver makes a request for new blocks and might itself handle sending the requests. In a novel aspect, the advanced buffer manager makes requests for new blocks according to the value of a balancing ratio that balances between using too much bandwidth and running out of media during a streaming playout.

The information received by buffer monitor 126 from block buffer 125 can include indications of each event when media data is received, how much has been received, when playout of media data has started or stopped, and the speed of media playout. Based on this information, buffer monitor 126 might calculate a variable representing a current buffer size, $B_{current}$. In these examples, $B_{current}$ represents the amount of media contained in a client or other device buffer or buffers and might be measured in units of time so that $B_{current}$ represents the amount of time that it would take to playout all of the media represented by the blocks or partial blocks stored in the buffer or buffers if no additional blocks or partial blocks were received. Thus, $B_{current}$ represents the "playout duration", at normal playout speed, of the media data available at the client, but not yet played.

As time passes, the value of $B_{current}$ will decrease as media is played out and may increase each time new data for a block is received. Note that, for the purposes of this explanation, it is assumed that a block is received when the entire data of that block is available at block requestor 124, but other measures might be used instead for example to take into account the reception of partial blocks. In practice, reception of a block may take place over a period of time.

Figure 13:
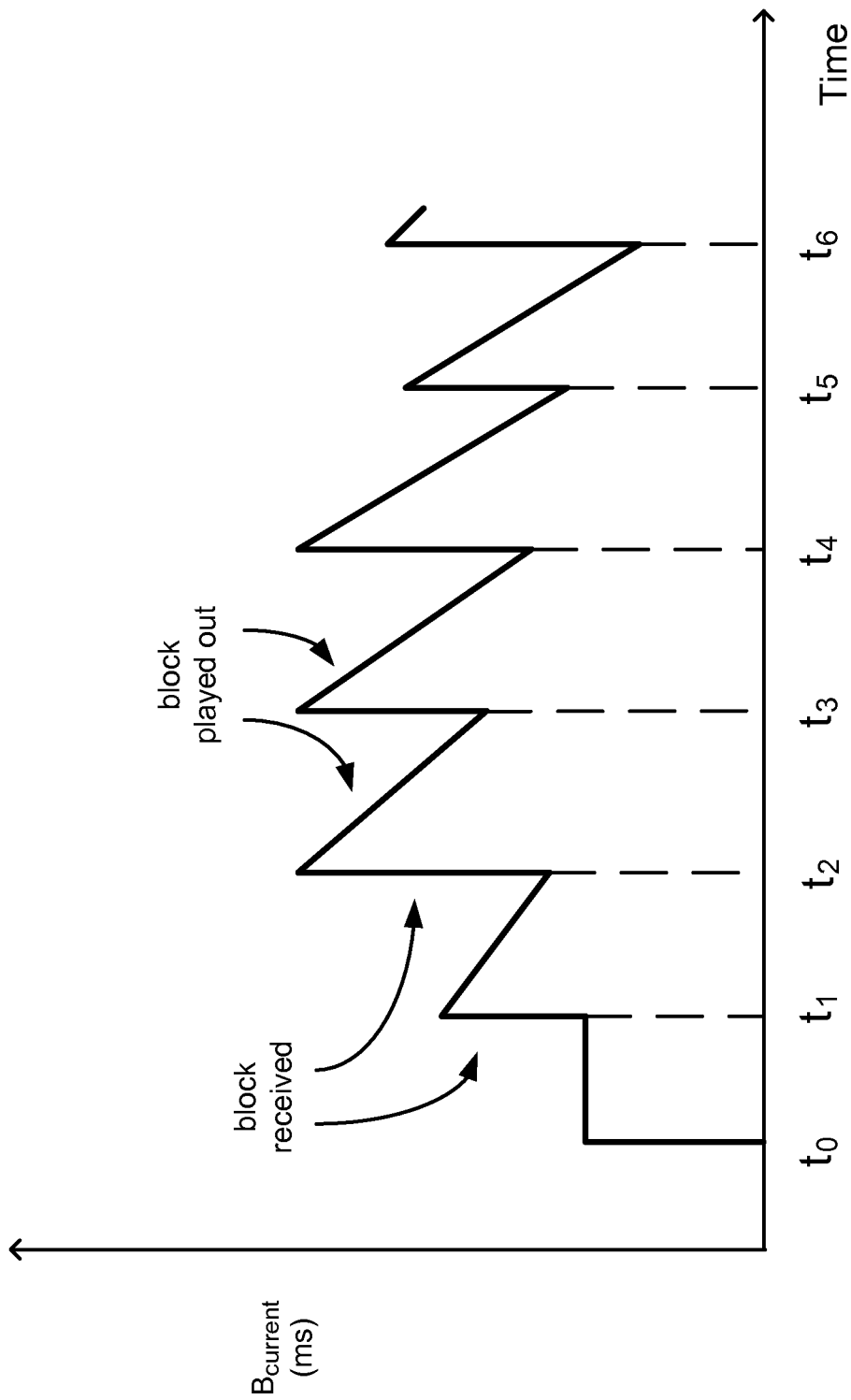
FIG. 13 depicts a graphical representation of the evolution of certain variables within a block-request streaming system over time.

FIG. 13 illustrates a variation of the value of $B_{current}$ over time, as media is played out and blocks are received. As shown in FIG. 13, the value of $B_{current}$ is zero for times less than $t_0$, indicating that no data has been received. At $t_0$, the first block is received and the value of $B_{current}$ increases to equal the playout duration of the received block. At this time, playout has not yet begun and so the value of $B_{current}$ remains constant, until time $t_1$, at which a second block arrives and $B_{current}$ increases by the size of this second block. At this time, playout begins and the value of $B_{current}$ begins to decrease linearly, until time $t_2$, at which time a third block arrives.

The progression of $B_{current}$ continues in this "sawtooth" manner, increasing stepwise each time a block is received (at times $t_2$, $t_3$, $t_4$, $t_5$ and $t_6$) and decreasing smoothly as data is played out in between. Note that in this example, playout proceeds at the normal playout rate for the content and so the slope of the curve between block reception is exactly −1, meaning that one second of media data is played for each one second of real time that passes. With frame-based media played out at a given number of frames per second, e.g., 24-frames per second, the slope of −1 will be approximated by small step functions that indicate the playout of each individual frame of data, e.g., steps of −1/24 of a second when each frame is played out.

Figure 14:
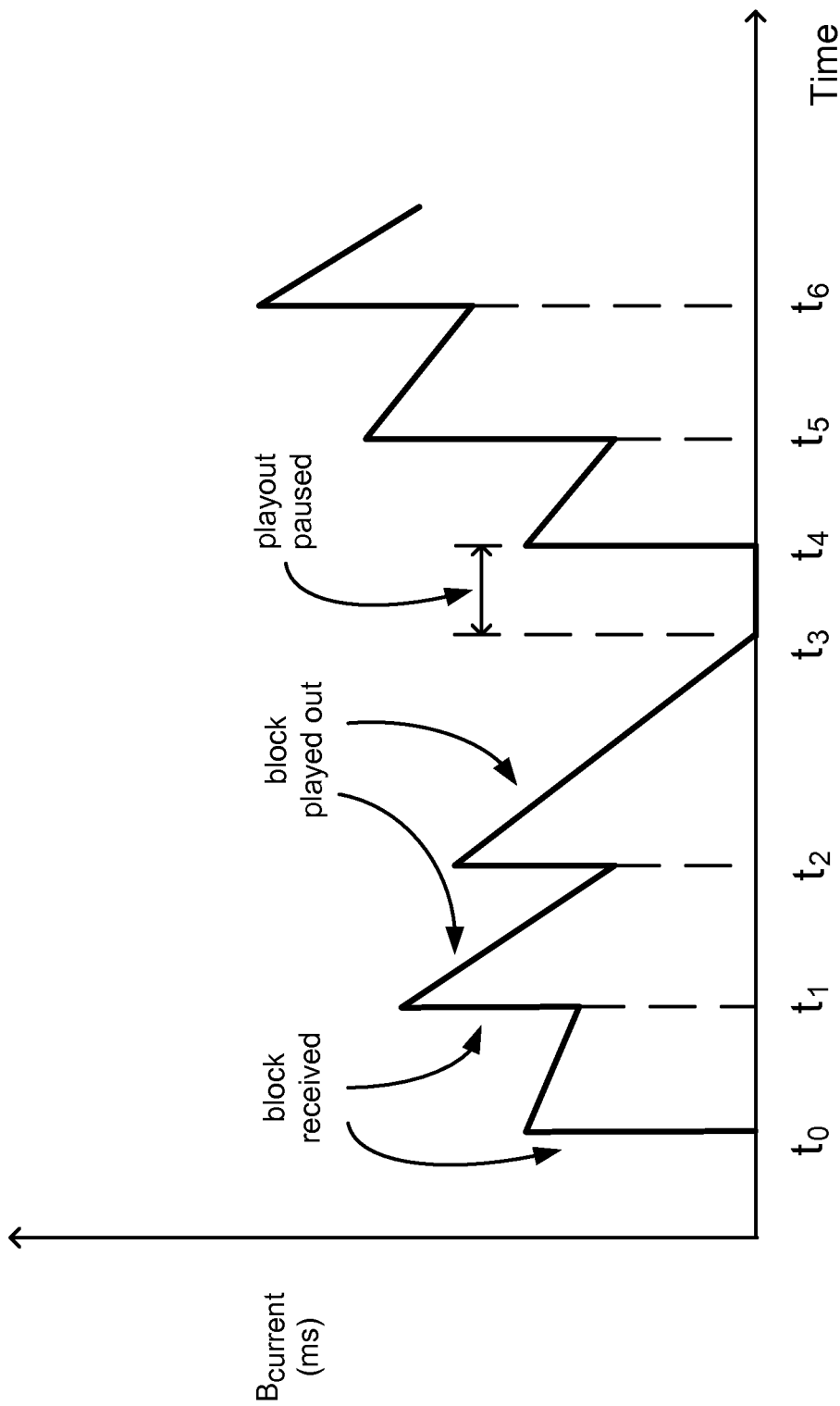
FIG. 14 depicts another graphical representation of the evolution of certain variables within a block-request streaming system over time.

FIG. 14 shows another example of the evolution of Bcurrent over time. In that example, the first block arrives at $t_0$ and playout begins immediately. Block arrival and playout continues until time $t_3$, at which the value of $B_{current}$ reaches zero. When that happens, no further media data is available for playout, forcing a pause in the media presentation. At time $t_4$, a fourth block is received and playout can resume. This example therefore shows a case where the reception of the fourth block was later than desired, resulting in a pause in playout and thus a poor user experience. Thus, a goal of the advanced buffer manager and other features is to reduce the probability of this event, while simultaneously maintaining high media quality.

Buffer monitor 126 may also calculate another metric, $B_{ratio}(t)$, which is the ratio of the media received in a given time period to the length of the time period. More specifically, $B_{ratio}(t)$ is equal to $T_{received}/(T_{now}-t)$, where $T_{received}$ is the amount of media (measured by its playout time) received in the time period from t, some time earlier than the current time up to the current time, $T_{now}$.

$B_{ratio}(t)$ can be used to measure the rate of change of $B_{current}$. $B_{ratio}(t)=0$ is the case where no data has been received since time t; $B_{current}$ will have been reduced by $(T_{now}-t)$ since that time, assuming media is playing out. $B_{ratio}(t)=1$ is the case where media is received in the same amount as it is being played out, for time $(T_{now}-t)$; $B_{current}$ will have the same value at time $T_{now}$ as at time t. $B_{ratio}(t)>1$ is the case where more data has been received than is necessary to play out for time $(T_{now}-t)$; $B_{current}$ will have increased from time t to time $T_{now}$.

Buffer Monitor 126 further calculates a value State, which may take a discrete number of values. Buffer Monitor 126 is further equipped with a function, NewState($B_{current}$, $B_{ratio}$), which, given the current value of $B_{current}$ and values of $B_{ratio}$ for $t<T_{now}$, provides a new State value as output. Whenever $B_{current}$ and $B_{ratio}$ cause this function to return a value different from the current value of State, the new value is assigned to State and this new State value indicated to block selector 123.

The function NewState may be evaluated with reference to the space of all possible values of the pair ($B_{current}$, $B_{ratio}(T_{now}-T_x)$) where $T_x$ may be a fixed (configured) value, or may be derived from $B_{current}$, for example by a configuration table which maps from values of $B_{current}$ to values of $T_x$, or may depend on the previous value of State. Buffer monitor 126 is supplied with a one or more partitionings of this space, where each partitioning comprises sets of disjoint regions, each region being annotated with a State value. Evaluation of the function NewState then comprises the operation of identifying a partitioning and determining the region into which the pair ($B_{current}$, $B_{ratio}(T_{now}-T_x)$) falls. The return value is then the annotation associated with that region. In a simple case, only one partitioning is provided. In a more complex case, the partitioning may depend on the pair ($B_{current}$, $B_{ratio}(T_{now}-T_x)$) at the previous time of evaluation of the NewState function or on other factors.

In a specific embodiment, the partitioning described above may be based on a configuration table containing a number of threshold values for $B_{current}$ and a number of threshold values for $B_{ratio}$. Specifically, let the threshold values for $B_{current}$ be $B_{thresh}(0)=0, B_{thresh}(1), \ldots, B_{thresh}(n_1)$, $B_{thresh}(n_1+1)=\infty$, where $n_1$ is the number of non-zero threshold values for $B_{current}$. Let the threshold values for $B_{ratio}$ be $B_{r-thresh}(0)=0$, $B_{r-thresh}(1)$, . . . , $B_{r-thresh}(n_2)$, $B_{r-thresh}(n_2+1)=\infty$, where $n_2$ is the number of threshold values for $B_{ratio}$. These threshold values define a partitioning comprising an $(n_1+1)$ by $(n_2+1)$ grid of cells, where the i-th cell of the j-th row corresponds to the region in which $B_{thresh}(i-1) <=B_{current}<B_{thresh}(i)$ and $B_{r-thresh}(j-1)<=B_{ratio}<B_{r-thresh}(j)$. Each cell of the grid described above is annotated with a state value, such as by being associated with particular values stored in memory, and the function NewState then returns the state value associated with the cell indicated by the values $B_{current}$ and $B_{ratio}(T_{now}-T_x)$.

In a further embodiment, a hysteresis value may be associated to each threshold value. In this enhanced method, evaluation of the function NewState may be based on a temporary partitioning constructed using a set of temporarily modified threshold values, as follows. For each $B_{current}$ threshold value that is less than the $B_{current}$ range corresponding to the chosen cell on the last evaluation of NewState, the threshold value is reduced by subtracting the hysteresis value associated with that threshold. For each $B_{current}$ threshold value that is greater than the $B_{current}$ range corresponding to the chosen cell on the last evaluation of NewState, the threshold value is increased by adding the hysteresis value associated with that threshold. For each $B_{ratio}$ threshold value that is less than the $B_{ratio}$ range corresponding to the chosen cell on the last evaluation of NewState, the threshold value is reduced by subtracting the hysteresis value associated with that threshold. For each $B_{ratio}$ threshold value that is greater than the $B_{ratio}$ range corresponding to the chose cell on the last evaluation of NewState, the threshold value is increased by adding the hysteresis value associated with that threshold. The modified threshold values are used to evaluate the value of NewState and then the threshold values are returned to their original values.

Other ways of defining partitionings of the space will be obvious to those of skill in the art upon reading this disclosure. For example, a partitioning may be defined by the use of inequalities based on linear combinations of $B_{ratio}$ and $B_{current}$, for example linear inequality thresholds of the form $\alpha 1 \cdot B_{ratio} + \alpha 2 \cdot B_{current} \leq \alpha 0$ for real-valued $\alpha 0$, $\alpha 1$, and $\alpha 2$, to define half-spaces within the overall space and defining each disjoint set as the intersection of a number of such half-spaces.

The above description is illustrative of the basic process. As will be clear to those skilled in the art of real-time programming upon reading this disclosure, efficient implementations are possible. For example, at each time that new information is provided to buffer monitor 126, it is possible to calculate the future time at which NewState will transition to a new value if for example no further data for blocks is received. A timer is then set for this time and in the absence of further inputs expiry of this timer will cause the new State value to be sent to block selector 123. As a result, computations need only be performed when new information is provided to buffer monitor 126 or when a timer expires, rather than continuously.

Suitable values of State could be "Low", "Stable" and "Full". An example of a suitable set of threshold values and the resulting cell grid is shown in FIG. 15.

Figure 15:
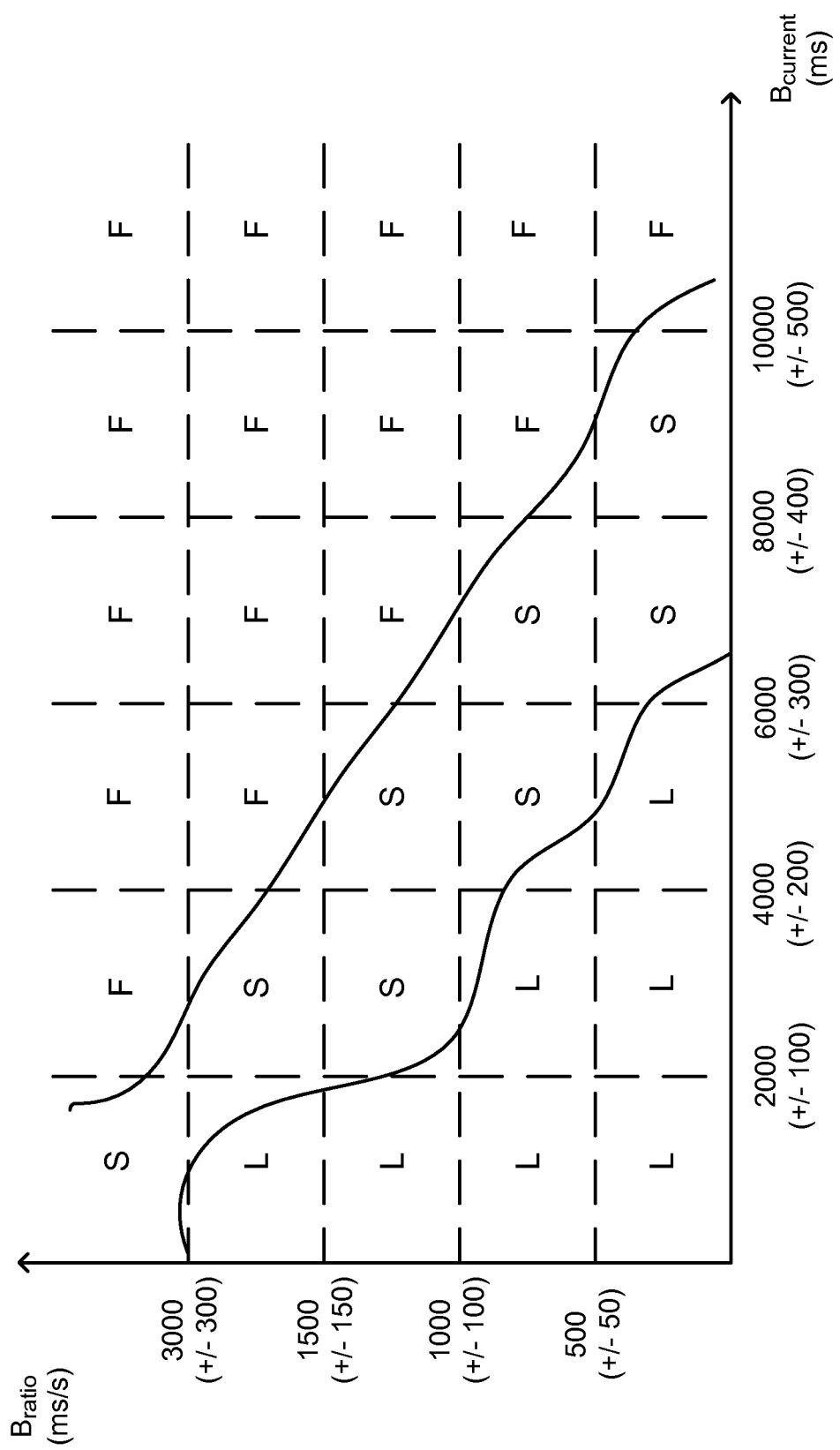
FIG. 15 depicts a cell grid of states as a function of threshold values.

In FIG. 15, $B_{current}$ thresholds are shown on the horizontal axis in milliseconds, with hysteresis values shown below as "+/−value". $B_{ratio}$ thresholds are shown on the vertical axis in permille (i.e., multiplied by 1000) with hysteresis values shown below as "+/−value". State values are annotated into the grid cells as "L", "S" and "F" for "Low", "Stable" and "Full" respectively.

Block selector 123 receives notifications from block requestor 124 whenever there is an opportunity to request a new block. As described above, block selector 123 is provided with information as to the plurality of blocks available and metadata for those blocks, including for example information about the media data rate of each block.

Information about the media data rate of a block may comprise the actual media data rate of the specific block (i.e., the block size in bytes divided by the playout time in seconds), the average media data rate of the representation to which the block belongs or a measure of the available bandwidth required, on a sustained basis, to play out the representation to which the block belongs without pauses, or a combination of the above.

Block selector 123 selects blocks based on the State value last indicated by buffer monitor 126. When this State value is "Stable", block selector 123 selects a block from the same representation as the previous selected block. The block selected is the first block (in playout order) containing media data for a time period in the presentation for which no media data has previously been requested.

When the State value is "Low", block selector 123 selects a block from a representation with a lower media data rate than that of the previously selected block. A number of factors can influence the exact choice of representation in this case. For example, block selector 123 might be provided with an indication of the aggregate rate of incoming data and may choose a representation with a media data rate that is less than that value.

When the State value is "Full", block selector 123 selects a block from a representation with a higher media data rate than that of the previously selected block. A number of factors can influence the exact choice of representation in this case. For example, block selector 123 may be provided with an indication of the aggregate rate of incoming data and may choose a representation with a media data rate that is not more than that value.

A number of additional factors may further influence the operation of block selector 123. In particular, the frequency with which the media data rate of the selected block is increased may be limited, even if buffer monitor 126 continues to indicate the "Full" state. Furthermore, it is possible that block selector 123 receives a "Full" state indication but there are no blocks of higher media data rate available (for example because the last selected block was already for the highest available media data rate). In this case, block selector 123 may delay the selection of the next block by a time chosen such that the overall amount of media data buffered in block buffer 125 is bounded above.

Additional factors may influence the set of blocks that are considered during the selection process. For example, the available blocks may be limited to those from representations whose encoding resolution falls within a specific range provided to block selector 123.

Block selector 123 may also receive inputs from other components that monitor other aspects of the system, such as availability of computational resources for media decoding. If such resources become scarce, block selector 123 may choose blocks whose decoding is indicated to be of lower computational complexity within the metadata (for example, representations with lower resolution or frame rate are generally of lower decoding complexity).

The above-described embodiment brings a substantial advantage in that the use of the value $B_{ratio}$ in the evaluation of the NewState function within buffer monitor 126 allows for a faster increase in quality at the start of the presentation compared to a method that considers only $B_{current}$. Without considering $B_{ratio}$, a large amount of buffered data may be accumulated before the system is able to select blocks with a higher media data rate and hence a higher quality. However, when the $B_{ratio}$ value is large, this indicates that the available bandwidth is much higher than the media data rate of the previously received blocks and that even with relatively little buffered data (i.e., low value for $B_{current}$), it remains safe to request blocks of higher media data rate and hence higher quality. Equally, if the $B_{ratio}$ value is low (<1, for example) this indicates that the available bandwidth has dropped below the media data rate of the previously requested blocks and thus, even if $B_{current}$ is high, the system will switch to a lower media data rate and hence a lower quality, for example to avoid reaching the point where $B_{current}=0$ and the playout of the media stalls. This improved behavior may be especially important in environments where network conditions and thus delivery speeds may vary quickly and dynamically, e.g., users streaming to mobile devices.

Another advantage is conferred by the use of configuration data to specify the partitioning of the space of values of $(B_{current}, B_{ratio})$. Such configuration data can be provided to buffer monitor 126 as part of the presentation metadata or by other dynamic means. Since, in practical deployments, the behavior of user network connections can be highly variable between users and over time for a single user, it may be difficult to predict partitionings that will work well for all users. The possibility to provide such configuration information to users dynamically allows for good configuration settings to be developed over time according to accumulated experience.

Variable Request Sizing

A high frequency of requests may be required if each request is for a single block and if each block encodes for a short media segment. If the media blocks are short, the video playout is moving from block to block quickly, which provides more frequent opportunities for the receiver to adjust or change its selected data rate by changing the representation, improving the probability that playout can continue without stalling. However, a downside to a high frequency of requests is that they might not be sustainable on certain networks in which available bandwidth is constrained in the client to server network, for example, in wireless WAN networks such as 3G and 4G wireless WANs, where the capacity of the data link from client to network is limited or can become limited for short or long periods of time due to changes in radio conditions.

A high frequency of requests also implies a high load on the serving infrastructure, which brings associated costs in terms of capacity requirements. Thus, it would be desirable to have some of the benefits of a high frequency of requests without all of the disadvantages.

In some embodiments of a block streaming system, the flexibility of high request frequency is combined with less frequent requests. In this embodiment, blocks may be constructed as described above and aggregated into segments containing multiple blocks, also as described above. At the beginning of the presentation, the processes described above in which each request references a single block or multiple concurrent requests are made to request parts of a block are applied to ensure a fast channel zapping time and therefore a good user experience at the start of the presentation. Subsequently, when a certain condition, to be described below, is met, the client may issue requests which encompass multiple blocks in a single request. This is possible because the blocks have been aggregated into larger files or segments and can be requested using byte or time ranges. Consecutive byte or time ranges can be aggregated into a single larger byte or time range resulting in a single request for multiple blocks, and even discontinuous blocks can be requested in one request.

One basic configuration that can be driven by deciding whether to request a single block (or a partial block) or to request multiple consecutive blocks is have the configuration base the decision on whether or not the requested blocks are likely to be played out or not. For example, if it is likely that there will be a need to change to another representation soon, then it is better for the client to make requests for single blocks, i.e., small amounts of media data. One reason for this is that if a request for multiple blocks is made when a switch to another representation might be imminent is that the switch might be made before the last few blocks of the request are played out. Thus, the download of these last few blocks might delay the delivery of media data of the representation to which the switch is made, which could cause media playout stalls.

However, requests for single blocks do result in a higher frequency of requests. On the other hand, if it is unlikely that there will be a need to change to another representation soon, then it can be preferred to make requests for multiple blocks, as all of these blocks are likely to be played out, and this results in a lower frequency of requests, which can substantially lower the request overhead, especially if it is typical that there is no imminent change in representation.

In conventional block aggregation systems, the amount requested in each request is not dynamically adjusted, i.e., typically each request is for an entire file, or each request is for approximately the same amount of the file of a representation (sometimes measured in time, sometimes in bytes). Thus, if all requests are smaller, then the request overhead is high, whereas if all requests are larger, then this increases the chances of media stall events, and/or providing a lower quality of media playout if lower quality representations are chosen to avoid having to quickly change representations as network conditions vary.

An example of a condition which, when met, may cause subsequent requests to reference multiple blocks, is a threshold on the buffer size, $B_{current}$. If $B_{current}$ is below the threshold, then each request issued references a single block. If $B_{current}$ is greater than or equal to the threshold then each request issued references multiple blocks. If a request is issued which references multiple blocks, then the number of blocks requested in each single request may be determined in one of several possible ways. For example, the number may be constant, for example, two. Alternatively, the number of blocks requested in a single request may be dependent on the buffer state and in particular on $B_{current}$. For example, a number of thresholds may be set, with the number of blocks requested in a single request being derived from the highest of the multiple thresholds that is less than $B_{current}$.

Another example of a condition which, when met, may cause requests to reference multiple blocks, is the value State variable described above. For example, when State is "Stable" or "Full" then requests may be issued for multiple blocks, but when State is "Low" then all requests may be for one block.

Figure 16:
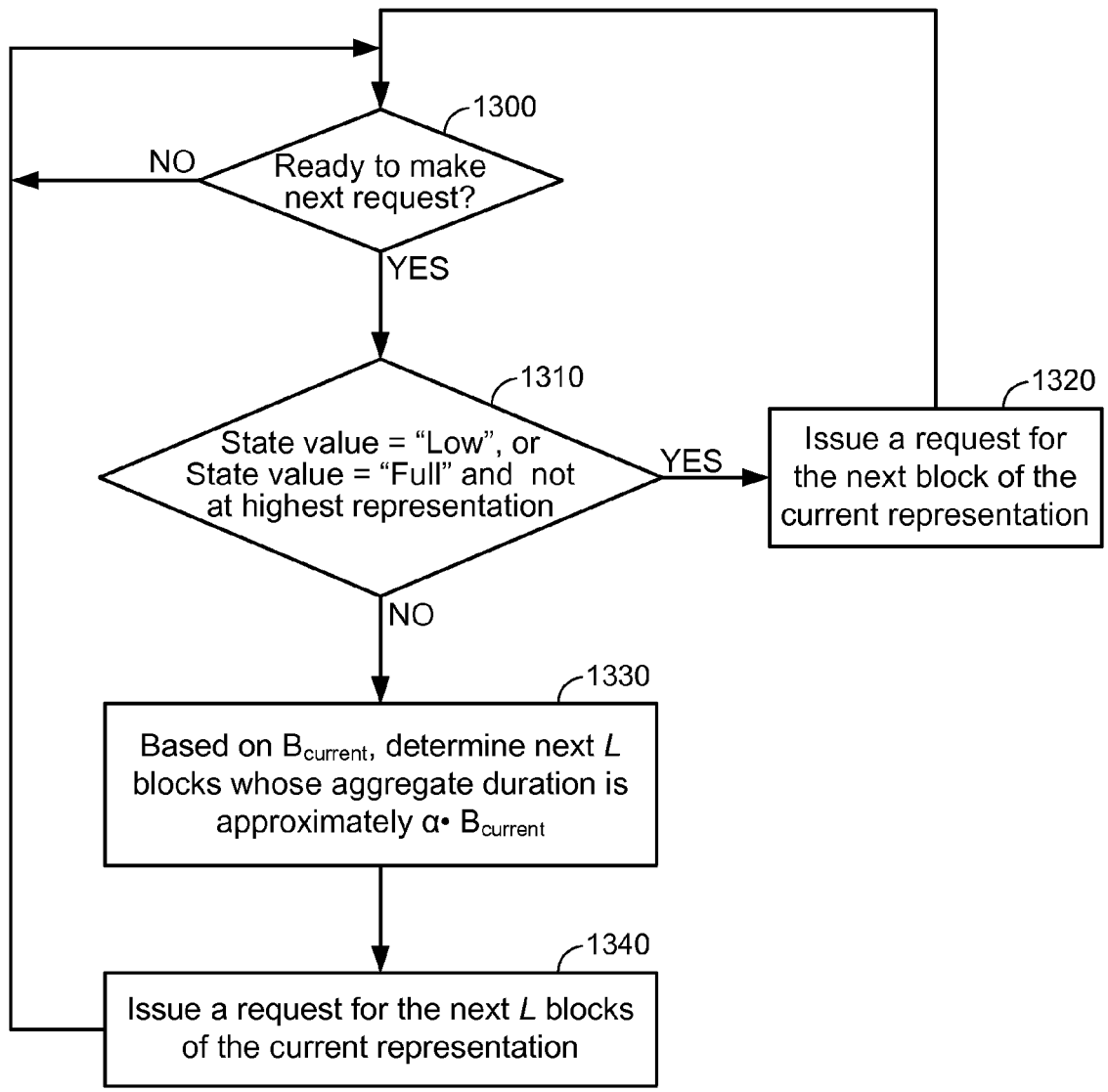
FIG. 16 is a flowchart of a process that might be performed in a receiver that can request single blocks and multiple blocks per request.

Another embodiment is shown in FIG. 16. In this embodiment, when the next request is to be issued (determined in step 1300), the current State value and Bcurrent is used to determine the size of the next request. If the current State value is "Low" or the current State value is "Full" and the current representation is not the highest available (determined in step 1310, answer is "Yes"), then the next request is chosen to be short, for example just for the next block (block determined and request made in step 1320). The rationale behind this is that these are conditions where it is likely that quite soon there will be a change of representations. If the current State value is "Stable" or the current State value is "Full" and the current representation is the highest available (determined in step 1310, answer is "No"), then the duration of the consecutive blocks requested in the next request is chosen to be proportional to an α-fraction of $B_{current}$ for some fixed α<1 (blocks determined in step 1330, request made in step 1340), e.g., for α=0.4, if $B_{current}$=5 seconds, then the next request might be for approximately 2 seconds of blocks, whereas if $B_{current}$=10 seconds, then the next request might be for approximately 4 seconds of blocks. One rationale for this is that in these conditions it might be unlikely that a switch to a new representation will be made for an amount of time that is proportional to $B_{current}$.

Flexible Pipelining

Block-streaming systems might use a file request protocol that has a particular underlying transport protocol, for example TCP/IP. At the beginning of a TCP/IP or other transport protocol connection, it may take some considerable time to achieve utilization of the full available bandwidth. This may result in a "connection startup penalty" every time a new connection is started. For example, in the case of TCP/IP, the connection startup penalty occurs due to both the time taken for the initial TCP handshake to establish the connection and the time taken for the congestion control protocol to achieve full utilization of the available bandwidth.

In this case, it may be desirable to issue multiple requests using a single connection, in order to reduce the frequency with which the connection startup penalty is incurred. However, some file transport protocols, for example HTTP, do not provide a mechanism to cancel a request, other than closing the transport layer connection altogether and thereby incurring a connection startup penalty when a new connection is established in place of the old one. An issued request may need to be cancelled if it is determined that available bandwidth has changed and a different media data rate is required instead, i.e., there is a decision to switch to a different representation. Another reason for cancelling an issued request may be if the user has requested that the media presentation be ended and a new presentation begun (perhaps of the same content item at a different point in the presentation or perhaps of a new content item).

As is known, the connection startup penalty can be avoided by keeping the connection open and re using the same connection for subsequent requests and as is also known the connection can be kept fully utilized if multiple requests are issued at the same time on the same connection (a technique known as "pipelining" in the context of HTTP). However, a disadvantage of issuing multiple requests at the same time, or more generally in such a way that multiple requests are issued before previous requests have completed over a connection, may be that the connection is then committed to carrying the response to those requests and so if changes to which requests should be issued becomes desirable then the connection may be closed if it becomes necessary to cancel requests already issued that are no longer desired.

The probability that an issued request needs to be cancelled may be in part dependent on the duration of the time interval between the issuing of the request and the playout time of the requested block in the sense that when this time interval is high the probability that an issued request needs to be cancelled is also high (because it is likely that the available bandwidth changes during the interval).

As is known, some file download protocols have the property that a single underlying transport layer connection can advantageously be used for multiple download requests. For example, HTTP has this property, since reuse of a single connection for multiple requests avoids the "connection startup penalty" described above for requests other than the first. However, a disadvantage of this approach is that the connection is committed to transporting the requested data in each issued request and therefore if a request or requests need to be cancelled then either the connection may be closed, incurring the connection startup penalty when a replacement connection is established, or the client may wait to receive data that is no longer needed, incurring a delay in the reception of subsequent data.

We now describe an embodiment which retains the advantages of connection reuse without incurring this disadvantage and which also additionally improves the frequency with which connections can be reused.

The embodiments of the block-streaming systems described herein are configured to reuse a connection for multiple requests without having to commit the connection at the start to a particular set of requests. Essentially, a new request is issued on an existing connection when already issued requests on the connection have not yet completed, but are close to completion. One reason for not waiting until the existing requests complete is that if the previous requests complete, then the connection speed could degrade, i.e., the underlying TCP session could go into an idle state, or the TCP cwnd variable could be substantially reduced, thereby substantially reducing the initial download speed of the new request issued on that connection. One reason for waiting until close to completion before issuing an additional request is because if a new request is issued long before previous requests complete, then the new issued request may not even commence for some substantial period of time, and it could be the case that during this period of time before the new issued request commences the decision to make the new request is no longer valid, e.g., due to a decision to switch representations. Thus, embodiment of clients that implement this technique will issue a new request on a connection as late as possible without slowing down the download capabilities of the connection.

The method comprises monitoring the number of bytes received on a connection in response to the latest request issued on this connection and applying a test to this number. This can be done by having the receiver (or the transmitter, if applicable) configured to monitor and test.

Figure 17:
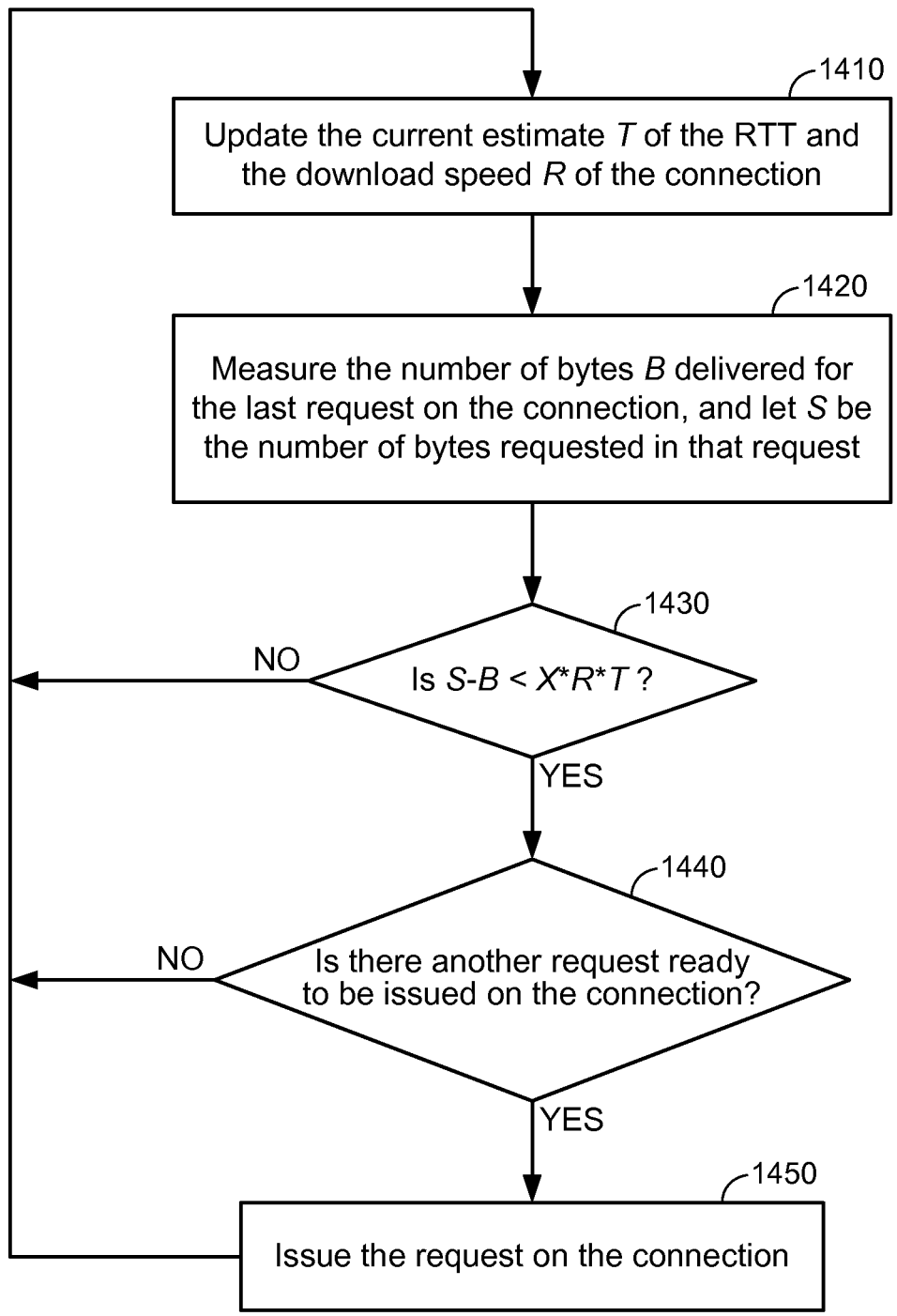
FIG. 17 is a flowchart of a flexible pipeline process.

If the test passes, then a further request may be issued on the connection. One example of a suitable test is whether the number of bytes received is greater than a fixed fraction of the size of the data requested. For example, this fraction could be 80%. Another example of a suitable test is based on the following calculation, as illustrated in FIG. 17. In the calculation, let R be an estimate of the data rate of the connection, T be an estimate of the Round Trip Time ("RTT") and X be numeric factor that, for example, could be a constant set to a value between 0.5 and 2, where estimates of R and T are updated on a regular basis (updated in step 1410). Let S be the size of the data requested in the last request, B be the number of bytes of the requested data received (calculated in step 1420).

A suitable test would be to have the receiver (or the transmitter, if applicable) execute a routine to evaluate the inequality (S−B)<X·R·T (tested in step 1430), and if "Yes" then take an action. For example, a test could be made to see if there is another request ready to be issued on the connection (tested in step 1440), and if "Yes" then issue that request to the connection (step 1450) and if "No" then the process returns to step 1410 to continue updating and testing. If the result of the test in step 1430 is "No" then the process returns to step 1410 to continue updating and testing.

The inequality test in step 1430 (performed by appropriately programmed elements, for example) causes each subsequent request to be issued when the amount of remaining data to be received is equal to X times the amount of data that can be received at the current estimated reception rate within one RTT. A number of methods to estimate the data rate, R, in step 1410 are known in the art. For example, the data rate may be estimated as Dt/t, where Dt is the number of bits received in the preceding t seconds and where t may be, for example, 1 s or 0.5 s or some other interval. Another method is an exponential weighted average, or first order Infinite Impulse Response (IIR) filter of the incoming data rate. A number of methods to estimate the RTT, T, in step 1410 are known in the art.

The test in step 1430 can be applied to the aggregate of all active connections on an interface, as explained in more detail below.

The method further comprises constructing a list of candidate requests, associating each candidate request with a set of suitable servers to which the request can be made and ordering the list of candidate requests in order of priority. Some entries in the list of candidate requests may have the same priority. Servers in the list of suitable servers associated with each candidate request are identified by hostnames. Each hostname corresponds to a set of Internet Protocol addresses which can be obtained from the Domain Name System as is well known. Therefore each possible request on the list of candidate requests is associated with a set of Internet Protocol addresses, specifically the union of the sets of Internet Protocol Addresses associated with the hostnames associated with the servers associated with the candidate request. Whenever the test described in step 1430 is met for a connection, and no new request has yet been issued on that connection, the highest priority request on the lists of candidate requests with which the Internet Protocol address of the destination of the connection is associated is chosen, and this request is issued on the connection. The request is also removed from the list of candidate requests.

Candidate requests may be removed (cancelled) from the list of candidate requests, new requests may be added to the candidate list with a priority that is higher than already existing requests on the candidate list, and existing requests on the candidate list may have their priority changed. The dynamic nature of which requests are on the list of candidate requests, and the dynamic nature of their priority on the candidate list, can alter which requests might be issued next depending on when a test of the type described in step 1430 is satisfied.

For example, it could be possible that if the answer to the test described in step 1430 is "Yes" at some time t then the next request issued would be a request A, whereas if the answer to the test described in step 1430 is not "Yes" until some time t'>t then the next request issued would instead be a request B, because either request A was removed from the list of candidate requests between time t and t', or because request B was added to the list of candidate requests with higher priority than request A between time t and t', or because request B was on the candidate list at time t but with lower priority than request A, and between time t and t' the priority of request B was made higher than that of request A.

FIG. 18 illustrates an example of a list of requests on the candidate list of requests. In this example, there are three connections, and there are six requests on the candidate list, labeled A, B, C, D, E and F. Each of the requests on the candidate list can be issued on a subset of the connections as indicated, e.g., request A can be issued on connection 1, whereas request F can be issued on connection 2 or connection 3. The priority of each request is also labeled in FIG. 18, and a lower priority value indicates that a request is higher priority. Thus, requests A and B with priority 0 are the highest priority requests, whereas request F with a priority value of 3 is the lowest priority among the requests on the candidate list.

If, at this point in time t, connection 1 passes the test described in step 1430, then either request A or request B is issued on connection 1. If instead connection 3 passes the test described in step 1430 at this time t, then request D is issued on connection 3, since request D is the request with the highest priority that can be issued on connection 3.

Suppose that for all connections the answer to the test described in step 1430 from time t to some later time t' is "No", and between time t and t' request A changes its priority from 0 to 5, request B is removed from the candidate list, and a new request G with priority 0 is added to the candidate list. Then, at time t', the new candidate list might be as shown in FIG. 19.

If at time t' connection 1 passes the test described in step 1430, then request C with priority 4 is issued on connection 1, since it is the highest priority request on the candidate list that can be issued on connection 1 at this point in time.

Suppose in this same situation that instead request A would have been issued on connection 1 at time t (which was one of the two highest priority choices for connection 1 at time t as shown in FIG. 18). Since the answer to the test described in step 1430 from time t to some later time t' is "No" for all connections, connection 1 is still delivering data up till at least time t' for requests issued prior to time t, and thus request A would not have commenced until at least time t'. Issuing request C at time t' is a better decision than issuing request A at time t would have been, since request C commences at the same time after t' as request A would have commenced, and since by that time request C is higher priority than request A.

As another alternative, if the test of the type described in step 1430 is applied to the aggregate of the active connections a connection may be chosen that has a destination whose Internet Protocol Address is associated with the first request on the list of candidate requests or another request with the same priority as said first request.

A number of methods are possible for the construction of the list of candidate requests. For example, the candidate list could contain n requests representing requests for a next n portions of data of the current representation of the presentation in time sequence order, where the request for the earliest portion of data has highest priority and the request for the latest portion of data has lowest priority. In some cases n may be one. The value of n may depend on the buffer size $B_{current}$, or the State variable or another measure of the state of the client buffer occupancy. For example, a number of threshold values may be set for $B_{current}$ and a value associated with each threshold and then the value of n is taken to be the value associated with the highest threshold that is less than $B_{current}$.

The embodiment described above ensures flexible allocation of requests to connections, ensuring that preference is given to reusing an existing connection even if the highest priority request is not suitable for that connection (because the destination IP address of the connection is not one that is allocated to any of the hostnames associated with the request). The dependency of n on $B_{current}$ or State or another measure of the client buffer occupancy ensures that such "out of priority order" requests are not issued when the client is in urgent need of issuance and completion of the request associated with the next portion of data to be played out in the time sequence.

These methods can be advantageously combined with cooperative HTTP and FEC.

Consistent Server Selection

As is well known, files to be downloaded using a file download protocol are commonly identified by an identifier comprising a hostname and a filename. For example this is the case for the HTTP protocol in which case the identifier is a Uniform Resource Identifier (URI). A hostname may correspond to multiple hosts, identified by Internet Protocol addresses. For example this is a common method of spreading the load of requests from multiple clients across multiple physical machines. In particular this approach is commonly taken by Content Delivery Networks (CDNs). In this case a request issued on a connection to any of the physical hosts is expected to succeed. A number of methods are known by which a client may select from amongst the Internet Protocol Addresses associated with a hostname. For example, these addresses are typically provided to the client via the Domain Name System and are provided in priority order. A client may then choose the highest priority (first) Internet Protocol Address. However, generally there is no coordination between clients as to how this choice is made, with the result that different clients may request the same file from different servers. This may result in the same file being stored in the cache of nearby multiple servers, which lowers the efficiency of the cache infrastructure.

This can be handled by a system that advantageously increases the probability that two clients requesting the same block will request this block from the same server. The novel method described here comprises selecting from amongst the available Internet Protocol Addresses in a manner determined by the identifier of the file to be requested and in such a way that different clients presented with the same or similar choices of Internet Protocol addresses and file identifiers will make the same choice.

Figure 20:
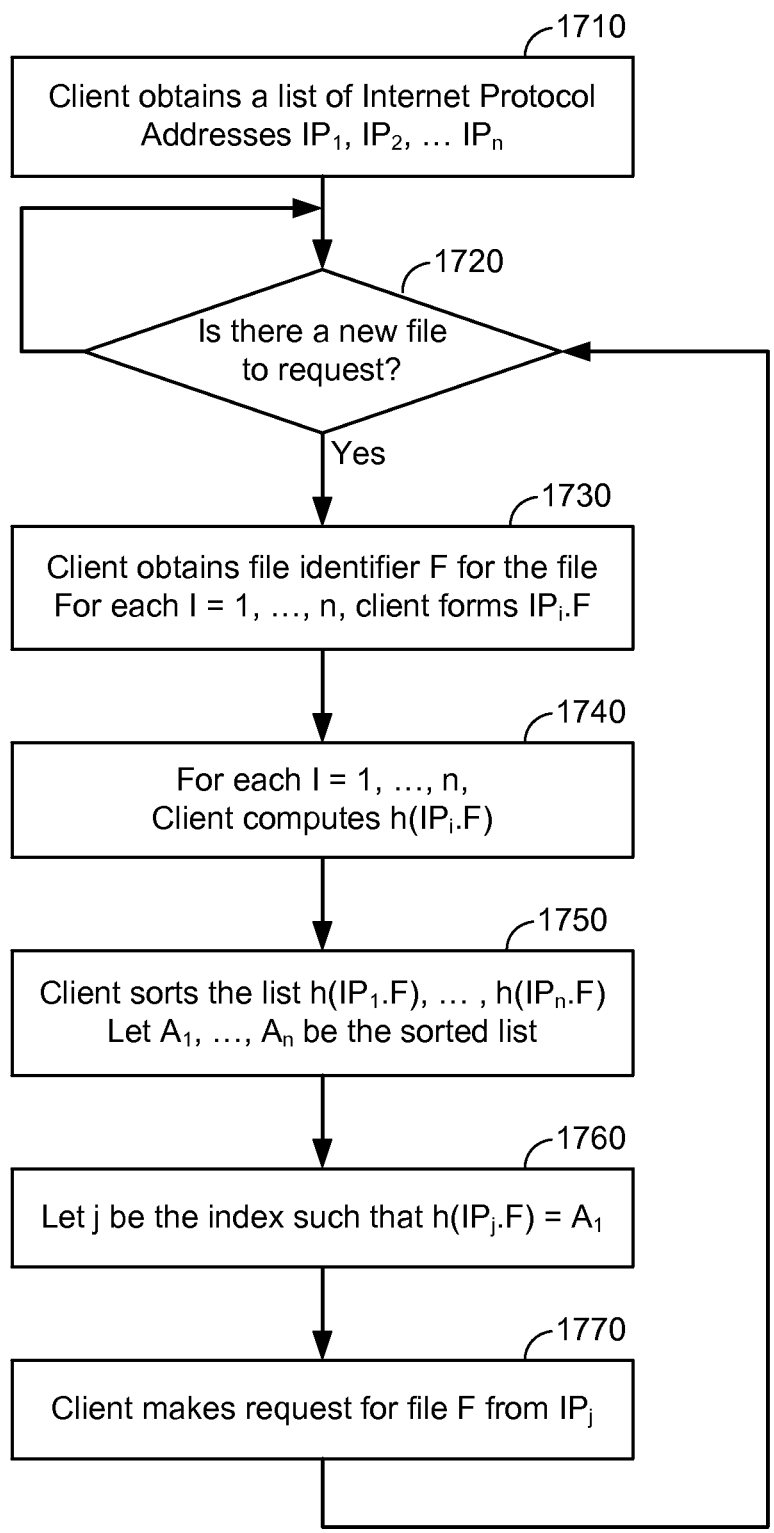
FIG. 20 is a flowchart of consistent caching server proxy selection based on a file identifier.

A first embodiment of the method is described with reference to FIG. 20. The client first obtains a set of Internet Protocol addresses $IP_1, IP_2, \ldots, IP_n$, as shown in step 1710. If there is a file that requests are to be issued for, as decided in step 1720, then the client determines which Internet Protocol address to issue requests for the file, as determined in steps 1730-1770. Given a set of Internet Protocol addresses and an identifier for a file to be requested the method comprises ordering the Internet Protocol addresses in a manner determined by the file identifier. For example, for each Internet Protocol address a byte string is constructed comprising the concatenation of the Internet Protocol address and the file identifier, as shown in step 1730. A hash function is applied to this byte string, as shown in step 1740, and the resulting hash values are arranged according to a fixed ordering, as shown in step 1750, for example increasing numerical order, inducing an ordering on the Internet Protocol addresses. The same hash function can be used by all clients, thereby guaranteeing that the same result is produced by the hash function on a given input by all clients. The hash function might be statically configured into all clients in a set of clients, or all clients in a set of client might obtain a partial or full description of the hash function when the clients obtain the list of Internet Protocol addresses, or all clients in a set of client might obtain a partial or full description of the hash function when the clients obtain the file identifier, or the hash function may be determined by other means. The Internet Protocol address that is first in this ordering is chosen and this address is then used to establish a connection and issue requests for all or portions of the file, as shown in steps 1760 and 1770.

The method above may be applied when a new connection is established to request a file. It may also be applied when a number of established connections are available and one of these may be chosen to issue a new request.

Furthermore, when an established connection is available and a request may be chosen from amongst a set of candidate requests with equal priority an ordering on the candidate requests is induced, for example, by the same method of hash values described above and the candidate request appearing first in this ordering is chosen. The methods may be combined to select both a connection and candidate request from amongst a set of connections and requests of equal priority, again by computing a hash for each combination of connection and request, ordering these hash values according to a fixed ordering and choosing the combination which occurs first in the ordering induced on the set of combinations of requests and connections.

This method has advantage for the following reason: a typical approach taken by a block serving infrastructure such as that shown in FIG. 1 (BSI 101) or FIG. 2 (BSIs 101), and in particular an approach commonly taken by CDNs, is to provide multiple caching proxy servers which receive client requests. A caching proxy server may not be provided with the file requested in a given request and in this case such servers typically forward the request to another server, receive the response from that server, typically including the requested file, and forward the response to the client. The caching proxy server may also store (cache) the requested file so that it can response immediately to subsequent requests for the file. The common approach described above has the property that the set of files stored on a given caching proxy server is largely determined by the set of requests that the caching proxy server has received.

The method described above has the following advantage. If all clients in a set of clients are provided the same list of Internet Protocol addresses then these clients will use the same Internet Protocol address for all requests issued for the same file. If there are two different lists of Internet Protocol addresses and each client is provided with one of these two lists then the clients will use at most two different Internet Protocol addresses for all requests issued for the same file. In general, if the lists of Internet Protocol addresses provided to clients are similar then the clients will use a small set of the provided Internet Protocol addresses for all requests issued for the same file. Since proximate clients tend to be provided similar lists of Internet Protocol addresses, it is likely that proximate clients issue requests for a file from only a small portion of the caching proxy servers available to those clients. Thus, there will be only a small fraction of caching proxy servers that cache the file, which advantageously minimizes the amount of caching resources used to cache the file.

Preferably the hash function has the property that a very small fraction of different inputs are mapped to the same output, and that different inputs are mapped to essentially random outputs, to ensure that for a given set of Internet Protocol addresses, the proportion of files for which a given one of the Internet Protocol addresses is first in the sorted list produced by step 1750 is approximately the same for all Internet Protocol addresses in the list. On the other hand, it is important that the hash function is deterministic, in the sense that for a given input the output of the hash function is the same for all clients.

Another advantage of the method described above is the following. Suppose that all clients in a set of clients are provided the same list of Internet Protocol addresses. Because of the properties of the hash function just described, it is likely that the requests for different files from these clients will be evenly spread across the set of Internet Protocol addresses, which in turn means that the requests will be spread evenly across the caching proxy servers. Thus, the caching resources used for storing these files is spread evenly across the caching proxy servers, and the requests for files is spread evenly across the caching proxy servers. Thus, the method provides both storage balancing and load balancing across the caching infrastructure.

A number of variations to the approach described above are known to those of skill in the art and in many cases these variations retain the property that the set of files stored on a given proxy is determined at least in part by the set of requests the caching proxy server has received. In the common case in which a given hostname resolves to multiple physical caching proxy servers, it will be common that all these servers will eventually store a copy of any given file that is frequently requested. Such duplication may be undesirable, since storage resources on the caching proxy servers are limited and as a result files may be, on occasion, removed (purged) from the cache. The novel method described here ensures that requests for a given file are directed to caching proxy servers in such a way that this duplication is reduced, thereby reducing the need to remove files from the cache and thereby increasing the likelihood that any given file is present in (i.e., has not been purged from) in the proxy cache.

When a file is present in the proxy cache, the response sent to the client is faster, which has advantage in reducing the probability that the requested file arrives late, which may result in a pause in media playout and therefore a bad user experience. Additionally, when a file is not present in the proxy cache the request may be sent to another server, causing additional load on both the serving infrastructure and the network connections between servers. In many cases the server to which the request is sent may be at a distant location and the transmission of the file from this server back to the caching proxy server may incur transmission costs. Therefore the novel method described here results in a reduction in these transmission costs.

Probabilistic Whole File Requests

A particular concern in the case that the HTTP protocol is used with Range requests is the behavior of cache servers that are commonly used to provide scalability in the serving infrastructure. While it may be common for HTTP cache servers to support the HTTP Range header, the exact behavior of different HTTP cache servers varies by implementation. Most cache server implementations serve Range requests from cache in the case that the file is available in the cache. A common implementation of HTTP Cache servers always forwards downstream HTTP requests containing Range header to an upstream node unless the cache server has a copy of the file (cache server or origin server). In some implementations the upstream response to the Range request is the entire file, and this entire file is cached and the response to the downstream Range request is extracted from this file and sent. However, in at least one implementation the upstream response to the Range request is just the data bytes in the Range request itself, and these data bytes are not cached but instead just sent as the response to the downstream Range request. As a result, use of Range headers by clients may have the consequence that the file itself is never brought into caches and the desirable scalability properties of the network will be lost.

In the foregoing, the operation of caching proxy servers was described and also the method of requesting Blocks from a file which is an aggregations of multiple blocks was described. For example this can be achieved by the use of the HTTP Range request header. Such requests are called "partial requests" in the following. A further embodiment is now described which has advantage in the case that the block serving infrastructure 101 does not provide complete support for the HTTP Range header. Commonly, servers within a block serving infrastructure, for example a Content Delivery Network, support partial requests but may not store the response to partial requests in local storage (cache). Such a server may fulfill a partial request by forwarding the request to another server, unless the entire file is stored in local storage, in which case the response may be sent without forwarding the request to another server.

A block-request streaming system which makes use of the novel enhancement of block aggregation described above may perform poorly if the block serving infrastructure exhibits this behavior, since all requests, being partial requests, will be forwarded to another server and no requests will be served by caching proxy servers, defeating the object of providing the caching proxy servers in the first place. During the block-request streaming process as described above, a client may at some point request a Block which is at the beginning of a file.

According to the novel method here described, whenever a certain condition is met, such requests may be converted from requests for the first Block in a file to requests for the entire file. When a request for the whole file is received by a caching proxy server the proxy server typically stores the response. Therefore the use of these requests causes the file to be brought into the cache of the local caching proxy servers such that subsequent requests, whether for the full file or partial requests may be served directly by the caching proxy server. The condition may be such that amongst a set of requests associated with a given file, for example the set of requests generated by a set of clients viewing the content item in question, the condition will be met for at least a provided fraction of these requests.

An example of a suitable condition is that a randomly chosen number is above a provided threshold. This threshold may be set such that the conversion of a single Block request into a whole file request occurs on average for a provided fraction of the requests, for example one time out of ten (in which case the random number may be chosen from the interval [0,1] and the threshold may be 0.9). Another example of a suitable condition is that a hash function calculated over some information associated with the block and some information associated with the client takes one of a provided set of values. This method has the advantage that for a file which is frequently requested, the file will be brought into the cache of a local proxy server however the operation of the block-request streaming system is not altered significantly from the standard operation in which each request is for a single Block. In many cases, where the conversion of the request from a single Block request to a whole file request occurs, the client procedures would otherwise go on to request the other Blocks within the file. If this is the case, then such requests may be suppressed because the Blocks in question will be received in any case as a result of the whole file request.

URL Construction and Segment List Generation and Seeking

The segment list generation deals with the issue of how a client may generate a segment list from the MPD at a specific client-local time NOW for a specific representation which starts at some start time starttime either relative to the start of the media presentation for on-demand cases or expressed in wall-clock time. A segment list may comprise a locator, for example a URL to an optional initial representation metadata, as well as a list of media segments. Each media segment may have been assigned a starttime, a duration and a locator. The starttime typically expresses an approximation of the media time of the contained media in a segment, but not necessarily a sample accurate time. The starttime is used by the HTTP streaming client to issue the download request at the appropriate time. The generation of the segment list, including the start time of each, may be done in different ways. The URLs may be provided as a play list or a URL construction rule may advantageously be used for a compact representation of the segment list.

A segment list based on URL construction may, for example, be carried out if the MPD signals that by a specific attribute or element such as FileDynamicInfo or an equivalent signal. A generic way to create a segment list from a URL construction is provided below in the "URL Construction Overview" section. A playlist-based construction may, for example, be signaled by a different signal. Seeking in segment list and getting to an accurate media time is also advantageously implemented in this context.

URL Constructor Overview

As previously described, in one embodiment of the present invention there may be provided a metadata file containing URL construction rules which allow client devices to construct the file identifiers for Blocks of the presentation. We now describe a further novel enhancement to the block request streaming system which provides for changes in the metadata file, including changes to the URL construction rules, changes to the number of available encodings, changes to metadata associated with the available encodings such as bitrate, aspect ratio, resolution, audio or video codec or codec parameters or other parameters.

In this novel enhancement, there may be provided additional data associated with each element of the metadata file indicating a time interval within the overall presentation. Within this time interval the element may be considered valid and otherwise the time interval the element may be ignored. Furthermore, the syntax of the metadata may be enhanced such that elements previously allowed to appear only once or at most once may appear multiple times. An additional restriction may be applied in this case that provides that for such elements the specified time intervals must be disjoint. At any given time instant, considering only the elements whose time interval contains the given time instant results in a metadata file that is consistent with the original metadata syntax. We call such time intervals validity intervals. This method therefore provides for signaling within a single metadata file changes of the kind described above. Advantageously, such a method can be used to provide a media presentation that supports changes of the kind described at specified points within the presentation.

URL Constructor

As described herein, a common feature of block-request streaming systems is the need to provide the client with "metadata" that identifies the available media encodings and provides information needed by the client to request the blocks from those encodings. For example in the case of HTTP this information might comprise URLs for the files containing the media blocks. A playlist file may be provided which lists the URLs for the blocks for a given encoding. Multiple playlist files are provided, one for each encoding, together with a master playlist-of-playlists that lists the playlists corresponding to the different encodings. A disadvantage of this system is that the metadata can become quite large and therefore takes some time to be requested when the client begins the stream. A further disadvantage of this system is evident in the case of live content, when the files corresponding to the media data blocks are generated "on-the-fly" from a media stream which is being captured in real time (live), for example a live sports event or news program. In this case the playlist files may be updated each time a new block is available (for example every few seconds). Client devices may repeatedly fetch the playlist file to determine if new blocks are available and obtain their URLs. This may place a significant load on the serving infrastructure and in particular means that metadata files cannot be cached for longer than the update interval, which is equal to the block size which is commonly of the order of a few seconds.

One important aspect of a block-request streaming system is the method used to inform clients of the file identifiers, for example URLs, that should be used, together with the file download protocol, to request Blocks. For example, a method in which for each representation of a presentation there is provided a playlist file which lists the URLs of the files containing the Blocks of media data. A disadvantage of this method is that at least some of the playlist file itself needs to be downloaded before playout can begin, increasing the channel zapping time and therefore causing a poor user experience. For a long media presentation with several or many representations, the list of file URLs may be large and hence the playlist file may be large further increasing the channel zapping time.

Another disadvantage of this method occurs in the case of live content. In this case, the complete list of URLs is not made available in advance and the playlist file is periodically updated as new blocks become available and clients periodically request the playlist file, in order to receive the updated version. Because this file is frequently updated it cannot be stored for long within the caching proxy servers. This means that very many of the requests for this file will be forwarded to other servers and eventually to the server which generates the file. In the case of a popular media presentation this may result in a high load on this server and the network, which may in turn result in a slow response time and therefore a high channel zapping time and poor user experience. In the worst case the server becomes overloaded and this results in some users being unable to view the presentation.

It is desirable in the design of a block-request streaming system to avoid placing restrictions on the form of the file identifiers that may be used. This is because a number of considerations may motivate the use of identifiers of a particular form. For example, in the case that the Block Serving Infrastructure is a Content Delivery Network there may be file naming or storage conventions related to a desire to distribute storage or serving load across the network or other requirements which lead to particular forms of file identifier which cannot be predicted at system design time.

A further embodiment is now described which mitigates the above mentioned disadvantages while retaining flexibility to choose appropriate file identification conventions. In this method metadata may be provided for each representation of the media presentation comprising a file identifier construction rule. The file identifier construction rule may for example comprise a text string. In order to determine the file identifier for a given block of the presentation, a method of interpretation of the file identifier construction rule may be provided, this method comprising determination of input parameters and evaluation of the file identification construction rule together with the input parameters. The input parameters may for example include an index of the file to be identified, where the first file has index zero, the second has index one, the third has index two and so on. For example, in the case that every file spans the same time duration (or approximately the same time duration), then the index of the file associated with any given time within the presentation can easily be determined. Alternatively, the time within the presentation spanned by each file may be provided within the presentation or version metadata.

In one embodiment, the file identifier construction rule may comprise a text string that may contain certain special identifiers corresponding to the input parameters. The method of evaluation of the file identifier construction rule comprises determining the positions of the special identifiers within the text string and replacing each such special identifier with a string representation of the value of the corresponding input parameter.

In another embodiment, the file identifier construction rule may comprise a text string conforming to an expression language. An expression language comprises a definition of a syntax to which expressions in the language may conform and a set of rules for evaluating a string conforming to the syntax.

A specific example will now be described, with reference to FIG. 21 et seq. An example of a syntax definition for a suitable expression language, defined in Augmented Backus-Naur Form, is as shown in FIG. 21. An example of rules for evaluating a string conforming to the <expression> production in FIG. 21 comprises recursively transforming the string conformant to the <expression> production (an <expression>) into a string conformant to the <literal> production as follows:

An <expression> conformant to the <literal> production is unchanged.

An <expression> conformant to the <variable> production is replaced with the value of the variable identified by the <token> string of the <variable> production.

An <expression> conformant to the <function> production is evaluated by evaluating each of its arguments according to these rules and applying a transformation to these arguments dependent on the <token> element of the <function> production as described below.

An <expression> conformant to the last alternative of the <expression> production is evaluated by evaluating the two <expression> elements and applying an operation to these arguments dependent on the <operator> element of the last alternative of the <expression> production as described below.

In the method described above it is assumed that the evaluation takes place in a context in which a plurality of variables may be defined. A variable is a (name, value) pair where "name" is a string conformant to the <token> production and "value" is a string conformant to the <literal> production. Some variables may be defined outside the evaluation process before evaluation begins. Other variables may be defined within the evaluation process itself. All variables are "global" in the sense that only one variable exists with each possible "name".

An example of a function is the "printf" function. This function accepts one or more arguments. The first argument may be conformant to the <string> production (hereinafter a "string"). The printf function evaluates to a transformed version of its first argument. The transformation applied is the same as the "printf" function of the C standard library, with the additional arguments included in the <function> production supplying the additional arguments expected by the C standard library printf function.

Another example of a function is the "hash" function. This function accepts two arguments, the first of which may be a string and the second of which may be conformant to the <number> production (hereinafter a "number"). The "hash" function applies a hash algorithm to the first argument and returns a results which is a nonnegative integer number less than the second argument. An example of a suitable hash function is given in the C function shown in FIG. 22, whose arguments are the input string (excluding the enclosing quotation marks) and the numeric input value. Other examples of hash functions are well known to those of skill in the art.

Another example of a function is the "Subst" function which takes one, two or three string arguments. In the case that one argument is supplied the result of the "Subst" function is the first argument. In the case that two arguments are supplied then the result of the "Subst" function is computed by erasing any occurrences of the second argument (excluding the enclosing quotation marks) within the first argument and returning the first argument so modified. In the case that three arguments are supplied then the result of the "Subst" function is computed by replacing any occurrences of the second argument (excluding the enclosing quotation marks) within the first argument with the third argument (excluding the enclosing quotation marks) and returning the first argument so modified.

Some examples of operators are the addition, subtraction, division, multiplication and modulus operators, identified by the <operator> productions '+', '−', '/', '*', '%' respectively. These operators require that the <expression> productions either side of the <operator> production evaluate to numbers. The evaluation of the operator comprises applying the appropriate arithmetic operation (addition, subtraction, division, multiplication and modulus respectively) to these two numbers in the usual way and returning the result in a form compliant to the <number> production.

Another example of an operator is the assignment operator, identified by the <operator> production '='. This operator requires that the left argument evaluates to a string the content of which is compliant to the <token> production. The content of a string is defined to be the character string within the enclosing quotation marks. The equality operator causes the variable whose name is the <token> equal to the content of the left argument to be assigned a value equal to the result of evaluating the right argument. This value is also the result of evaluating the operator expression.

Another example of an operator is the sequence operator, identified by the <operator> production ';'. The result of evaluating this operator is the right argument. Note that as with all operators, both arguments are evaluated and the left argument is evaluated first.

In one embodiment of this invention the identifier of a file may be obtained by evaluating a file identifier construction rule according to the above rule with a specific set of input variables which identify the required file. An example of an input variable is the variable with name "index" and value equal to the numeric index of the file within the presentation. Another example of an input variable is the variable with name "bitrate" and value equal to the average bitrate of the required version of the presentation.

FIG. 23 illustrates some examples of file identifier construction rules, where the input variables are "id", giving an identifier for the representation of the presentation desired and "seq", giving a sequence number for the file As will be clear to those of skill in the art upon reading this disclosure, numerous variations of the method above are possible. For example, not all the functions and operators described above may be provided or additional functions or operators may be provided.

URL Construction Rules and Timing

This section provides basic URI Construction Rules to assign a file or segment URI as well as a start time for each segment within a representation and the media presentation.

For this clause the availability of a media presentation description at the client is assumed.

Assume that the HTTP streaming client is playing out media that is downloaded within a media presentation. The HTTP client's actual presentation time may be defined as to where the presentation time is relative to the start of the presentation. At initialization, the presentation time t=0 can be assumed.

At any point t, the HTTP client may download any data with play-time tP (also relative to the start of the presentation) at most MaximumClientPreBufferTime ahead of the actual presentation time t and any data that is required due to a user interaction, e.g. seek, fast-forward, etc. In some embodiments the MaximumClientPreBufferTime may not even be specified in a sense that a client can download data ahead of the current play-time tP without restrictions.

The HTTP client may avoid downloading unnecessary data, e.g. any segments from representations that are not expected to be played-out may typically not be downloaded.

The basic process in providing the streaming services may be the downloading of data by the generation of appropriate requests to download entire files/segments or subset of files/segments, for example by using HTTP GET requests or HTTP partial GET requests. This description addresses how to access the data for a specific play-time tP but generally the client may download data for a larger time range of play-time to avoid inefficient requests. The HTTP client may minimize the number/frequency of HTTP requests in providing the streaming service.

For accessing media data at play-time tP or at least close to the play-time tP in a specific representation the client determines the URL to the file that contains this play-time and in addition determines the byte range in the file to access this play-time.

The Media Presentation Description may assign a representation id, r, to each representation, for example by the use of the RepresentationID attribute. In other words, the content of the MPD, when written by the ingestion system or when read by the client, will be interpreted such that there is an assignment. In order to download data for a specific play-time tP for a specific representation with id r, the client may construct an appropriate URI for a file.

The Media Presentation Description may assign each file or segment of each representation r the following attributes:

(a) a sequence number i of the file within the representation r, with i=1, 2, . . . , Nr, (b) the relative start time of the file with representation id r and file index i relative to the presentation time, defined as ts(r,i), (c) the file URI for the file/segment with representation id r and file index i, denoted as FileURI(r, i).

In one embodiment the start time of the file and the file URIs may be provided explicitly for a representation. In another embodiment, a list of file URIs may be provided explicitly where each file URI gets inherently assigned the index i according to the position in the list and the start time of the segment is derived as the sum of all segment durations for the segments from 1 to i−1. The duration of each segment may be provided according to any of the rules discussed above. For example, any skilled in basic mathematics may use other methods to derive a methodology to easily derive start time from a single element or attribute and the position/index of the file URI in the representation.

If a dynamic URI construction rule is provided in the MPD, then the start time of each file and each file URI may be constructed dynamically by using a construction rule, the index of the requested file and potentially some additional parameters provided in the media presentation description. The information may for example be provided in MPD attributes and elements such as FileURIPattern and FileInfoDynamic. The FileURIPattern provides information on how to construct the URIs based on the file index sequence number i and the representation ID r. The FileURIFormat is constructed as:

FileURIFormat=sprintf("% s % s % s % s. % s", BaseURI, BaseFileName,
 RepresentationIDFormat, SeparatorFormat,
 FileSequenceIDFormat, FileExtension);
and the FileURI(r,i) is constructed as
FileURI(r,i)=sprintf(FileURIFormat, r, i);

The relative start time ts(r,i) for each file/segment may be derived by some attribute contained in the MPD describing the duration of the segments in this representation, for example the FileInfoDynamic attribute. The MPD may also contain a sequence of FileInfoDynamic attributes that is global for all representations in the media presentation or at least for all representations in a period in the same way as specified above. If media data for a specific play-time tP in representation r is requested, the corresponding index i(r, tP) may be derived as i(r, $t_p$) such that that the play-time of this index is in the interval of the start time of ts(r, i(r, tP)) and ts(r, i(r, tP)+1). The segment access may be further restricted by cases above, for example the segment is not accessible.

To access the exact play-time tP once the index and the URI of the corresponding segment is obtained depends on the actual segment format. In this example assume that the media segments has a local time line that starts at 0 without loss of generality. To access and present the data at play-time tP the client may download the data corresponding to the local time from the file/segment that can be accessed through the URI FileURI(r,i) with i=i(r, $t_p$).

Generally, clients may download the entire file and can then access the play-time tP. However, not necessarily all information of the 3GP file needs to be downloaded, as the 3GP file provides structures to map the local timing to byte ranges. Therefore, only the specific byte ranges to access play-time tP may be sufficient to play the media as long as sufficient random access information is available. Also sufficient information on structure and mapping of the byte range and the local timing of the media segment may be provided in the initial part of the segment, for example using a segment index. By having access to the initial e.g., 1200 bytes of the segment, the client may have sufficient information to directly access the byte range necessary to play time tP.

In a further example assume that the segment index, possibly specified as the "tidx" box as below may be used to identify the byte offsets of the required Fragment or Fragments. Partial GET requests may be formed for the required Fragment or Fragments. There are other alternatives, for example, the client may issue a standard request for the file and cancel this when the first "tidx" box has been received.

Seeking

A client may attempt to seek to a specific presentation time tp in a representation. Based on the MPD, the client has access to the media segment start time and media segment URL of each segment in the representation. The client may get the segment index segment_index of the segment most likely to contain media samples for presentation time tp as the maximum segment index i, for which the start time tS(r,i) is smaller or equal to the presentation time tp i.e. segment_index=max {i|tS(r,i)<=tp}. The segment URL is obtained as FileURI(r,i).

Note that timing information in the MPD may be approximate, due to issues related to placement of Random Access Points, alignment of media tracks and media timing drift. As a result, the segment identified by the procedure above may begin at a time slightly after tp and the media data for presentation time tp may be in the previous media segment. In the case of seeking, either the seek time may be updated to equal the first sample time of the retrieved file, or the preceding file may be retrieved instead. However, note that during continuous playout, including cases where there is a switch between alternative representations/versions, the media data for the time between tp and the start of the retrieved segment is nonetheless available.

For accurate seeking to a presentation time tp, the HTTP streaming client needs to access a random access point (RAP). To determine the random access point in a media segment in the case of 3GPP Adaptive HTTP Streaming, the client may, for example, use the information in the 'tidx' or 'sidx' box, if present, to locate the random access points and the corresponding presentation time in the media presentation. In cases where a segment is a 3GPP movie fragment, it is also possible for the client to use information within the 'moor' and 'mdat' boxes, for example, to locate RAPs and obtain the necessary presentation time from the information in the movie fragment and the segment start time derived from the MPD. If no RAP with presentation time before the requested presentation time tp is available, the client may either access the previous segment or may just use the first random access point as the seek result. When media segments start with a RAP, these procedures are simple.

Also note that not necessarily all information of the media segment needs to be downloaded to access the presentation time tp. The client may, for example, initially request the 'tidx' or 'sidx' box from the beginning of the media segment using byte range requests. By use of the 'tidx' or 'sidx' boxes, segment timing can be mapped to byte ranges of the segment. By continuously using partial HTTP requests, only the relevant parts of the media segment need be accessed, for improved user experience and low start-up delays.

Segment List Generation

As described herein, it should be apparent how to implement a straightforward HTTP streaming client that uses the information provided by the MPD to create a list of segments for a representation that has a signalled approximate segment duration of dur. In some embodiments, the client may assign the media segments within a representation consecutive indices i=1, 2, 3, . . . , i.e., the first media segment is assigned index i=1, the second media segment is assigned the index i=2, and so on. Then, the list of media segments with segment indices i is assigned startTime[i] and URL[i] is generated, for example, as follows. First, the index i is set to 1. The start time of the first media segment is obtained as 0, startTime[1]=0. The URL of the media segment i, URL[i], is obtained as FileURI(r, i). The process is continued for all described media segments with index i and the startTime[i] of media segment i is obtained as (i−1)*dur and the URL[i], is obtained as FileURI(r, i).

Concurrent HTTP/TCP Requests

A concern in a block-request streaming system is a desire to always request the highest-quality blocks that can be completely received in time for playout. However, the data arrival rate may not be known in advance and so it may happen that a requested block does not arrive in time to be played out. This results in a need to pause the media playout, which results in a poor user experience. This problem can be mitigated by client algorithms that take a conservative approach to the selection of blocks to request by requesting blocks of lower quality (and so of lower size) that are more likely to be received in time, even if the data arrival rate falls during the reception of the block. However this conservative approach has the disadvantage of possibly delivering a lower quality playout to the user or destination device, which is also a poor user experience. The problem may be magnified when multiple HTTP connections are used at the same time to download different blocks, as described below, since available network resources are shared across connections and thus are being simultaneously used for blocks with different playout times.

It may be advantageous for the client to issue requests for multiple blocks concurrently, where in this context "concurrently" means responses to requests are occurring in overlapping time intervals, and it is not necessarily the case that the requests are made at precisely or even approximately the same time. In the case of the HTTP protocol, this approach may improve utilization of the available bandwidth due to the behavior of the TCP protocol (as is well known). This can be especially important to improve the content zapping time, as when a new content is first requested the corresponding HTTP/TCP connections over which data for the blocks is requested might be slow to start, and thus using several HTTP/TCP connections at this point can dramatically speed up the data delivery time of the first blocks. However, requesting different blocks or fragments over different HTTP/TCP connections can also lead to degraded performance, as the requests for the blocks that are to be played out first are competing with the requests for the subsequent blocks, competing HTTP/TCP downloads vary greatly in their delivery speed and thus the completion time of the request can be highly variable, and it is generally not possible to control which HTTP/TCP downloads will completely quickly and which will be slower, and thus it is likely that at least some of the time the HTTP/TCP downloads of the first few blocks will be the last to complete, thus leading to large and variable channel zapping times.

Suppose that each block or fragment of a segment is downloaded over a separate HTTP/TCP connection, and that the number of parallel connections is n and the playout duration of each block is t seconds, and that the streaming rate of the content associated with the segment is S. When the client first begins to stream the content, requests may be issued for the first n blocks, representing n*t seconds of media data.

As is known to those of skill in the art, there is a large variation in the data rate of TCP connections. However, to simplify this discussion, suppose ideally that all connections are proceeding in parallel such that the first block will be completely received at about the same time as the other n−1 blocks requested. To simplify the discussion further, assume that the aggregate bandwidth utilized by the n download connections is fixed to a value B for the entire duration of the download, and that the streaming rate S is constant over the entire representation. Suppose further that the media data structure is such that playout of a block can be done when the entire block is available at the client, i.e., playout of a block can only start after the entire block is received, e.g., due to the structure of the underlying video encoding, or because encryption is being employed to encrypt each fragment or block separately, and thus the entire fragment or block needs to be received before it can be decrypted. Thus, to simplify the discussion below, we assume that an entire block needs to be received before any of the block can be played out. Then, the time required before the first block has arrived and can be played out is approximately n*t*S/B.

Since it is desirable to minimize content zapping time, it is therefore desirable to minimize n*t*S/B. The value of t may be determined by factors such as the underlying video encoding structure and how the ingestion methods are utilized, and thus t can be reasonably small, but very small values of t lead to an overly complicated segment map and possibly may be incompatible with efficient video encoding and decryption, if used. The value of n may also affect the value of B, i.e., B may be larger for a larger number n of connections, and thus reducing the number of connections, n, has the negative side effect of potentially reducing the amount of available bandwidth that is utilized, B, and so may not be effective in achieving the goal of reducing the content zapping time. The value of S depends on which representation is chosen to download and playout, and ideally S should be as close to B as possible in order to maximize the playout quality of the media for the given network conditions. Thus, to simplify this discussion, assume that S is approximately equal to B. Then, the channel zapping time is proportional to n*t. Thus, utilizing more connections to download different fragments can degrade the channel zapping time if the aggregate bandwidth utilized by the connections is sub-linearly proportional to the number of connections, which is typically the case.

As an example, suppose t=1 second, and with n=1 the value of B=500 Kbps, and with n=2 the value of B=700 Kbps, and with n=3 the value of B=800 Kbps. Suppose that the representation with S=700 Kbps is chosen. Then, with n=1 the download time for the first block is 1*700/500=1.4 seconds, with n=2 the download time for the first block is 2*700/700=2 seconds, and with n=3 the download time for the first block is 3*700/800=2.625 seconds. Furthermore, as the number of connections increases the variability in the individual download speeds of the connections is likely to increase (although even with one connection there is likely to be some significant variability). Thus, in this example, the channel zapping time and the variability in the channel zapping time increases as the number of connections increases. Intuitively, the blocks that are being delivered have different priorities, i.e., the first block has the earliest delivery deadline, the second block has the second earliest deadline, etc., whereas the download connections over which the blocks are being delivered are competing for network resources during the delivery, and thus the blocks with the earliest deadlines become more delayed as more competing blocks are requested. On the other hand, even in this case, ultimately using more than one download connection allows support of a sustainably higher streaming rate, e.g, with three connections a streaming rate of up to 800 Kbps can be supported in this example, whereas only a stream of 500 Kbps can be supported with one connection.

In practice, as noted above, the data rate of a connection may be highly variable both within the same connection over time and between connections and, as a result, the n requested blocks generally do not complete at the same time and in fact it can commonly be the case that one block may complete in half the time of another block. This effect results in unpredictable behavior since in some cases the first block may complete much sooner than other blocks and in other cases the first block may complete much later than other blocks, and as a result the beginning of playout may in some cases occur relatively quickly and in other cases may be slow to occur. This unpredictable behavior may be frustrating for the user and may therefore be considered a poor user experience.

What is needed therefore are methods in which multiple TCP connections can be utilized to improve the channel zapping time and the variability in channel zapping time, while at the same time supporting a good quality streaming rate possible. What is also needed are methods to allow for the share of available bandwidth allocated to each block to be adjusted as the playout time of a block approaches, so that, if necessary, a greater share of available bandwidth can be allocated towards the block with the nearest playout time.

Cooperative HTTP/TCP Requesting

We now describe methods for using concurrent HTTP/TCP requests in a cooperative fashion. A receiver may employ multiple concurrent cooperative HTTP/TCP requests, for example using a plurality of HTTP byte-range requests, wherein each such request is for a portion of a fragment in a source segment, or all of a fragment of a source segment, or a portion or a repair fragment of a repair segment, or for all of a repair fragment of a repair segment.

The advantages of cooperative HTTP/TCP requests together with usage of FEC repair data may be especially important to provide consistently quick channel zapping times. For example, at a channel zapping time it is likely that the TCP connections have either just been started or have been idle for some period of time, in which case the congestion window, cwnd, is at its minimal value for the connections, and thus the delivery speed of these TCP connections will take several round-trip times (RTTs) to ramp up, and there will be high variability in the delivery speeds over the different TCP connections during this ramp-up time.

An overview of the No-FEC method is now described, which is a cooperative HTTP/TCP request method wherein only media data of source blocks is requested using multiple concurrent HTTP/TCP connections, i.e., no FEC repair data is requested. With the No-FEC method, portions of the same fragment are requested over different connections, e.g., using HTTP byte range requests for portions of the fragment, and thus for example each HTTP byte range request is for a portion of the byte range indicated in the segment map for the fragment. It may be the case that an individual HTTP/TCP request ramps up it delivery speed to fully utilize the available bandwidth over several RTTs (round-trip times), and thus there is a relative long period of time where the delivery speed is less than the available bandwidth, and thus if a single HTTP/TCP connection is used to download for example the first fragment of a content to be played out, the channel zapping time could be large. Using the No-FEC method, downloading different portions of the same fragment over different HTTP/TCP connections can significantly reduce the channel zapping time.

An overview of the FEC method is now described, which is a cooperative HTTP/TCP request method wherein media data of a source segment and FEC repair data generated from the media data is requested using multiple concurrent HTTP/TCP connections. With the FEC method, portions of the same fragment and FEC repair data generated from that fragment are requested over different connections, using HTTP byte range requests for portions of the fragment, and thus for example each HTTP byte range request is for a portion of the byte range indicated in the segment map for the fragment. It may be the case that an individual HTTP/TCP request ramps up it delivery speed to fully utilize the available bandwidth over several RTTs (round-trip times), and thus there is a relative long period of time where the delivery speed is less than the available bandwidth, and thus if a single HTTP/TCP connection is used to download for example the first fragment of a content to be played out, the channel zapping time could be large. Using the FEC method has the same advantages as the No-FEC method, and has the additional advantage that not all of the requested data needs to arrive before the fragment can be recovered, thus further reducing the channel zapping time and the variability in the channel zapping time. By making requests over different TCP connections, and over-requesting by also requesting FEC repair data on at least one of the connections, the amount of time it takes to deliver a sufficient amount of data to for example recover the first requested fragment that enables media playback to start, can be greatly reduced and made to be much more consistent than if cooperative TCP connections and FEC repair data was not used.

Figure 24:
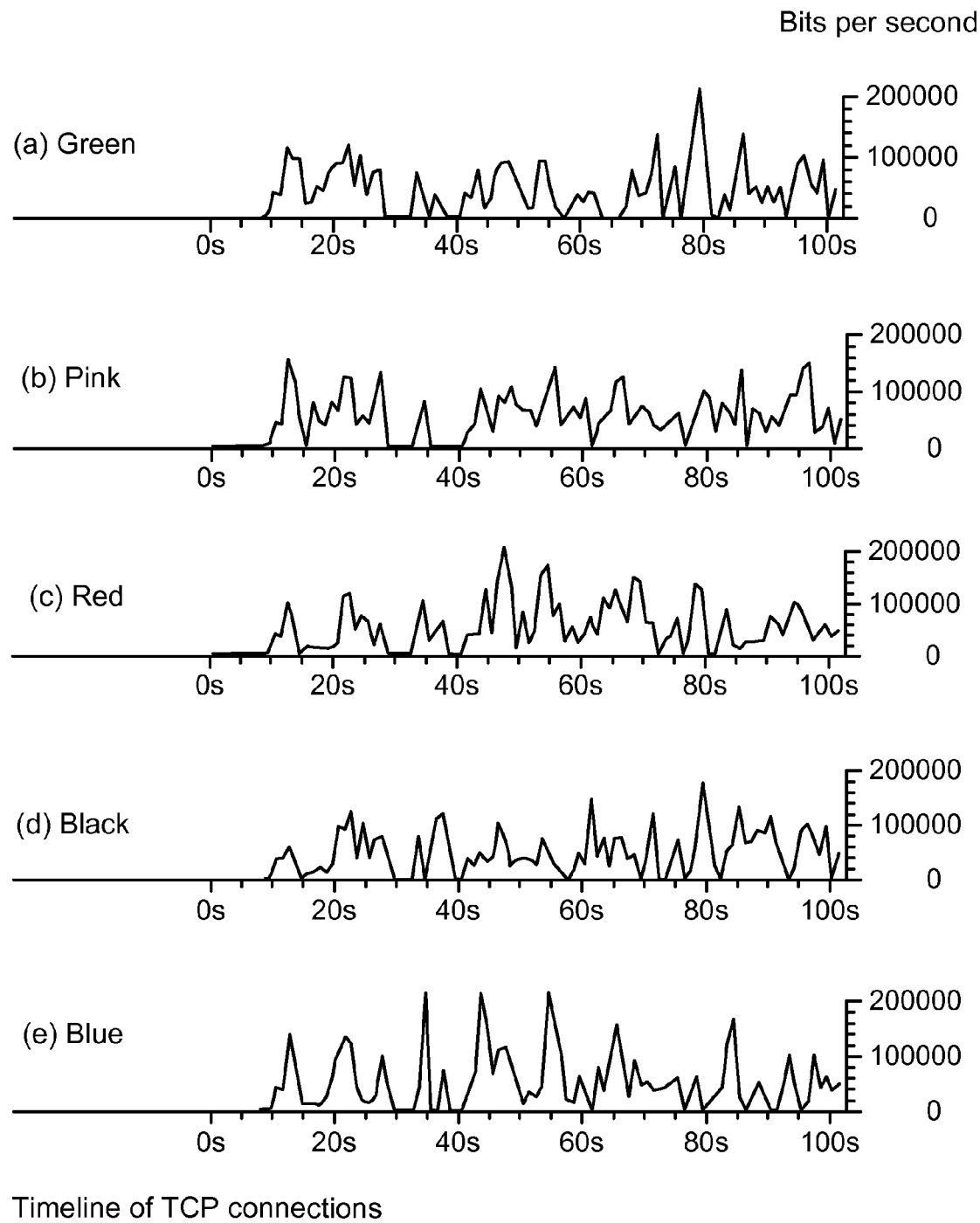
FIG. 24 illustrates bandwidth fluctuations of various TCP connections.

FIG. 24 shows an example of five charts (a), (b), (c), (d), and (e) illustrating the delivery rate fluctuations of 5 TCP connections running over the same link to the same client from the same HTTP web server of an emulated evolution data optimized (EVDO) network. In FIG. 24, the X-axis of the five charts (a), (b), (c), (d), and (e) shows time in seconds, and the Y-axis shows the rate at which bits are received at the client over each of the 5 TCP connections measured over intervals of 1 second, for each connection. In this particular emulation, there were 12 TCP connections in total running over this link, and thus the network was relatively loaded during the time shown, which might be typical when more than one client is streaming within the same cell of a mobile network. Note that although the delivery rates are somewhat correlated over time, there are wide difference in the delivery rates of the 5 connections at many points in time.

Figure 25:
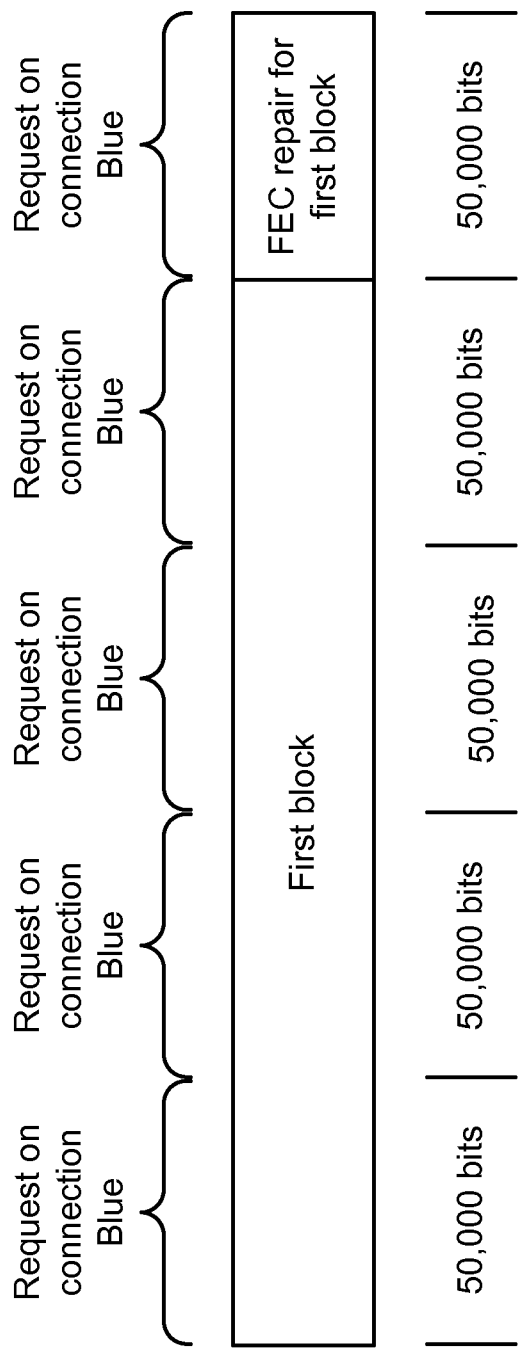
FIG. 25 illustrates multiple HTTP requests for source and repair data.

FIG. 25 shows a possible request structure for a fragment that is 250,000 bits in size (approximately 31.25 kilobytes), where there are 4 HTTP byte range requests made in parallel for different parts of the fragment, i.e., the first HTTP connection requests the first 50,000 bits, the second HTTP connection requests the next 50,000 bits, the third HTTP connection requests the next 50,000 bits, and the fourth HTTP connection requests the next 50,000 bits. If FEC is not used, i.e., the No-FEC method, then these are the only 4 requests for the fragment in this example. If FEC is used, i.e., the FEC method, then in this example there is one additional HTTP connection that requests an additional 50,000 bits of FEC repair data of a repair segment generated from the fragment.

Figure 26:
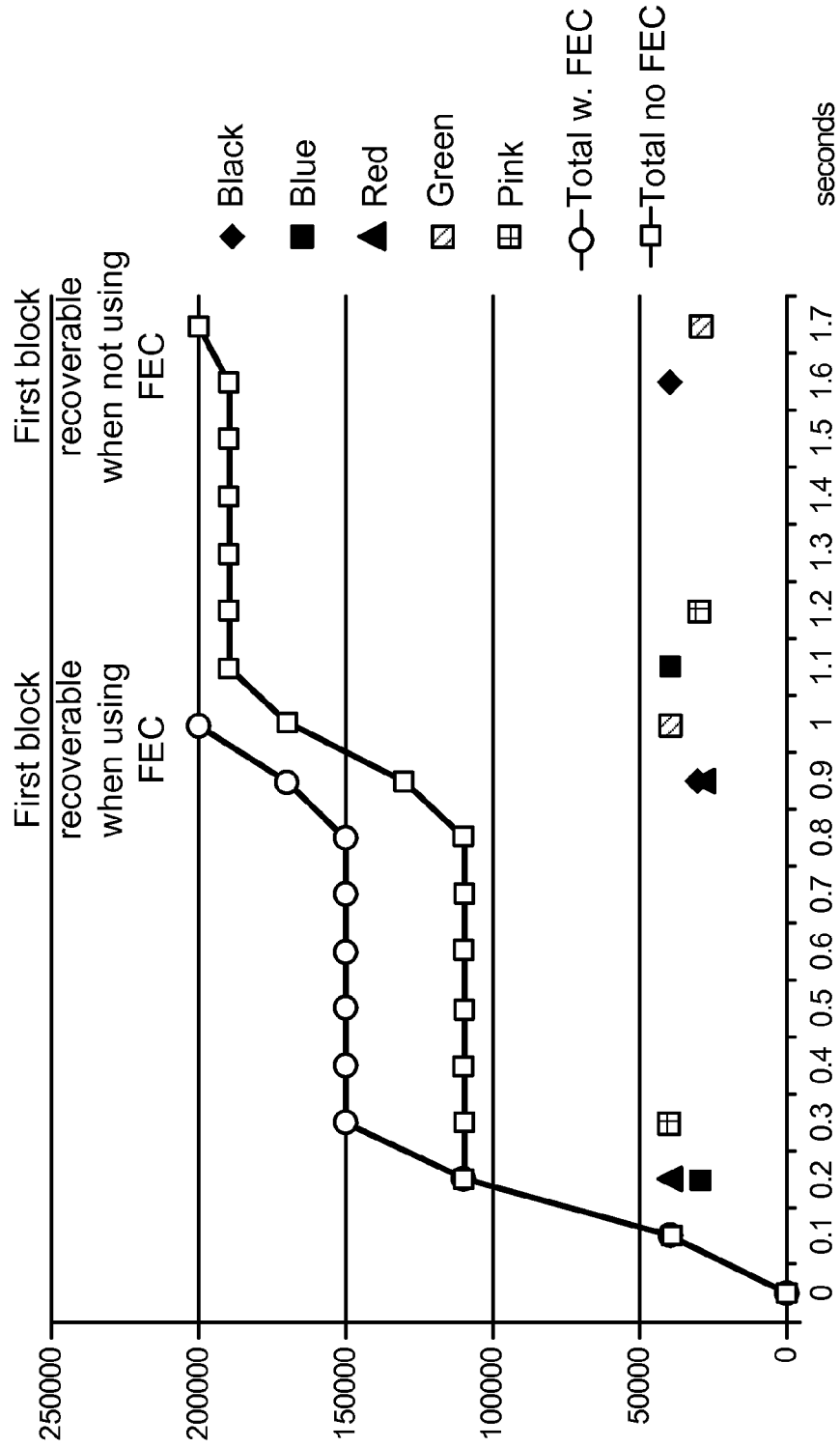
FIG. 26 illustrates example channel zapping time with and without FEC.

FIG. 26 is a blowup of the first couple of seconds of the 5 TCP connections illustrated by the charts (a), (b), (c), (d), and (e) shown in FIG. 24, where in FIG. 26 the X-axis shows time at intervals of 100 milliseconds, and the Y-axis shows the rate at which bits are received at the client over each of the 5 TCP connections measured over intervals of 100 milliseconds. One line shows the aggregate amount of bits that has been received at the client for the fragment from the first 4 HTTP connections (excluding the HTTP connection over which FEC data is requested), i.e., what arrives using the No-FEC method. Another line shows the aggregate amount of bits that has been received at the client for the fragment from all 5 of the HTTP connections (including the HTTP connection over which FEC data is requested), i.e., what arrives using the FEC method. For the FEC method, it is assumed that the fragment can be FEC decoded from reception of any 200,000 bits of the 250,000 requested bits, which can be realized if for example a Reed-Solomon FEC code is used, and which can be essentially realized if for example the RaptorQ code described in Luby IV is used. For the FEC method in this example, enough data is received to recover the fragment using FEC decoding after 1 second, allowing a channel zapping time of 1 second (assuming that the data for subsequent fragments can be requested and received before the first fragment is fully played out). For the No-FEC method in this example, all the data for the 4 requests has to be received before the fragment can be recovered, which occurs after 1.7 seconds, leading to a channel zapping time of 1.7 seconds. Thus, in the example shown in FIG. 26, the No-FEC method is 70% worse in terms of channel zapping time than the FEC method. One of the reasons for the advantage shown by the FEC method in this example is that, for the FEC method, reception of any 80% of the requested data allows recovery of the fragment, whereas for the No-FEC method, reception of 100% of the requested data is required. Thus, the No-FEC method has to wait for the slowest TCP connection to finish delivery, and because of natural variations in the TCP delivery rate there is apt to be wide variance in the delivery speed of the slowest TCP connection compared to an average TCP connection. With the FEC method in this example, one slow TCP connection does not determine when the fragment is recoverable. Instead, for the FEC method, the delivery of enough data is much more a function of the average TCP delivery rate than the worse case TCP delivery rate.

There are many variations of the No-FEC method and the FEC method described above. For example, the cooperative HTTP/TCP requests may be used for only the first few fragments after a channel zap has occurred, and thereafter only a single HTTP/TCP request is used to download further fragments, multiple fragments, or entire segments. As another example, the number of cooperative HTTP/TCP connections used can be a function of both the urgency of the fragments being requested, i.e., how imminent is the playout time of these fragments, and of the current network conditions.

In some variations, a plurality of HTTP connections may be used to request repair data from repair segments. In other variations, different amounts of data may be requested on different HTTP connections, for example depending on the current size of the media buffer and the rate of data reception at the client. In another variation, the source representations are not independent of one another, but instead represent a layered media coding, where for example an enhanced source representation may depend on a base source representation. In this case, there may be a repair representation corresponding to the base source representation, and another repair representation corresponding to the combination of the base and enhancement source representations.

Additional overall elements add to the advantages one may realize by the methods disclosed above. For example, the number of HTTP connections used may vary depending on the current amount of media in the media buffer, and/or the rate of reception into the media buffer. Cooperative HTTP requests using FEC, i.e., the FEC method described above and variants of that method, can be used aggressively when the media buffer is relatively empty, e.g., more cooperative HTTP requests are made in parallel for different parts of the first fragment, requesting all of the source fragment and a relatively large fraction of the repair data from the corresponding repair fragment, and then transitioning to a reduced number of concurrent HTTP requests, requesting larger portions of the media data per request, and requesting a smaller fraction of repair data, e.g., transitioning to 1, 2 or 3 concurrent HTTP requests, transitioning to making requests for full fragments or multiple consecutive fragments per request, and transitioning to requesting no repair data, as the media buffer grows.

As another example, the amount of FEC repair data might vary as a function of the media buffer size, i.e., when the media buffer is small then more FEC repair data might be requested, and as the media buffer grows then the amount of FEC repair data requested might diminish, and at some point when the media buffer is sufficiently large then no FEC repair data may be requested, only data from source segments of source representations. The benefits of such enhanced techniques is that they may allow faster and more consistent channel zapping times, and more resilience against potential media stutters or stalls, while at the same time minimizing the amount of additional bandwidth used beyond the amount that would be consumed by just delivering the media in the source segments by reducing both request message traffic and FEC repair data, while at the same time enabling support of the highest media rates possible for the given network conditions.

Additional Enhancements when Using Concurrent HTTP Connections

An HTTP/TCP request may be abandoned if a suitable condition is met and another HTTP/TCP request may be made to download data that may replace the data requested in the abandoned request, wherein the second HTTP/TCP request may request exactly the same data as in the original request, e.g., source data; or overlapping data, e.g., some of the same source data and repair data that had not been requested in the first request; or completely disjoint data, e.g., repair data that had not been requested in the first request. An example of a suitable condition is that a request fails due to the absence of a response from the Block Server Infrastructure (BSI) within a provided time or a failure in the establishment of a transport connection to the BSI or receipt of an explicit failure message from the server or another failure condition.

Another example of a suitable condition is that receipt of data is proceeding unusually slowly, according to a comparison of a measure of the connection speed (data arrival rate in response to the request in question) with the expected connection speed or with an estimate of the connection speed required to receive the response before the playout time of the media data contained therein or another time dependent upon that time.

This approach has advantage in the case that the BSI sometimes exhibits failures or poor performance. In this case the approach above increases the probability that the client can continue reliable playout of the media data despite failures or poor performance within the BSI. Note that in some cases there may be advantage to designing the BSI in such a way that it does exhibit such failures or poor performance on occasions, for example such a design may have a lower cost than an alternative design that does not exhibit such failures or poor performance or which exhibits these less often. In this case the method described herein has further advantage in that it permits the utilization of such a lower cost design for the BSI without a consequent degradation in the user experience.

In another embodiment, the number of requests issued for data corresponding to a given block may be dependent on whether a suitable condition with respect to the block is met. If the condition is not met then the client may be restricted from making further requests for the block if the successful completion of all currently incomplete data requests for the block would allow recovery of the block with high probability. If the condition is met then a larger number of requests for the block may be issued, i.e., the restriction above does not apply. An example of a suitable condition is that the time until the scheduled playout time of the block or another time dependent on that time falls below a provided threshold. This method has advantage because additional requests for data for a block are issued when receipt of the block becomes more urgent, because the play out time of the media data comprising the block is close. In the case of common transport protocols such as HTTP/TCP, these additional requests have the effect of increasing the share of the available bandwidth dedicated to data that contributes to reception of the block in question. This reduces the time required for reception of sufficient data to recover the block to complete and therefore reduces the probability that the block cannot be recovered before the scheduled play out time of the media data comprising the block. As described above, if the block cannot be recovered before the scheduled play out time of the media data comprising the block than the playout may pause resulting in a poor user experience and therefore the method described here advantageously reduces the probability of this poor user experience.

It should be understood that throughout this specification references to the scheduled playout time of a block refers to the time at which the encoded media data comprising the block may first be available at the client in order to achieve playout of the presentation without pausing. As will be clear to those of skill in the art of media presentation systems, this time is in practice slightly before the actual time of the appearance of the media comprising the block at the physical transducers used for playout (screen, speaker etc.) since several transformation functions may need to be applied to the media data comprising the block to effect actual playout of that block and these functions may require a certain amount of time to complete. For example media data is generally transported in compressed form and a decompression transformation may be applied.

Methods for Generating File Structures Supporting Cooperative HTTP/FEC Methods

An embodiment to generate a file structure that may be used advantageously by a client employing cooperative HTTP/FEC methods is now described. In this embodiment, for each source segment there is a corresponding repair segment generated as follows. The parameter R indicates on average how much FEC repair data is generated for the source data in the source segments. For example, R=0.33 indicates that if a source segment contains 1,000 kilobytes of data, then the corresponding repair segment contains approximately 330 kilobytes of repair data. The parameter S indicates the symbol size in bytes used for FEC encoding and decoding. For example, S=64 indicates that the source data and the repair data comprises symbols of size 64 bytes each for the purposes of FEC encoding and decoding.

The repair segment can be generated for a source segment as follows. Each fragment of the source segment is considered as a source block for FEC encoding purposes, and thus each fragment is treated as a sequence of source symbols of a source block from which repair symbols are generated. The number of repair symbols in total generated for the first i fragments is calculated as TNRS(i)=ceiling(R*B(i)/S), wherein ceiling(x) is the function that outputs the smallest integer with a value that is at least x. Thus, the number of repair symbols generated for fragment i is NRS(i)=TNRS(i)−TNRS(i−1).

Figure 27:
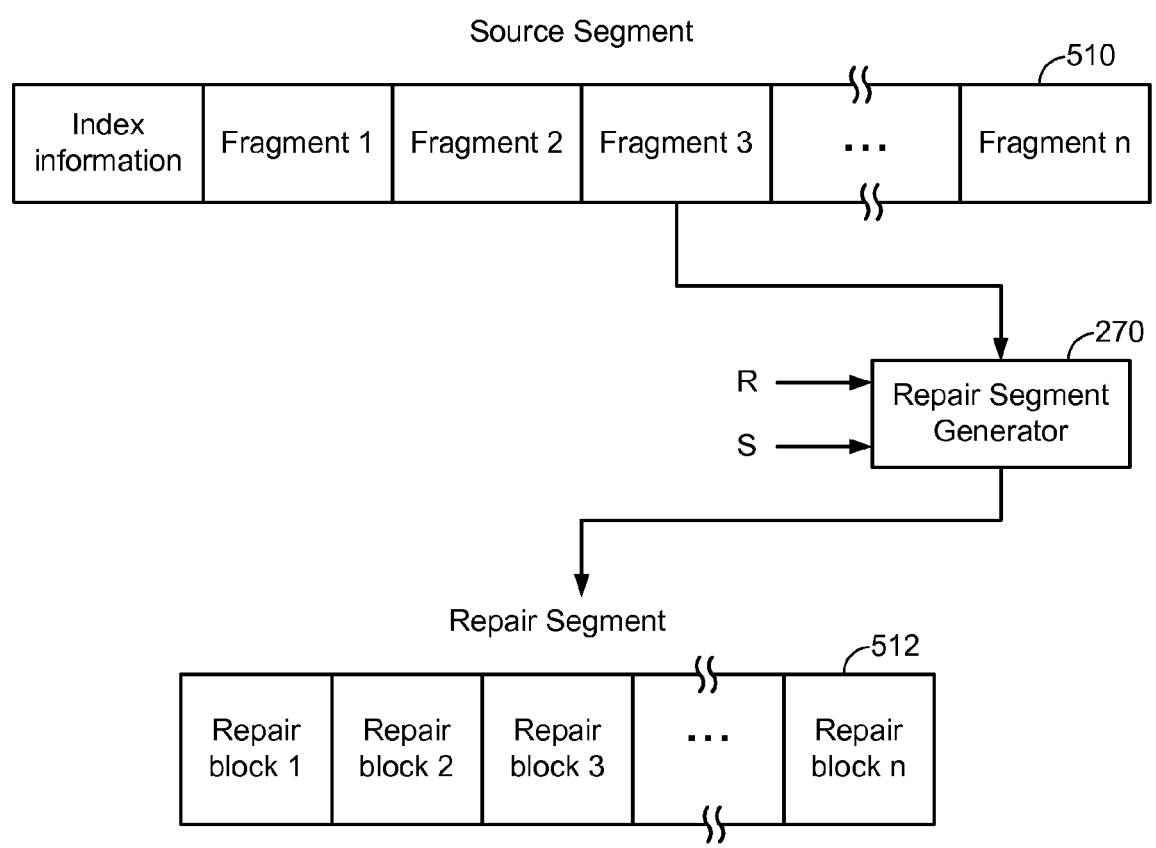
FIG. 27 illustrates details of a repair segment generator that, as part of the ingestion system shown in FIG. 1, generates repair segments from source segments and control parameters.

The repair segment comprises a concatenation of the repair symbols for the fragments, wherein the order of the repair symbols within a repair segment is in the order of the fragments from which they are generated, and within a fragment the repair symbols are in order of their encoding symbol identifier (ESI). The repair segment structure corresponding to a source segment structure is shown in FIG. 27, including a repair segment generator 2700.

Note that by defining the number of repair symbols for a fragment as described above, the total number of repair symbols for all previous fragments, and thus the byte index into the repair segment, only depends on R, S, B(i−1) and B(i), and does not depend on any of the previous or subsequent structure of the fragments within the source segment. This is advantageous because it allows a client to quickly compute the position of the start of a repair block within the repair segment, and also quickly compute the number of repair symbols within that repair block, using only local information about the structure of the corresponding fragment of the source segment from which the repair block is generated. Thus, if a client decides to start downloading and playout of a fragment from the middle of a source segment, it can also quickly generate and access the corresponding repair block from within the corresponding repair segment.

The number of source symbols in the source block corresponding to fragment i is calculated as NSS(i)=ceiling((B(i)−B(i−1))/S). The last source symbol is padded out with zero bytes for the purposes of FEC encoding and decoding if B(i)−B(i−1) is not a multiple of S, i.e., the last source symbol is padded out with zero bytes so that it is S bytes in size for the purposes of FEC encoding and decoding, but these zero padding bytes are not stored as part of the source segment. In this embodiment, the ESIs for the source symbol are 0, 1, . . . , NSS(i)−1 and the ESIs for the repair symbols are NSS(i), . . . , NSS(i)+NRS(i)−1.

The URL for a repair segment in this embodiment can be generated from the URL for the corresponding source segment by simply adding for example the suffix ".repair" to the URL of the source segment.

The repair indexing information and FEC information for a repair segment is implicitly defined by the indexing information for the corresponding source segment, and from the values of R and S, as described herein. The time offsets and the fragment structure comprising the repair segment are determined by the time offsets and structure of the corresponding source segment. The byte offset to the end of the repair symbols in the repair segment corresponding to fragment i can be calculated as RB(i)=S*ceiling(R*B(i)/S). The number of bytes in the repair segment corresponding to fragment i is then RB(i)−RB(i−1), and thus the number of repair symbols corresponding to fragment i is calculated as NRS(i)=(RB(i)−RB(i−1))/S. The number of source symbols corresponding to fragment i can be calculated as NSS(i)=ceiling((B(i)−B(i−1))/S). Thus, in this embodiment, the repair indexing information for a repair block within a repair segment and the corresponding FEC information can be implicitly derived from R, S and the indexing information for the corresponding fragment of the corresponding source segment.

Figure 28:
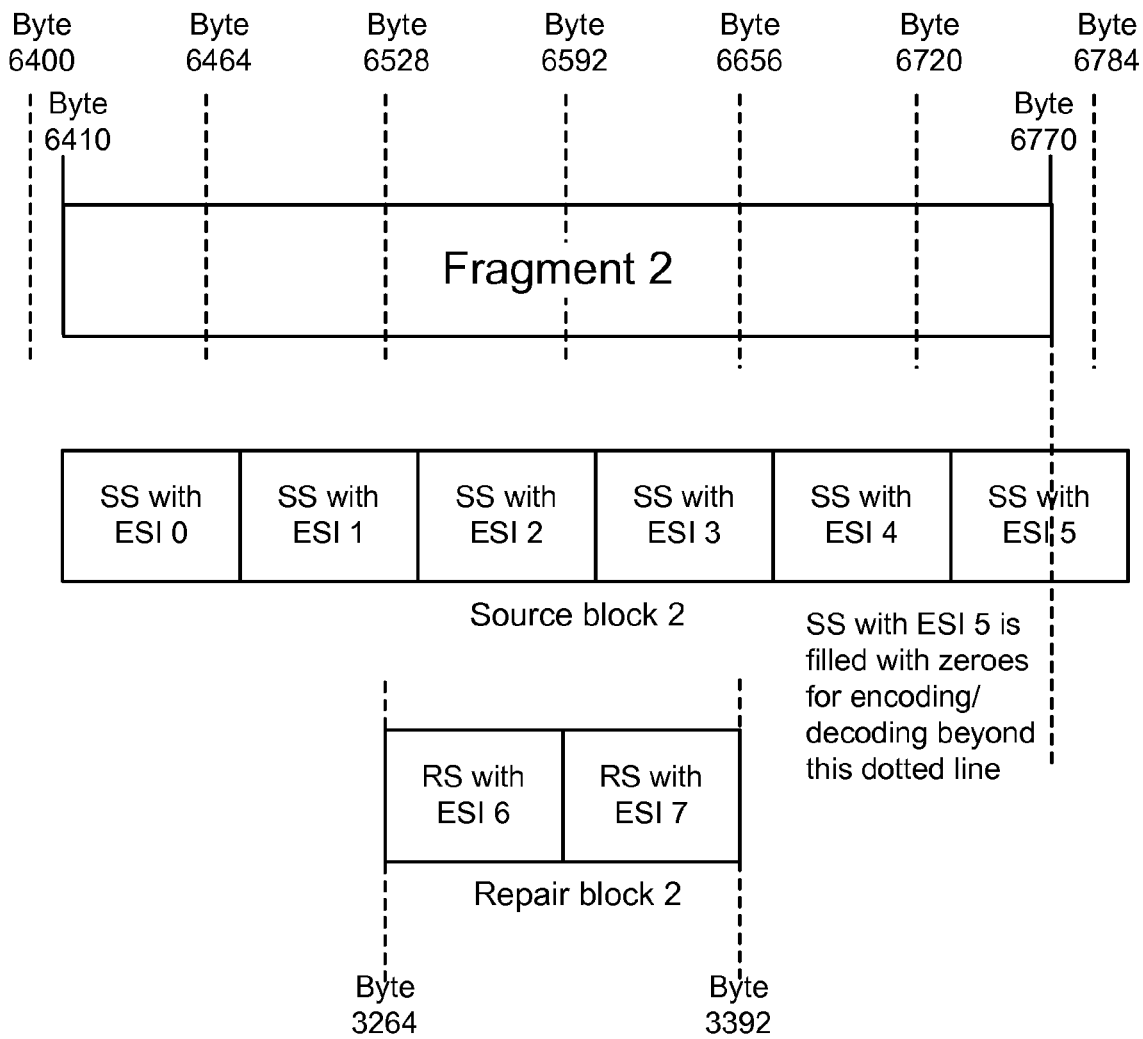
FIG. 28 illustrates relationships between source blocks and repair blocks.

As an example, consider the example shown in FIG. 28, showing a fragment 2 that starts at byte offset B(1)=6,410 and ends at byte offset B(2)=6,770. In this example, the symbol size is S=64 bytes, and the dotted vertical lines show the byte offsets within the source segment that correspond to multiples of S. The overall repair segment size as a fraction of the source segment size is set to R=0.5 in this example. The number of source symbols in the source block for fragment 2 is calculated as NSS(2)=ceiling((6,770−6,410)/64)=ceil(5.625)=6, and these 6 source symbols have ESIs 0, . . . , 5, respectively, wherein the first source symbol is the first 64 bytes of fragment 2 that starts at byte index 6,410 within the source segment, the second source symbol is the next 64 bytes of fragment 2 that starts at byte index 6,474 within the source segment, etc. The end byte offset of the repair block corresponding to fragment 2 is calculated as RB(2)=64*ceiling(0.5*6,770/64)=64*ceiling(52.89 . . . )=64*53=3,392, and the start byte offset of the repair block corresponding to fragment 2 is calculated as RB(1)=64*ceiling(0.5*6,410/64)=64*ceiling(50.07 . . . )= 64*51=3,264, and thus in this example there are two repair symbols in the repair block corresponding to fragment 2 with ESIs 6 and 7, respectively, starting at byte offset 3,264 within the repair segment and ending at byte offset 3,392.

Note that, in the example shown in FIG. 28, even though R=0.5 and there are 6 source symbols corresponding to fragment 2, the number of repair symbols is not 3, as one might expect if one simply used the number of source symbols to calculate the number of repair symbols, but instead worked out to be 2 according to the methods described herein. As opposed to simply using the number of source symbols of a fragment to determine the number of repair symbols, the embodiments described above make it possible to calculate the positioning of the repair block within the repair segment solely from the index information associated with the corresponding source block of the corresponding source segment. Furthermore, as the number, K, of source symbols in a source block grows, the number of repair symbols, KR, of the corresponding repair block is closely approximated by K*R, as in general, KR is at most ceil(K*R) and KR is at least floor((K−1)*R), where floor(x) is the largest integer that is at most x.

There are many variations of the above embodiments for generating a file structure that may be used advantageously by a client employing cooperative HTTP/FEC methods, as one skilled in the art will recognize. As an example of an alternate embodiment, an original segment for a representation may be partitioned into N>1 parallel segments, wherein for i=1, . . . , N, a specified fraction $F_i$ of the original segment is contained in the ith parallel segment, and where the sum for i=1, . . . , N of $F_i$ is equal to 1. In this embodiment, there may be one master segment map that is used to derive the segment maps for all of the parallel segments, similar to how the repair segment map is derived from the source segment map in the embodiment described above. For example, the master segment map may indicate the fragment structure if all of the source media data was not partitioned in parallel segments but instead contained in the one original segment, and then the segment map for the ith parallel segment can be derived from the master segment map by calculating that, if the amount of media data in a first prefix of fragments of the original segment is L bytes, then the total number of bytes of this prefix in aggregate among the first i parallel segment is ceil(L*$G_i$), where $G_i$ is the sum over j=1, . . . , i of $F_j$. As another example of an alternate embodiment, the segments may consist of the combination of the original source media data for each fragment followed immediately by the repair data for that fragment, resulting in a segment that contains a mixture of source media data and repair data generated using an FEC code from that source media data. As another example of an alternate embodiment, a segment that contains a mixture of source media data and repair data may be partitioned into multiple parallel segments containing a mixture of source media data and repair data.

Further embodiments can be envisioned to one of ordinary skill in the art after reading this disclosure. In other embodiments, combinations or sub-combinations of the above disclosed invention can be advantageously made. The example arrangements of components are shown for purposes of illustration and it should be understood that combinations, additions, re-arrangements, and the like are contemplated in alternative embodiments of the present invention. Thus, while the invention has been described with respect to exemplary embodiments, one skilled in the art will recognize that numerous modifications are possible.

For example, the processes described herein may be implemented using hardware components, software components, and/or any combination thereof. In some cases, the software components can be provided on tangible, non-transitory media for execution on hardware that is provided with the media or is separate from the media. The specification and drawings are, accordingly, to be regarded in an illustrative rather than a restrictive sense. It will, however, be evident that various modifications and changes may be made thereunto without departing from the broader spirit and scope of the invention as set forth in the claims and that the invention is intended to cover all modifications and equivalents within the scope of the following claims.

What is claimed is:

1. A method of requesting media data at a client device using a scalable segment map, comprising:
    receiving the scalable segment map at the client device, the scalable segment map including metadata with one or more byte ranges corresponding to locations of layers of a media segment, wherein the media segment includes one or more blocks and is associated with a scalable video coded stream including multiple layers that are combinable to form one or more representations;
    determining, by the client device, one or more layers of a block of the media segment to request;
    generating, by the client device, a request for the one or more layers of the block, the request including a byte range corresponding to a location of the one or more layers, wherein the byte range is determined from the metadata included in the segment map;
    transmitting, by the client device, the request for the one or more layers of the block;
    receiving, at the client device, the one or more layers of the block of media data; and
    generating, by the client device, a media representation using the one or more layers of the block.

2. The method of claim 1, wherein a full block of the one or more blocks includes layers combinable to form a first representation, and wherein a partial block of the one or more blocks has fewer layers than the full block that are combinable to form a second representation.

3. The method of claim 1, further comprising determining the one or more layers of the media segment to request based on channel quality conditions detected by the client device.

4. The method of claim 1, further comprising receiving a media presentation description including the scalable segment map.

5. The method of claim 1, further comprising receiving the media segment, wherein the media segment includes the scalable segment map.

6. The method of claim 1, wherein the metadata includes byte ranges corresponding to a location of a first layer and a location of a second layer, wherein received media data associated with the first layer is stored in a first buffer of the client device and received media data associated with the second layer is stored in a second buffer of the client device, the second buffer being a separate buffer from the first buffer.

7. The method of claim 6, wherein determining a block of media data to request includes determining an occupancy of at least one of the first buffer and the second buffer.

8. The method of claim 7, wherein determining a block of media data to request includes determining if the occupancy of the first buffer exceeds a first threshold and determining if the occupancy of the second buffer exceeds a second threshold, the first threshold being different from the second threshold.

9. The method of claim 1, wherein the layers of the media segment are ordered in ranges of increasing quality.

10. A method of providing media data, comprising:
providing, by a media ingestion system, a scalable segment map to a client device, the scalable segment map including metadata with one or more byte ranges corresponding to locations of layers of a media segment, wherein the media segment includes one or more blocks and is associated with a scalable video coded stream including multiple layers that are combinable to form a representation, wherein a subset of the multiple layers forms a first version of the representation and a larger subset of the multiple layers forms a second version of the representation having a higher quality than the first version, and wherein the scalable segment map allows the client device to generate a request for one or more layers of a block of the media segment;
receiving the request for the one or more layers of the block; and
providing the one or more layers of the block to the client device.

11. The method of claim 10, further comprising providing a media presentation description including the scalable segment map.

12. The method of claim 10, further comprising providing the media segment to the client device, wherein the media segment includes the scalable segment map.

13. The method of claim 10, wherein the layers of the media segment are ordered in ranges of increasing quality.

14. A client device configured to request media data using a scalable segment map, comprising:
a memory configured to store media data;
a receiver configured to receive the scalable segment map, the scalable segment map including metadata with one or more byte ranges corresponding to locations of layers of a media segment, wherein the media segment includes one or more blocks and is associated with a scalable video coded stream including multiple layers that are combinable to form one or more representations; and
a processor configured to:
determine one or more layers of a block of the media segment to request; and
generate a request for the one or more layers of the block, the request including a byte range corresponding to a location of the one or more layers, wherein the byte range is determined from the metadata included in the segment map;

wherein the receiver is further configured to receive the one or more layers of the block of media data; and
wherein the processor is further configured to generate a media representation using the one or more layers of the block.

15. The client device of claim 14, wherein a full block of the one or more blocks includes layers combinable to form a first representation, and wherein a partial block of the one or more blocks has fewer layers than the full block that are combinable to form a second representation.

16. The client device of claim 14, wherein the processor is further configured to determine the one or more layers of the media segment to request based on channel quality conditions detected by the client device.

17. The client device of claim 14, wherein the receiver is further configured to receive a media presentation description including the scalable segment map.

18. The client device of claim 14, wherein the receiver is further configured to receive the media segment, wherein the media segment includes the scalable segment map.

19. The client device of claim 14, further comprising:
a first buffer; and
a second buffer, wherein the second buffer is a separate buffer from the first buffer, wherein the metadata includes byte ranges corresponding to a location of a first layer and a location of a second layer, wherein received media data associated with the first layer is stored in the first buffer, and wherein received media data associated with the second layer is stored in the second buffer.

20. A server configured to provide media data, comprising:
a transmitter configured to provide a scalable segment map to a client device, the scalable segment map including metadata with one or more byte ranges corresponding to locations of layers of a media segment, wherein the media segment includes one or more blocks and is associated with a scalable video coded stream including multiple layers that are combinable to form a representation, wherein a subset of the multiple layers forms a first version of the representation and a larger subset of the multiple layers forms a second version of the representation having a higher quality than the first version, and wherein the scalable segment map allows the client device to generate a request for one or more layers of a block of the media segment; and
a receiver configured to receive the request for the one or more layers of the block;
wherein the transmitter is further configured to provide the one or more layers of the block to the client device.

* * * * *